United States Patent
Hwang et al.

(10) Patent No.: US 9,419,228 B2
(45) Date of Patent: Aug. 16, 2016

(54) HETEROCYCLIC COMPOUND AND ORGANIC LIGHT-EMITTING DIODE COMPRISING THE SAME

(71) Applicant: SAMSUNG DISPLAY CO., LTD., Yongin, Gyeonggi-Do (KR)

(72) Inventors: Seok-Hwan Hwang, Yongin (KR); Young-Kook Kim, Yongin (KR); Jun-Ha Park, Yongin (KR); Hye-Jin Jung, Yongin (KR); Jin-O Lim, Yongin (KR); Eun-Young Lee, Yongin (KR); Sang-Hyun Han, Yongin (KR); Eun-Jae Jeong, Yongin (KR); Soo-Yon Kim, Yongin (KR); Jong-Hyuk Lee, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 343 days.

(21) Appl. No.: 14/052,510

(22) Filed: Oct. 11, 2013

(65) Prior Publication Data

US 2014/0361258 A1 Dec. 11, 2014

(30) Foreign Application Priority Data

Jun. 10, 2013 (KR) ........................ 10-2013-0066057

(51) Int. Cl.
*H01L 51/00* (2006.01)
*C09K 11/06* (2006.01)
*H05B 33/14* (2006.01)
*H01L 51/50* (2006.01)

(52) U.S. Cl.
CPC ............ *H01L 51/0067* (2013.01); *C09K 11/06* (2013.01); *H01L 51/0072* (2013.01); *H05B 33/14* (2013.01); *C09K 2211/1029* (2013.01); *C09K 2211/1044* (2013.01); *C09K 2211/1059* (2013.01); *C09K 2211/1088* (2013.01); *H01L 51/0073* (2013.01); *H01L 51/5012* (2013.01); *H01L 51/5016* (2013.01)

(58) Field of Classification Search
None
See application file for complete search history.

(56) References Cited

U.S. PATENT DOCUMENTS 7,429,372 B2 9/2008 Pez et al.
2014/0110676 A1* 4/2014 Kim .................... C07D 403/04
257/40

FOREIGN PATENT DOCUMENTS

KR 10-2011-0066494 A 7/2011
WO WO 2011/071255 A1 6/2011

OTHER PUBLICATIONS

Thesis entitled, "A novel conjugated polymer based on 4H-benzo[def]carbazole backbone for OLED", 2009 Fall Assembly and Symposium (Oct. 8-10, 2009, Gwangju Institute of Science and Technology, Oryong Hall), vol. 34, No. 2, 2009, http://ns2.ksiec.or.kr/v2/sub6_3.php?content=search&seq=56943&start=0&number=1&journalid=proceeding&key1=A+novel+conjugated+polymer+based+on+4H-benzo%5Bdef%Dcarbazole+backbone+for+OLED&key2=&key3=&syear=&eyear=&linkl=and&link2=and&link3=&item1=subject&item2=author&item3=abstract&vol=&num=&sortby=pyear&totalcount=1, 1 page.

Sigma-Aldrich catalog page entitled "4H-benzo[def]carbazole", http://www.sigmaaldrich.com/catalog/product/aldrich/ph007423?lang=ko&region=KR, 1 page.

* cited by examiner

*Primary Examiner* — J. L. Yang
(74) *Attorney, Agent, or Firm* — Lewis Roca Rothgerber Christie LLP

(57) ABSTRACT

A heterocyclic compound is represented by Formula 1 below and an organic light-emitting diode includes the heterocyclic compound.

Formula 1

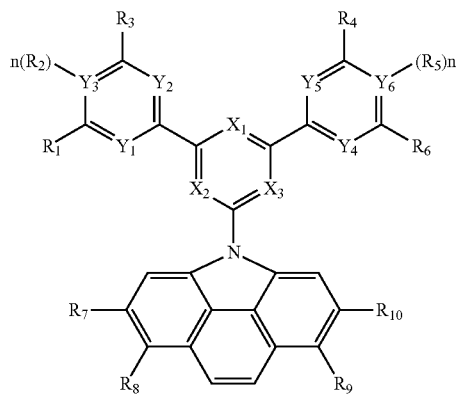

The heterocyclic compounds exhibit good electrical properties, high charge transporting and light-emitting capabilities, and high glass transition temperatures. Organic light-emitting diodes including the compounds of Formula 1 exhibit improved driving voltage, efficiency, brightness, and lifetime characteristics.

20 Claims, 1 Drawing Sheet

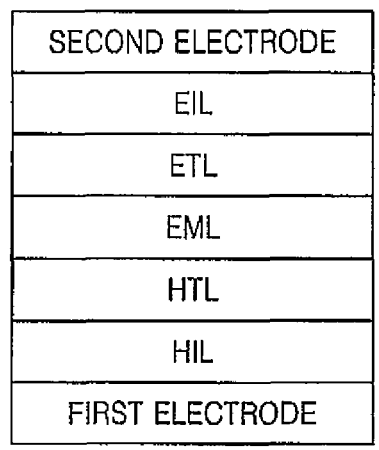

HETEROCYCLIC COMPOUND AND ORGANIC LIGHT-EMITTING DIODE COMPRISING THE SAME

CROSS-REFERENCE TO RELATED APPLICATION

This application claims priority to and the benefit of Korean Patent Application No. 10-2013-0066057, filed on 10 Jun. 2013, in the Korean Intellectual Property Office, the entire content of which is incorporated herein by reference.

BACKGROUND

1. Technical Field

Aspects of embodiments according to the present invention relate to a heterocyclic compound and an organic light-emitting diode including the heterocyclic compound.

2. Description of the Related Art

Organic light-emitting diodes (OLEDs) are self-emitting diodes that have advantages, such as wide viewing angles, good contrast, quick response times, and good brightness, driving voltage, and response speed characteristics. Also, OLEDs can provide multicolored images.

A typical OLED has a structure including an anode, a hole-transporting layer (HTL), an emission layer (EML), an electron-transporting layer (ETL), and a cathode, which are sequentially stacked in the foregoing order on a substrate. In this regard, the HTL, the EML, and the ETL are organic thin films formed of organic compounds.

An operating principle of an OLED having the above-described structure may be as follows:

When a voltage is applied between the anode and the cathode, holes injected from the anode move to the EML via the HTL, and electrons injected from the cathode move to the EML via the ETL. Carriers, such as the holes and electrons, recombine in the EML to generate excitons. When the excitons drop from an excited state to a ground state, light is emitted.

SUMMARY

According to embodiments of the present invention, a material has good electrical properties, high charge transporting and light-emitting capabilities, high glass transition temperature, is capable of preventing (or lessening) crystallization of the material (e.g., is less prone to crystallization than other similar materials), and is suitable for fluorescent and phosphorescent diodes of all colors, such as red, green, blue, and white. In other embodiments, an organic light-emitting diode includes the material and has high efficiency, low voltage, high brightness, and a long lifespan.

According to an aspect of the present invention, a heterocyclic compound is represented by Formula 1 below:

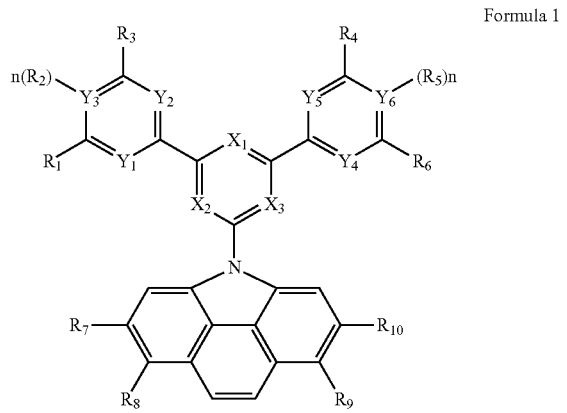

Formula 1

In Formula 1, $X_1$ to $X_3$ and $Y_1$ to $Y_6$ are each independently CH, C, or N.

Here, when $Y_3$ and/or $Y_6$ is N, the respective n corresponding to $Y_3$ or $Y_6$ is 0, and when $Y_3$ and/or $Y_6$ is C, the respective n corresponding to $Y_3$ or $Y_6$ is 1.

$R_1$ to $R_{10}$ may each independently be a hydrogen atom, a deuterium atom, a cyano group, a $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_1$-$C_{60}$ heteroaryl group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ condensed polycyclic group, or an amino group substituted with a substituted or unsubstituted $C_6$-$C_{60}$ aryl group or a substituted or unsubstituted $C_1$-$C_{60}$ heteroaryl group.

According to another aspect of the present invention, an organic light-emitting diode includes a first electrode; a second electrode; and an organic layer between the first electrode and the second electrode, where the organic layer includes the heterocyclic compound.

According to another aspect of the present invention, a flat display device includes the organic light-emitting diode, and the first electrode of the organic light-emitting diode is electrically connected to a source electrode or a drain electrode of a thin film transistor.

BRIEF DESCRIPTION OF THE DRAWINGS

The above and other features and advantages of the present invention will become more apparent by reference to the following detailed description when considered together with the accompanying drawing, which is a schematic view of a structure of an organic light-emitting diode according to an embodiment of the present invention.

DETAILED DESCRIPTION

In the following detailed description, only certain embodiments of the present invention are shown and described, by way of illustration. As those skilled in the art would recognize, the invention may be embodied in many different forms and should not be construed as limited to the embodiments set forth herein. Also, in the context of the present application, when a first element is referred to as being "on" a second element, it can be directly on the second element or be indirectly on the second element with one or more intervening elements therebetween. Like reference numerals designate like elements throughout the specification. Expressions such as "at least one of," when preceding a list of elements, modify the entire list of elements and do not modify the individual elements of the list.

A compound according to an embodiment of the present invention is represented by Formula 1 below:

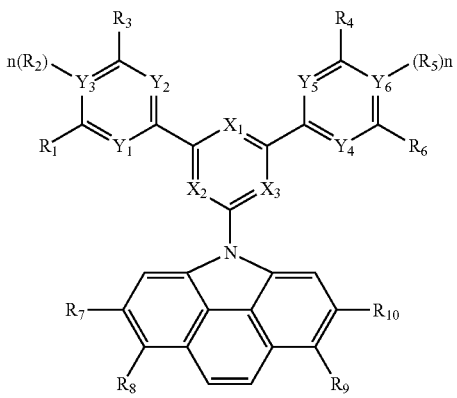

Formula 1

In Formula 1, $X_1$ to $X_3$ and $Y_1$ to $Y_6$ are each independently CH, C or N.

Here, when $Y_3$ and/or $Y_6$ is N, the respective n corresponding to $Y_3$ or $Y_6$ is 0 and when $Y_3$ and/or $Y_6$ is C, the respective n corresponding to $Y_3$ or $Y_6$ is 1.

$R_1$ to $R_{10}$ may each independently be a hydrogen atom, a deuterium atom, a cyano group, a $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_1$-$C_{60}$ heteroaryl group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ condensed polycyclic group, or an amino group substituted with a substituted or unsubstituted $C_6$-$C_{60}$ aryl group or a substituted or unsubstituted $C_1$-$C_{60}$ heteroaryl group.

When tris(2-phenylpyridine)iridium (Ir(ppy)$_3$), which is a representative phosphorescent material, is used in an organic light-emitting diode, the organic light-emitting diode emits a spectrum of light at CIE 0.30 and 0.63, and has a maximum power efficiency at a quantum efficiency of 6%. However, even though the organic light-emitting diode uses "electrophosphorescence", the organic light-emitting diode shows low efficiency, a short lifespan, and low stability. Thus, the organic light-emitting diode is not suitable for a high efficiency and high quality display. Accordingly, a phosphorescent material having properties of high efficiency and long lifespan at low voltage, and an organic light-emitting diode using the phosphorescent material would be beneficial.

According to embodiments of the present invention, heterocyclic compounds of Formula 1 according to embodiments of the present invention function as light-emitting materials of an organic light-emitting diode. Also, the heterocyclic compounds of Formula 1 have high glass transition temperatures (Tg) or melting points due to the presence of a heterocycle. Accordingly, organic layers with the heterocyclic compounds of Formula 1 for electroluminescence have heat resistance to Joule heat that is generated in the organic layers, and increased resistance under a high temperature environment. Organic light-emitting diodes manufactured using the heterocyclic compounds according to embodiments of the present invention are highly durable during maintenance and operation.

The substituents of the heterocyclic compounds of Formula 1 above will be described further below.

According to an embodiment of the present invention, at least one of $Y_1$ to $Y_6$ of Formula 1 above may be a nitrogen atom.

According to another embodiment of the present invention, $R_1$ and $R_2$, $R_2$ and $R_3$, $R_4$ and $R_5$, and/or $R_5$ and $R_6$ may optionally combine to form an aromatic ring, for example, an aromatic ring including the structure,

in which * is a binding site to Formula 1.

According to another embodiment of the present invention, in Formula 1, $R_1$ to $R_6$ may each independently be any one of a hydrogen atom, a deuterium atom, or a moiety represented by one of Formulae 2a to 2c:

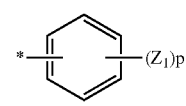 2a

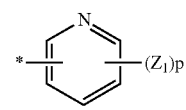 2b

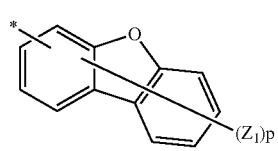 2c

In Formulae 2a to 2c, p is an integer of 1 to 7; * is a binding site to Formula 1; and $Z_1$ may be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen group, a cyano group, a nitro group, a hydroxyl group, a carboxyl group, or an amino group substituted with a $C_6$-$C_{20}$ aryl group or a $C_1$-$C_{20}$ heteroaryl group, and when there is a plurality of $Z_1$s, each of the $Z_1$s may be the same or different.

According to another embodiment of the present invention, in Formula 1, $R_7$ to $R_{10}$ may each independently be any one of a hydrogen atom, a deuterium atom, or a moiety represented by one of Formulae 3a to 3b:

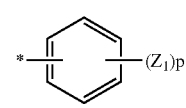 3a

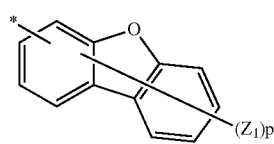 3b

In Formulae 3a to 3b above, p is an integer of 1 to 7; * is a binding site to Formula 1; and $Z_1$ may be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen group, a cyano group, a nitro group, a hydroxyl group, a carboxyl group, or an amino group substituted with a $C_6$-$C_{20}$ aryl group or a $C_1$-$C_{20}$ heteroaryl group, and when there is a plurality of $Z_1$s, each of the $Z_1$s may be the same or different.

According to another embodiment of the present invention, the moiety

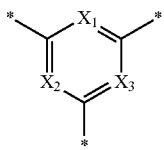

of Formula 1 above may be a moiety represented by any one of Formulae 4a to 4d:

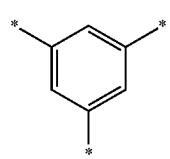
4a

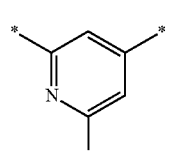
4b

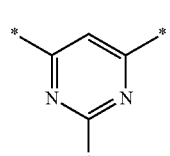
4c

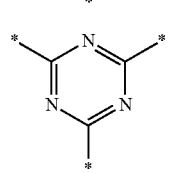
4d

In Formulae 4a-4d, * is a binding site to Formula 1.

Hereinafter, representative examples of the substituents described above are provided. However, it is understood that the numbers of carbon atoms listed for the substituents are non-limiting and do not limit the properties of the substituents. Also, definitions of substituents that are not provided in the present specification are the same as the general definitions of those substituents as commonly understood by those of ordinary skill in the art.

The unsubstituted $C_1$-$C_{60}$ alkyl group may have a linear or a branched form, and non-limiting examples of the unsubstituted $C_1$-$C_{60}$ alkyl group include methyl, ethyl, propyl, isobutyl, sec-butyl, pentyl, iso-amyl, hexyl, heptyl, octyl, nonacyl, dodecyl, and the like. The substituted $C_1$-$C_{60}$ alkyl group refers to the substitution of at least one hydrogen atom of the unsubstituted $C_1$-$C_{60}$ alkyl group with a deuterium atom, a halogen atom, a hydroxyl group, a nitro group, a cyano group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, or a $C_1$-$C_{16}$ heteroaryl group.

The unsubstituted $C_2$-$C_{60}$ alkenyl group is a hydrocarbon chain having at least one carbon-carbon double bond inserted at the body of the chain (e.g., the center) or at a terminal end of the chain. Non-limiting examples of the unsubstituted $C_2$-$C_{60}$ alkenyl group include ethenyl, propenyl, and butenyl. The substituted $C_2$-$C_{60}$ alkenyl group refers to the substitution of at least one hydrogen atom of the unsubstituted $C_2$-$C_{60}$ alkenyl group may be substituted with the substituents described above in connection with the substituted $C_1$-$C_{60}$ alkyl group.

The unsubstituted $C_2$-$C_{60}$ alkynyl group is a $C_2$-$C_{60}$ alkyl group having at least one carbon-carbon triple bond inserted at the body of a hydrocarbon chain (e.g., at the center) of the $C_2$-$C_{60}$ alkyl group or at a terminal end thereof. Non-limiting examples of the unsubstituted $C_2$-$C_{60}$ alkynyl group include acetylene, propylene, phenyl acetylene, isopropyl acetylene, t-butyl acetylene, and diphenyl acetylene. The substituted $C_2$-$C_{60}$ alkynyl group refers to the substitution of at least one hydrogen atom of the $C_2$-$C_{60}$ alkynyl group with the substituents described above in connection with the substituted $C_1$-$C_{60}$ alkyl group.

The unsubstituted $C_3$-$C_{60}$ cycloalkyl group is a $C_3$-$C_{60}$ alkyl group modified to include a ring. The substituted $C_3$-$C_{60}$ cycloalkyl group refers to the substitution of at least one hydrogen atom of the cycloalkyl group with the substituents described above in connection with the substituted $C_1$-$C_{60}$ alkyl group.

The unsubstituted $C_1$-$C_{60}$ alkoxy group is a group having the structure —OA, where A is the unsubstituted $C_1$-$C_{60}$ alkyl group as described above. Non-limiting examples of the alkoxy group include methoxy, ethoxy, propoxy, isopropoxy, butoxy, and pentoxy. The substituted $C_1$-$C_{60}$ alkoxy group refers to the substitution of at least one hydrogen atom of the alkoxy group may with the substituents described above in connection with the substituted $C_1$-$C_{60}$ alkyl group.

The unsubstituted $C_6$-$C_{60}$ aryl group is a carbocyclic aromatic system having at least one ring. When there are two or more rings, the two or more rings may be fused to each other or connected via a single bond. The term "aryl," as used herein, refers to aromatic systems such as phenyl, naphthyl, and anthracenyl. The substituted $C_6$-$C_{60}$ aryl group refers to the substitution of at least one hydrogen atom of the aryl group with the substituents described above in connection with the substituted $C_1$-$C_{60}$ alkyl group.

Non-limiting examples of the substituted or unsubstituted $C_6$-$C_{60}$ aryl group include a phenyl group, a $C_1$-$C_{10}$ alkylphenyl group (for example, an ethylphenyl group), a biphenyl group, a $C_1$-$C_{10}$ alkyl biphenyl group, a $C_1$-$C_{10}$ alkoxy biphenyl group, an o-, m-, or p-tolyl group, an o-, m-, or p-cumenyl group, a mesityl group, a phenoxy phenyl group, an (α,α-dimethyl benzene) phenyl group, an (N,N'-dimethyl) aminophenyl group, an (N,N'-diphenyl)aminophenyl group, a pentalenyl group, an indenyl group, a naphthyl group, a $C_1$-$C_{10}$ alkyl naphthyl group (for example, a methyl naphthyl group), a $C_1$-$C_{10}$ alkoxy naphthyl group (for example, a methoxy naphthyl group), an anthracenyl group, an azulenyl group, a heptalenyl group, an acenaphthylenyl group, a phenalenyl group, a fluorenyl group, an anthraquinolyl group, a methyl anthryl group, a phenanthryl group, a triphenylenyl group, a pyrenyl group, a chrysenyl group, an ethyl-chrysenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The unsubstituted $C_1$-$C_{60}$ heteroaryl group refers to a carbocyclic aromatic ring system having 1, 2, 3, or 4 ring heteroatoms selected from among N, O, P, and S. When there are two or more rings, the two or more rings may be fused to each other or connected via a single bond. Non-limiting examples of the unsubstituted $C_1$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophenyl group. The substituted $C_1$-$C_{60}$ heteroaryl group refers to the substitution of at least one hydrogen atom of the heteroaryl group with the substituents described above in connection with the substituted $C_1$-$C_{60}$ alkyl group.

The unsubstituted $C_6$-$C_{60}$ aryloxy group is a group represented by —$OA_1$, where $A_1$ is the $C_6$-$C_{60}$ aryl group. Non-limiting examples of the unsubstituted $C_6$-$C_{60}$ aryloxy group include a phenoxy group. The substituted $C_6$-$C_{60}$ aryloxy group refers to the substitution of at least one hydrogen atom of the aryloxy group with the substituents described above in connection with the substituted $C_1$-$C_{60}$ alkyl group.

The unsubstituted $C_6$-$C_{60}$ arylthio group is a group represented by —$SA_1$, where $A_1$ is the $C_6$-$C_{60}$ aryl group. Non-limiting examples of the arylthio group include a benzenethio group and a naphthylthio group. The substituted $C_6$-$C_{60}$ arylthio group refers to the substitution of at least one hydrogen atom of the arylthio group with the substituents described above in connection with the substituted $C_1$-$C_{60}$ alkyl group.

The unsubstituted $C_6$-$C_{60}$ condensed polycyclic group refers to a group including two or more rings in which at least one aromatic ring and at least one non-aromatic ring are fused together, or a group having unsaturated groups in a ring that are incapable of having a conjugated structure. Thus, the unsubstituted $C_6$-$C_{60}$ condensed polycyclic group is distinguished from the aryl group and a heteroaryl group in that the unsubstituted $C_6$-$C_{60}$ condensed polycyclic group is not aromatic (i.e., it does not have an overall aromaticity).

The following Compounds 1-19, 21-39 and 41-45 are examples of compounds represented by Formula 1, but Formula 1 is not limited thereto:

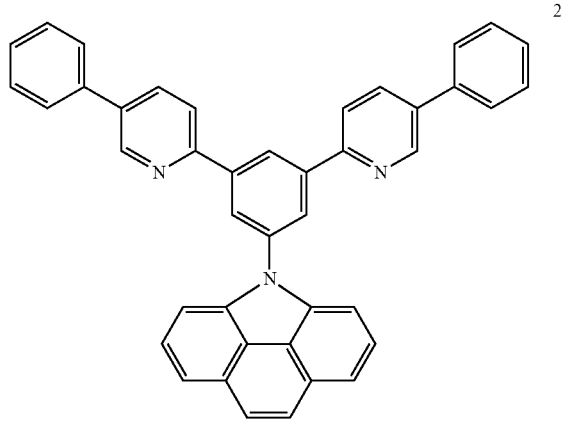

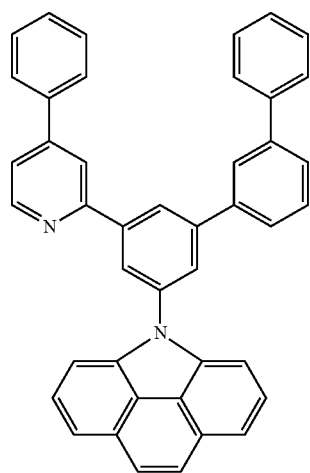

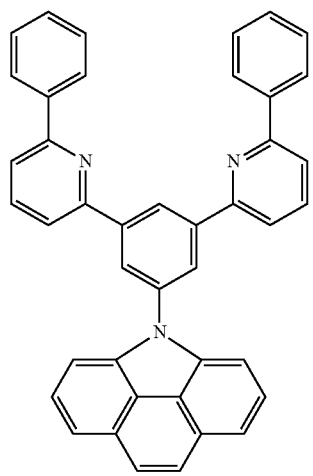

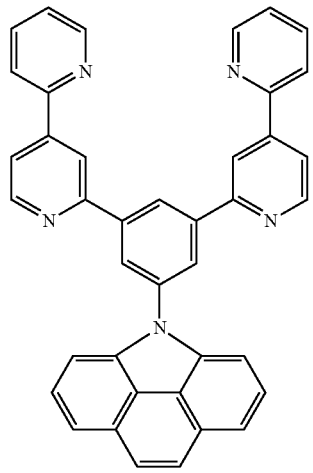

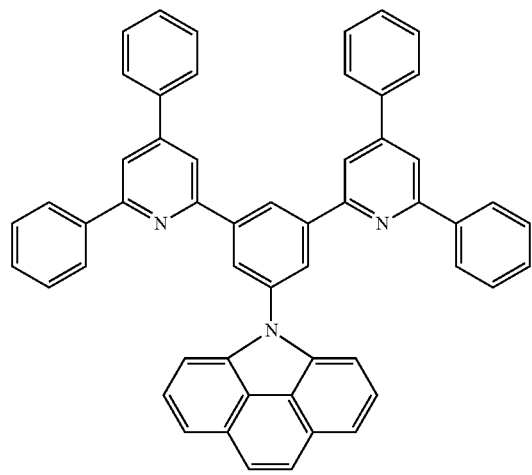
5
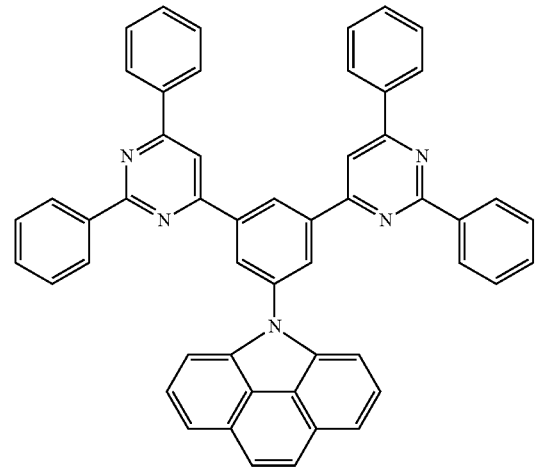
8
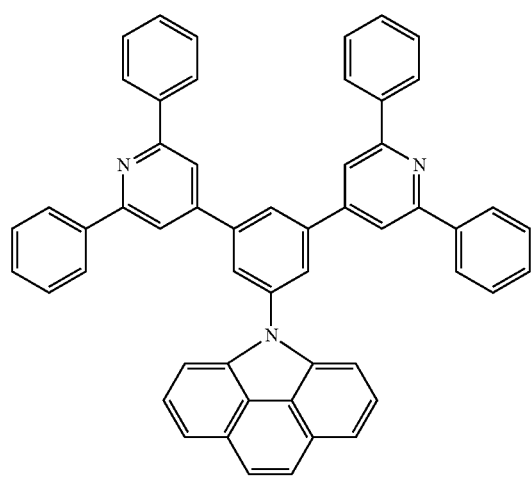
6
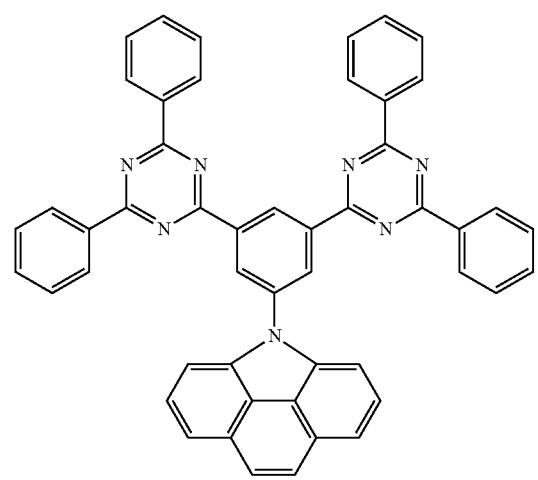
9
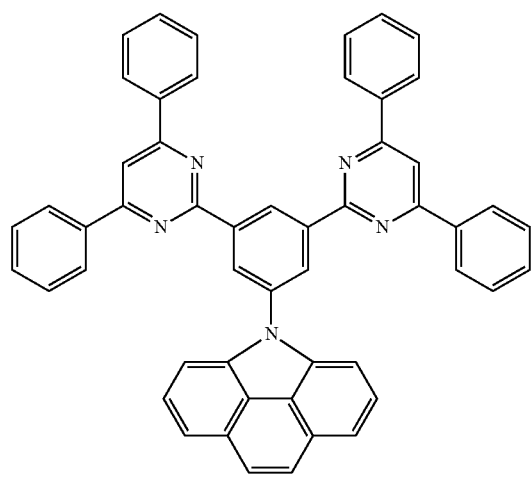
7
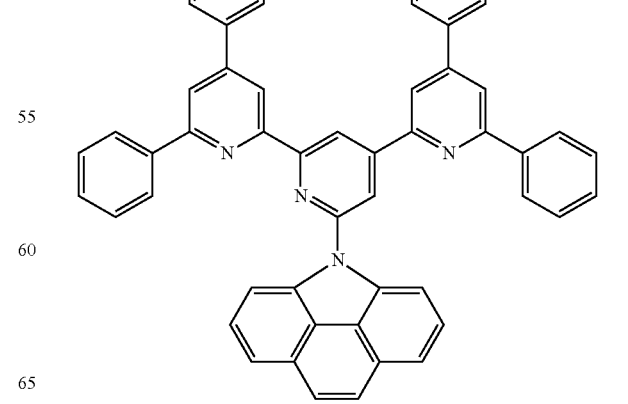
10

11
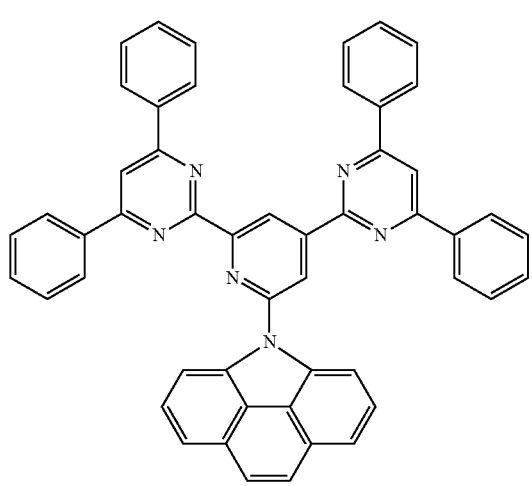
12
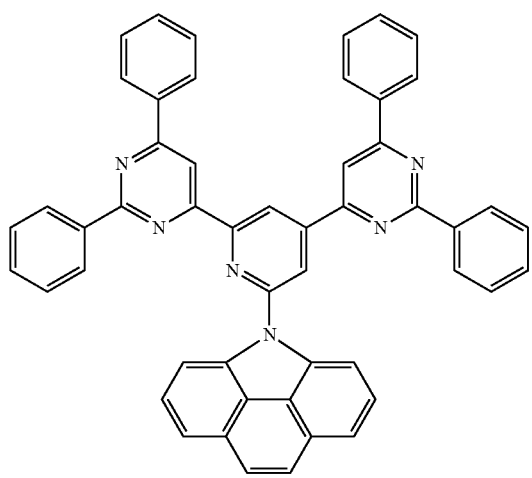
13
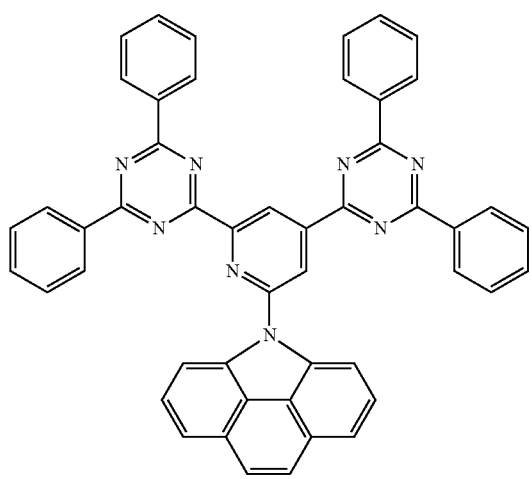
14
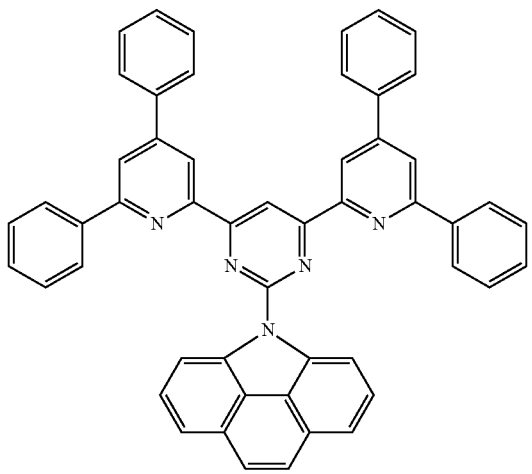
15
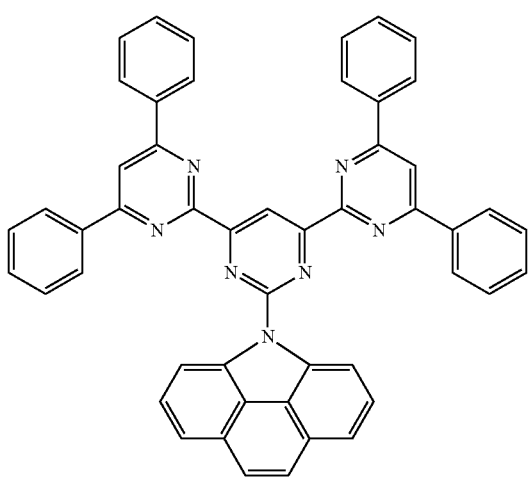
16
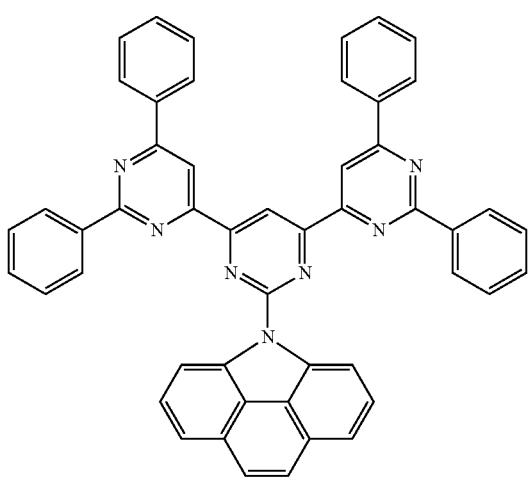

17
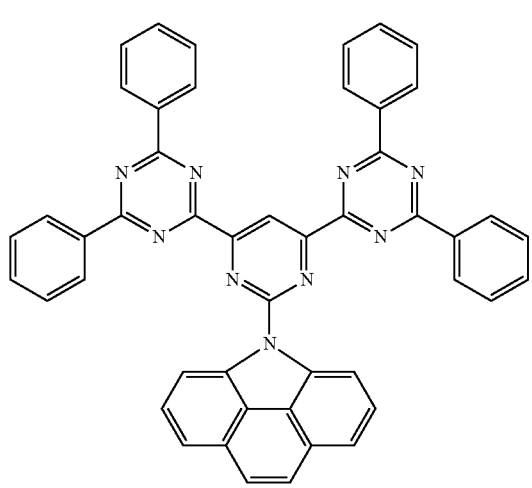
18
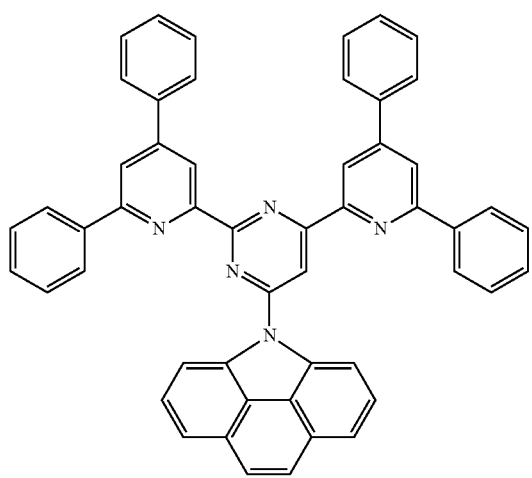
19
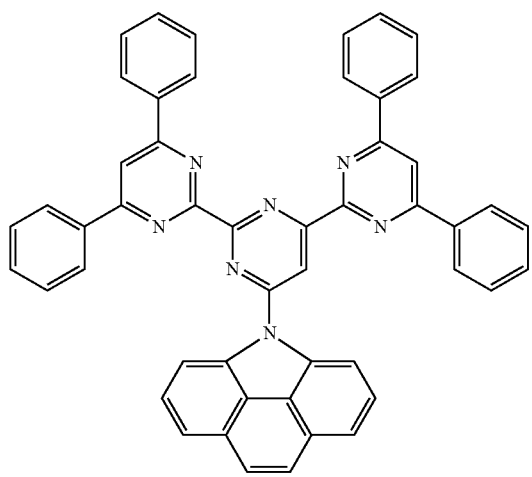
21
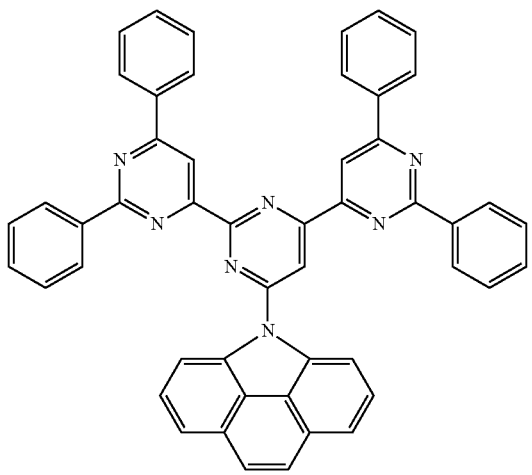
22
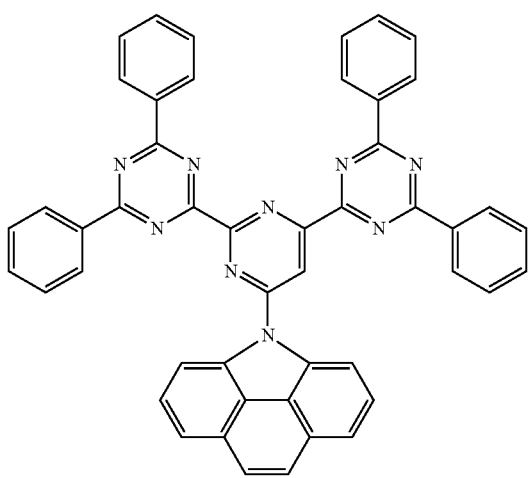
23
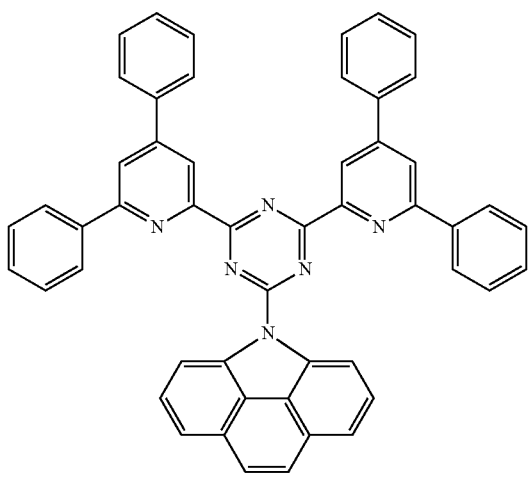

24
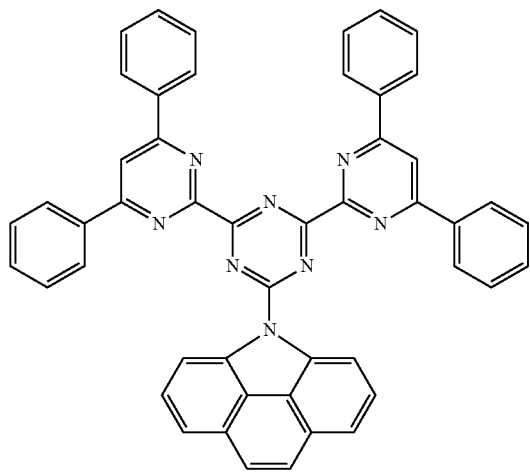
25
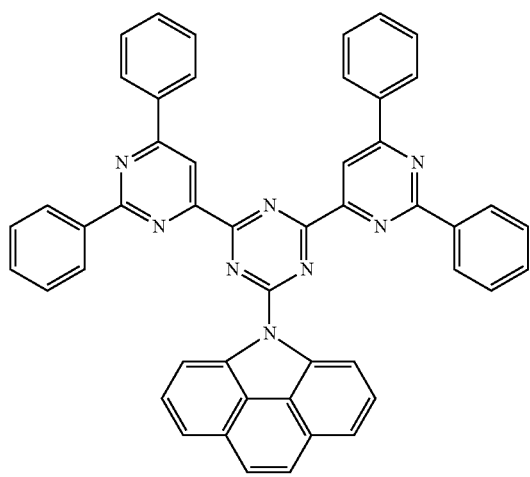
26
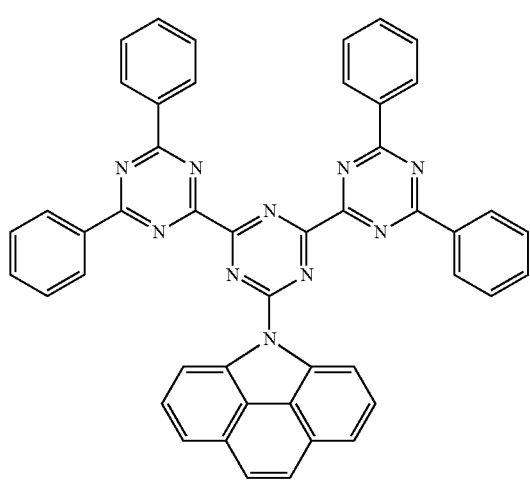
27
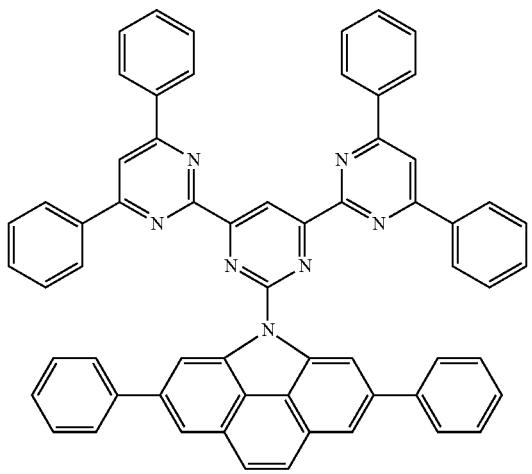
28
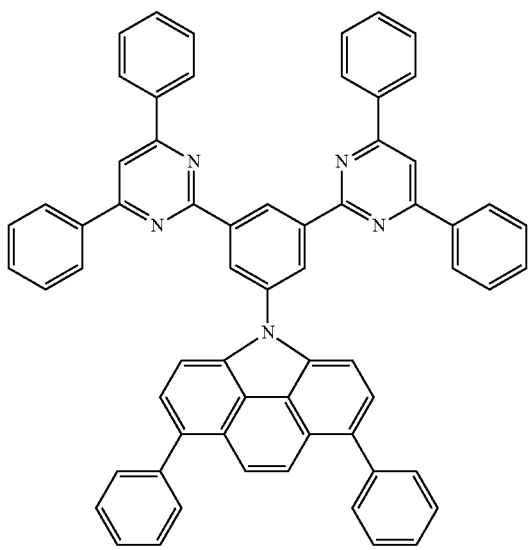
29
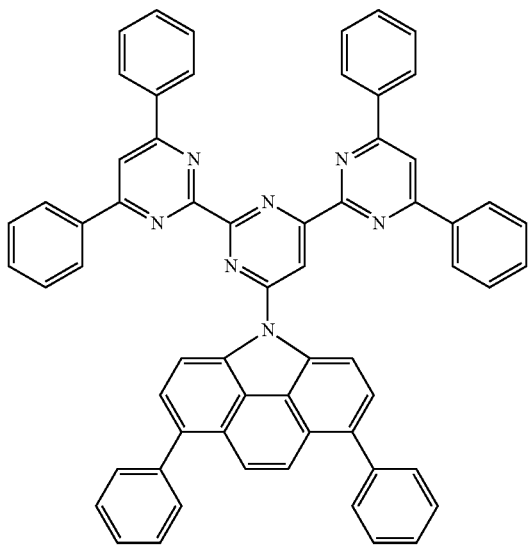

30
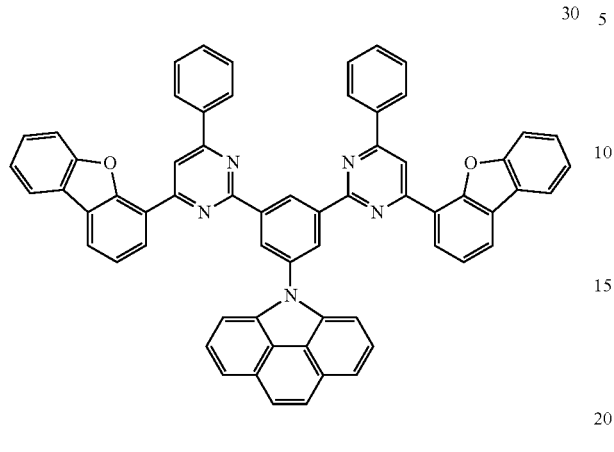
31
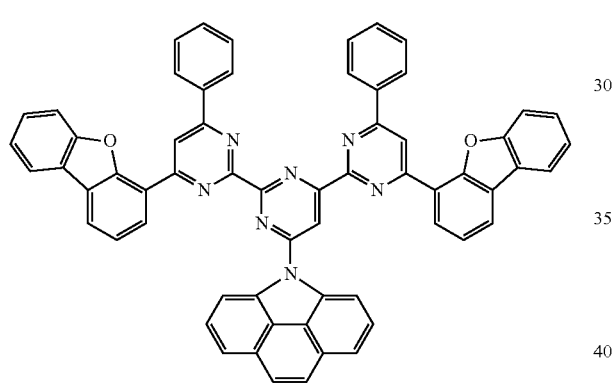
32
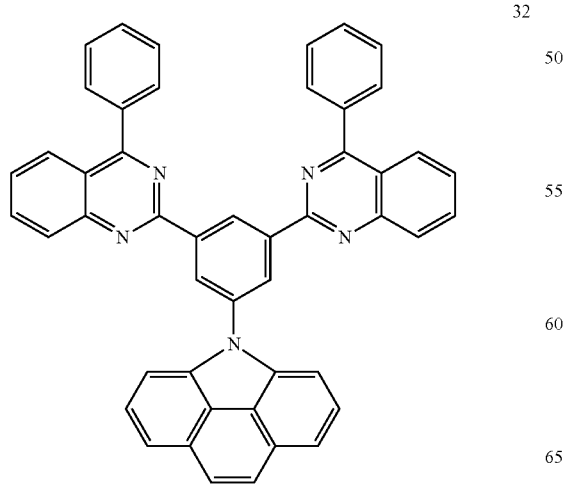
33
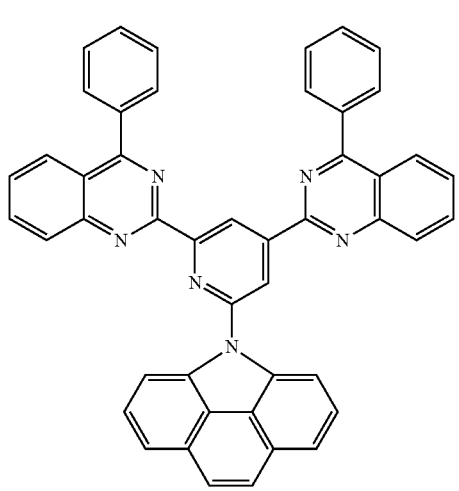
34
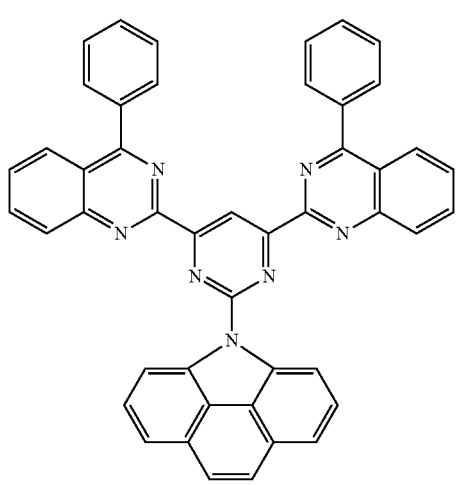
35
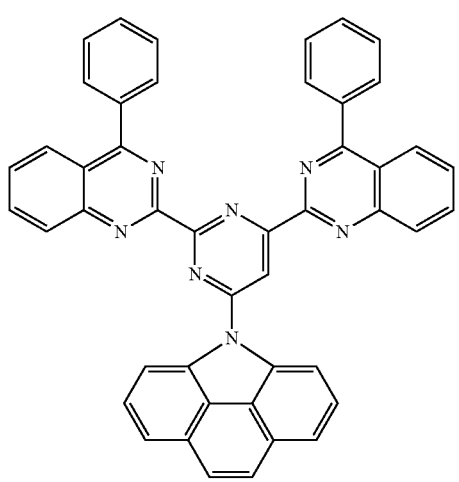

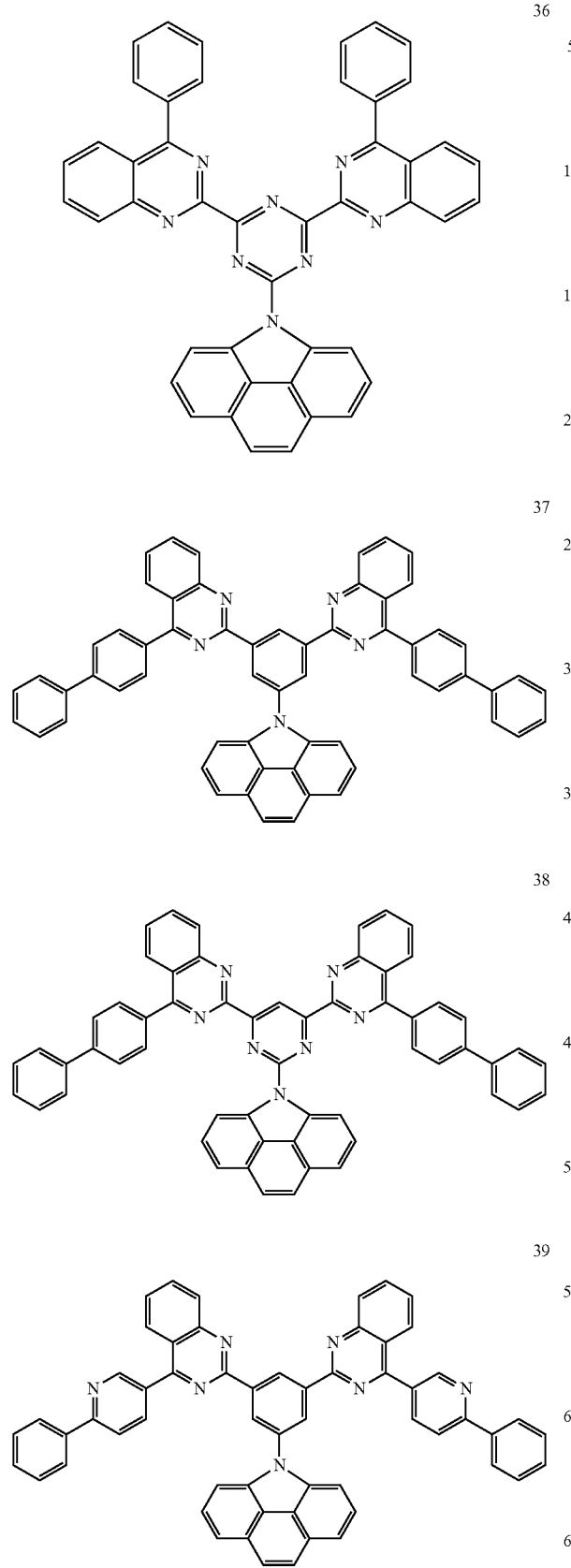

-continued

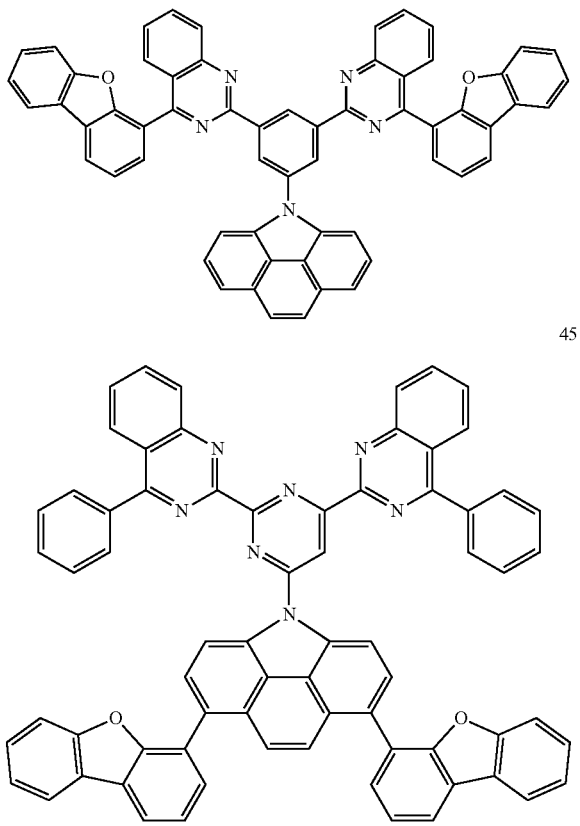

An organic light-emitting diode according to another embodiment of the present invention includes a first electrode; a second electrode; and an organic layer between the first electrode and the second electrode, and the organic layer includes a compound represented by Formula 1 above.

The organic layer may include at least one of a hole-injecting layer, a hole-transporting layer, a functional layer having both hole injecting and hole transporting capabilities (hereinafter, "H-functional layer"), a buffer layer, an electron-blocking layer, an emission layer, a hole-blocking layer, an electron-transporting layer, an electron-injecting layer, and/or a functional layer having both electron injecting and electron transporting capabilities (hereinafter, "E-functional layer").

For example, the organic layer may be the emission layer, for example, the organic layer may be a green emission layer or a red emission layer.

According to an embodiment of the present invention, the organic layer includes an electron-injecting layer, an electron-transporting layer, an emission layer, a hole-injecting layer, a hole-transporting layer, and/or an H-functional layer. The emission layer may include an anthracene-based compound, an arylamine-based compound, and/or a styryl-based compound.

According to another embodiment of the present invention, the organic layer includes an electron-injecting layer, an electron-transporting layer, an emission layer, a hole-injecting layer, a hole-transporting layer, and/or an H-functional layer. Any one of a red layer, a green layer, a blue layer, and a white layer of the emission layer may include a phosphorescent compound, and the hole-injecting layer, the hole-transporting layer, and/or the H-functional layer may include a charge-generating material. The charge-generating material may be a p-dopant, and the p-dopant may be a quinone derivative, a metal oxide, or a cyano group containing compound.

According to another embodiment of the present invention, the organic layer includes an electron-transporting layer, and the electron-transporting layer may include an electron transporting organic compound and a metal complex. The metal complex may be a Li complex.

As used herein, the term "organic layer" refers to a single layer and/or a plurality of layers disposed between the first electrode and the second electrode.

The organic layer includes an emission layer, and the emission layer may include the heterocyclic compound represented by Formula 1. In another embodiment, the organic layer includes at least one of a hole-injecting layer, a hole-transporting layer, and/or an H-functional layer. At least one of the hole-injecting layer, the hole-transporting layer, and the H-functional layer may include the heterocyclic compound represented by Formula 1.

The accompanying drawing is a schematic view of a structure of an organic light-emitting diode according to an embodiment of the present invention. Hereinafter, a structure and a method of manufacturing an organic light-emitting diode, according to an embodiment of the present invention, will be described with reference to the accompanying drawing.

A substrate may be any suitable substrate commonly used in organic light-emitting diodes. In some embodiments, the substrate may be a glass substrate or a transparent plastic substrate with mechanical strength, thermal stability, transparency, surface smoothness, ease of handling, and water resistance.

A first electrode may be formed on the substrate by depositing or sputtering a first electrode-forming material onto a surface of the substrate. When the first electrode is an anode, a material having a high work function may be used as the first electrode-forming material to facilitate hole injection. The first electrode may be a reflective electrode or a transmission electrode (e.g., a transparent electrode). Transparent and conductive materials, such as ITO, IZO, $SnO_2$, and ZnO, may be used to form the first electrode. The first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single layer structure or a multi-layer structure including at least two layers. For example, the first electrode may have a three-layered structure of ITO/Ag/ITO, but it is not limited thereto.

An organic layer is disposed on the first electrode. The organic layer may include a hole-injecting layer (HIL), a hole-transporting layer (HTL), a buffer layer, an emission layer (EML), an electron-transporting layer (ETL), and/or an electron-injecting layer (EIL).

The HIL may be formed on the first electrode by various methods, such as vacuum deposition, spin coating, casting, or Langmuir-Blodgett (LB) deposition. When the HIL is formed using vacuum deposition, the vacuum deposition conditions may vary according to the compound that is used to form the HIL, and the desired structural and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed using spin coating, the coating conditions may vary according to the compound that is used to form the NIL, and the desired structural and thermal properties of the HIL to be formed. For example, the coating rate may be about 2000 rpm to about 5000 rpm, and the temperature at which heat treatment is performed to remove solvent after coating may be about 80° C. to about 200° C. However, the coating conditions are not limited thereto.

The HIL may be formed of any suitable material that is commonly used to form an HIL. Non-limiting examples of the material that may be used to form the HIL include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and (polyaniline)/poly(4-styrenesulfonate (PANI/PSS):

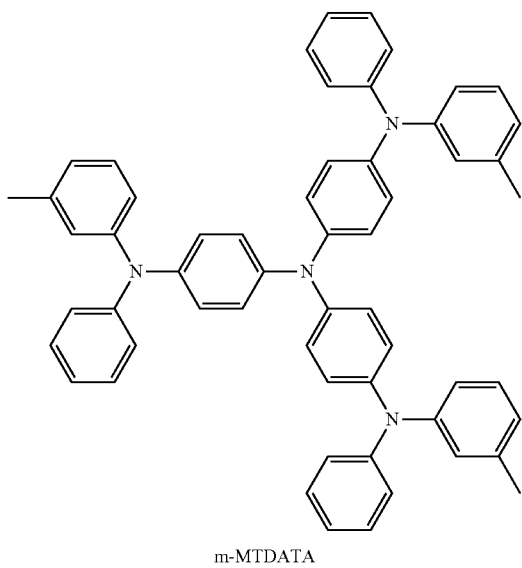

m-MTDATA

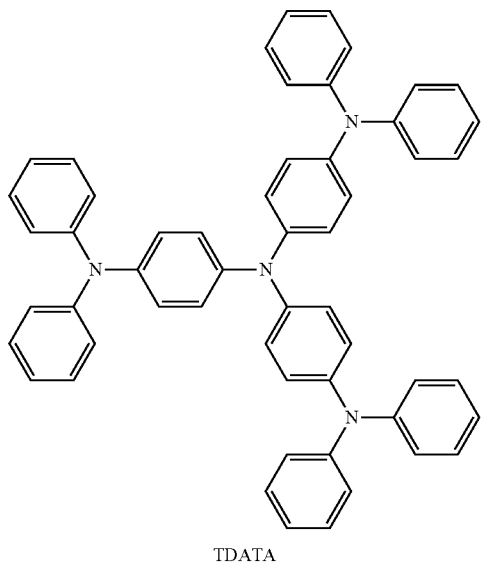

TDATA

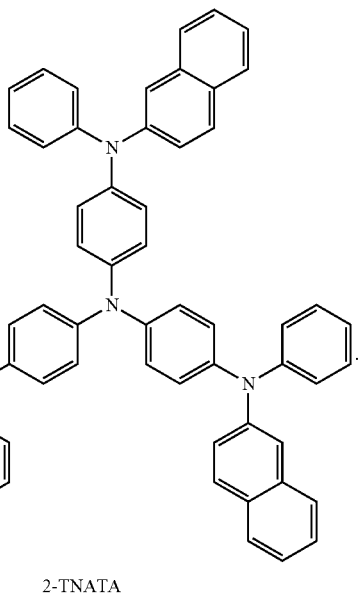

2-TNATA

The thickness of the HIL may be about 100 Å to about 10000 Å, and in some embodiments, may be about 100 Å to about 1000 Å. When the thickness of the HIL is within these ranges, the HIL may have good hole-injecting ability without a substantial increase in driving voltage.

Then, the HTL may be formed on the HIL using vacuum deposition, spin coating, casting, LB deposition, or the like. When the HTL is formed using vacuum deposition or spin coating, the conditions for deposition or coating may be similar to those for the formation of the HIL, though the conditions for the deposition or coating may vary according to the material that is used to form the HTL.

Any suitable hole-transporting materials commonly used in OLEDs may be used as the hole-transporting material. Non-limiting examples of suitable hole-transporting materials include carbazole derivatives, such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl-N,N'-diphenylbenzidine) (NPB).

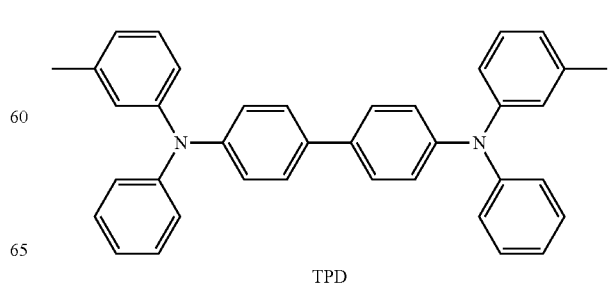

TPD

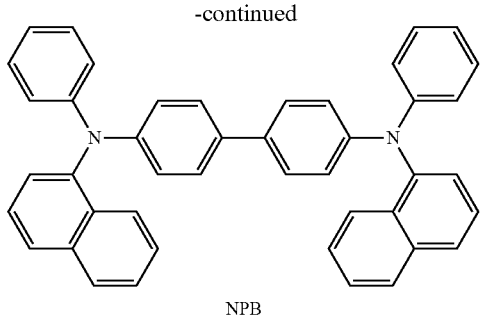

NPB

The thickness of the HTL may be about 50 Å to about 2000 Å, and in some embodiments, may be about 100 Å to about 1500 Å. When the thickness of the HTL is within these ranges, the HTL may have good hole-transporting ability without a substantial increase in driving voltage.

The H-functional layer (having both hole injecting and hole transporting capabilities) may contain one or more HIL materials and one or more HTL materials. The thickness of the H-functional layer may be about 500 Å to about 10000 Å, and in some embodiments, may be about 100 Å to about 1000 Å. When the thickness of the H-functional layer is within these ranges, the H-functional layer may have good hole injecting and transporting capabilities without a substantial increase in driving voltage.

At least one of the HIL, HTL, and H-functional layer may include at least one compound represented by one of Formula 300 and Formula 350 below.

Formula 300

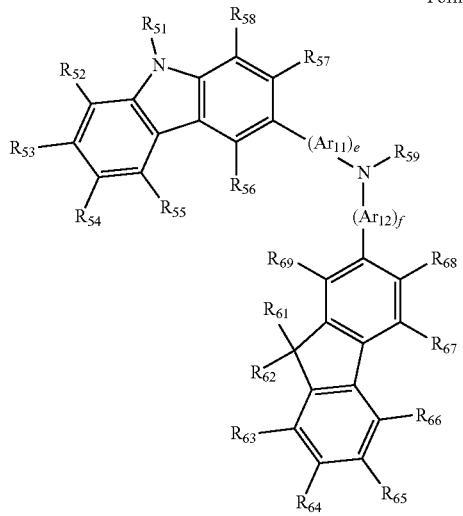

Formula 350

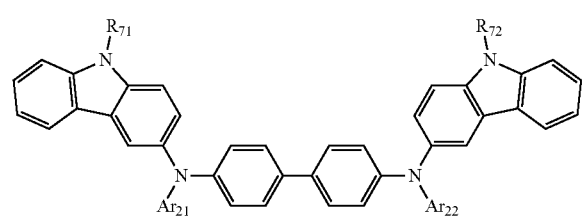

In Formulae 300 and 350, $Ar_{11}$, $Ar_{12}$, $Ar_{21}$, and $Ar_{22}$ are each independently a substituted or unsubstituted $C_5$-$C_{60}$ arylene group.

In Formula 300, e and f are each independently an integer of 0 to 5, or 0, 1, or 2. For example, e may be 1 and f may be 0, but they are not limited thereto.

In Formulae 300 and 350 above, $R_{51}$ to $R_{58}$, $R_{61}$ to $R_{69}$, and $R_{71}$ and $R_{72}$ are each independently a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

For example, $R_{51}$ to $R_{58}$, $R_{61}$ to $R_{69}$, $R_{71}$ and $R_{72}$ may each independently be one of a hydrogen atom; a deuterium atom; a halogen atom; a hydroxyl group; a cyano group; a nitro group; an amino group; an amidino group; a hydrazine group; a hydrazone group; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, and a hexyl group); a $C_1$-$C_{10}$ alkoxy group (for example, a methoxy group, an ethoxy group, a propoxy group, a butoxy group, and a pentoxy group); a $C_1$-$C_{10}$ alkyl group and a $C_1$-$C_{10}$ alkoxy group each substituted with one or more of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; or a phenyl group, a naphthyl group, an anthryl group, a fluorenyl group, and a pyrenyl group each substituted with one or more of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group. However, $R_{51}$ to $R_{58}$, $R_{61}$ to $R_{69}$, $R_{71}$ and $R_{72}$ are not limited thereto.

In Formula 300, $R_{59}$ may be one of a phenyl group; a naphthyl group; an anthryl group; a biphenyl group; a pyridyl group; or a phenyl group, a naphthyl group, an anthryl group, a biphenyl group, or a pyridyl group substituted with one or more of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

According to an embodiment, the compound represented by Formula 300 above may be represented by Formula 300A below, but is not limited thereto.

Formula 300A
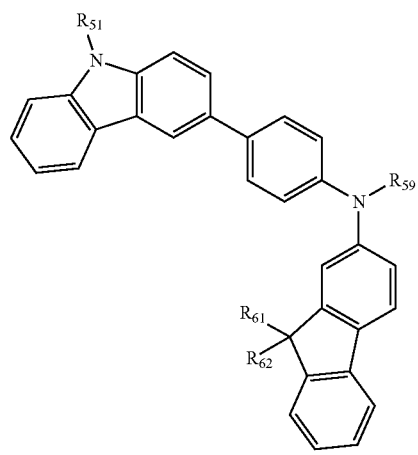
In Formula 300A, of $R_{51}$, $R_{61}$, $R_{62}$, and $R_{59}$ are the same as described above with respect to Formula 300.
For example, at least one of the HIL, HTL, and/or H-functional layer may include one or more of Compounds 301 to 320 below, but these layers are is not limited thereto.
301
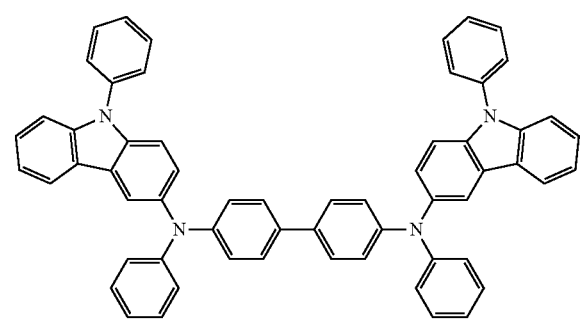
302
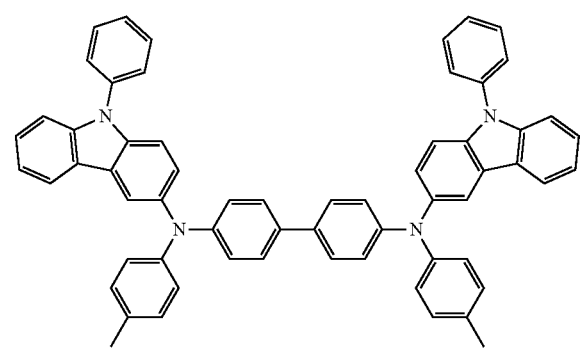
303
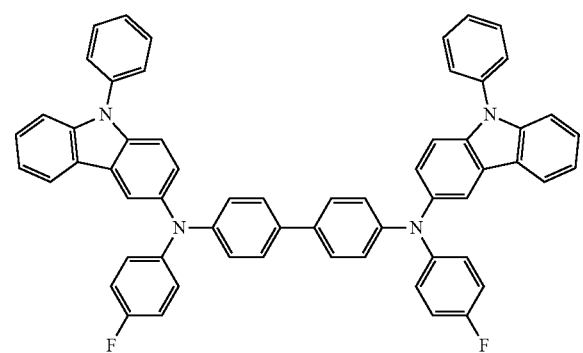
304
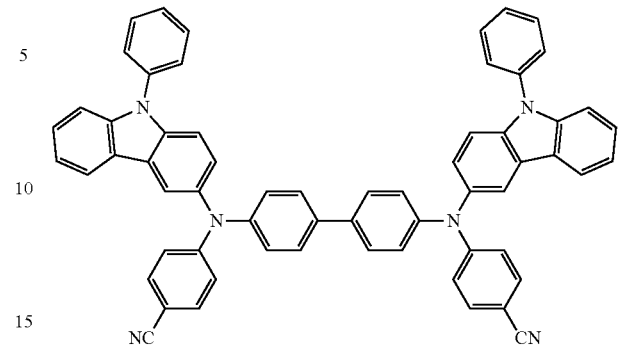
305
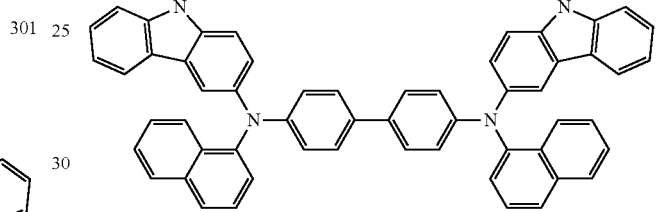
306
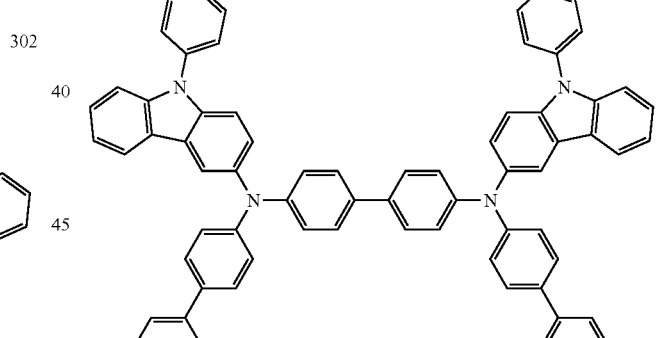
307
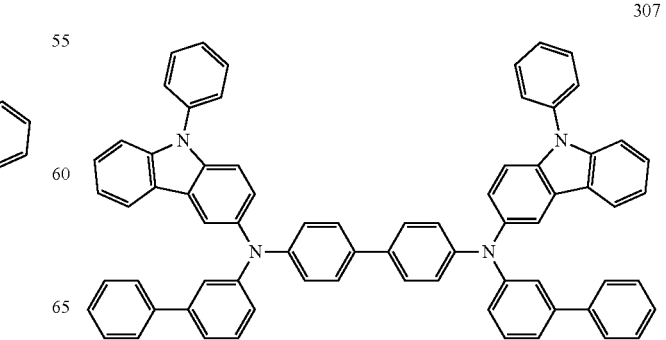

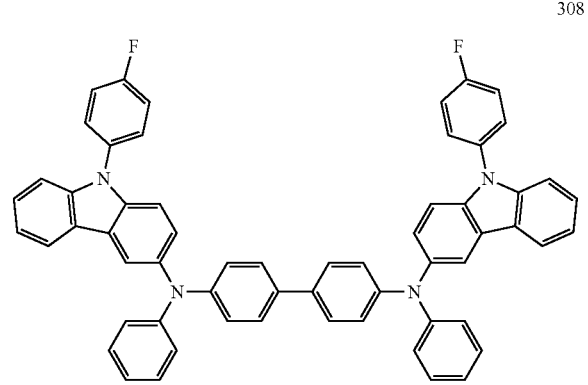
308
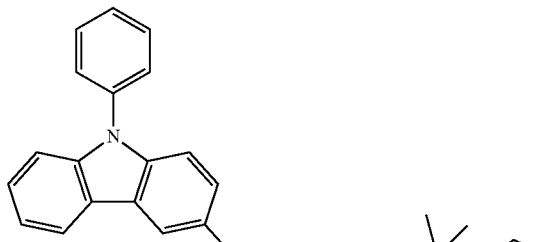
311
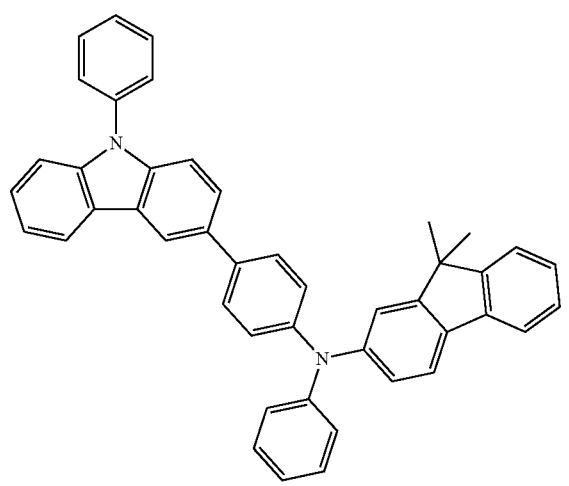
309
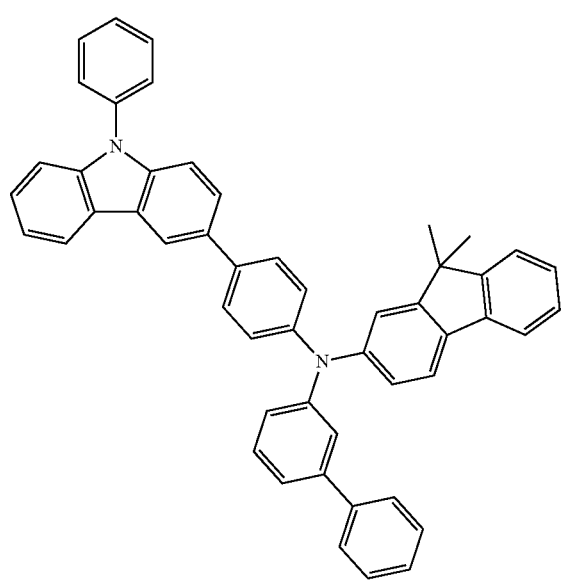
310
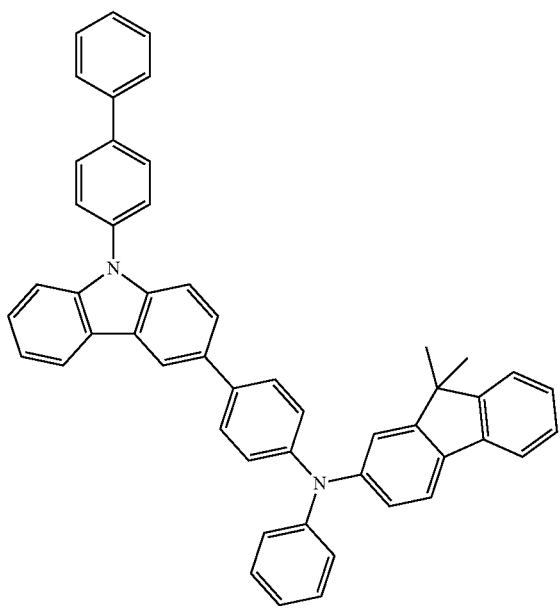
312

31
-continued
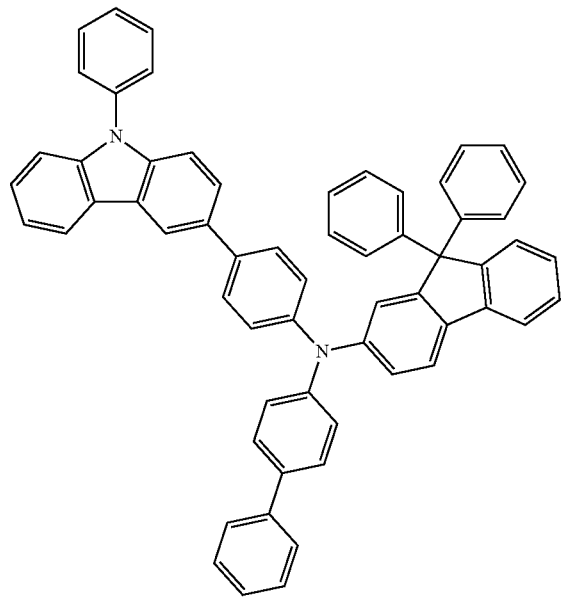
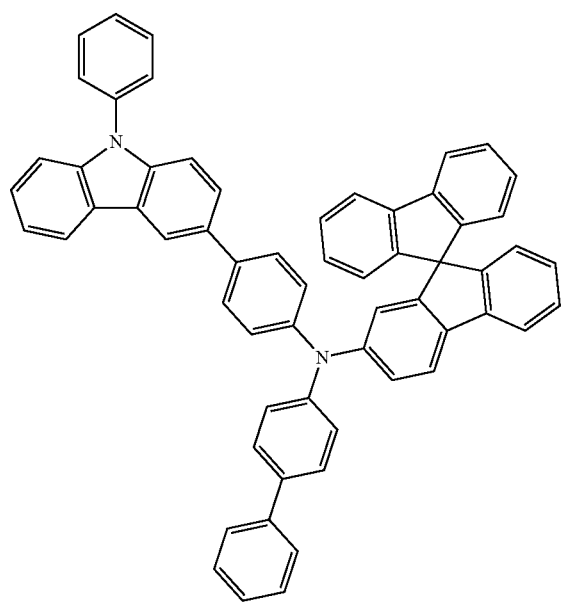
32
-continued
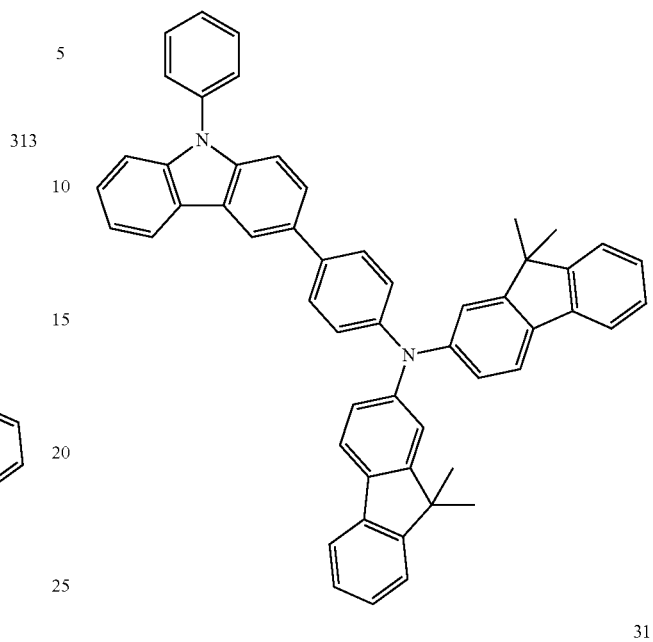
313
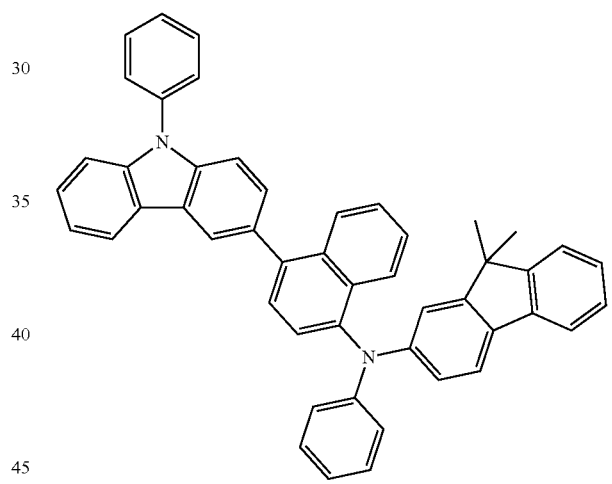
314
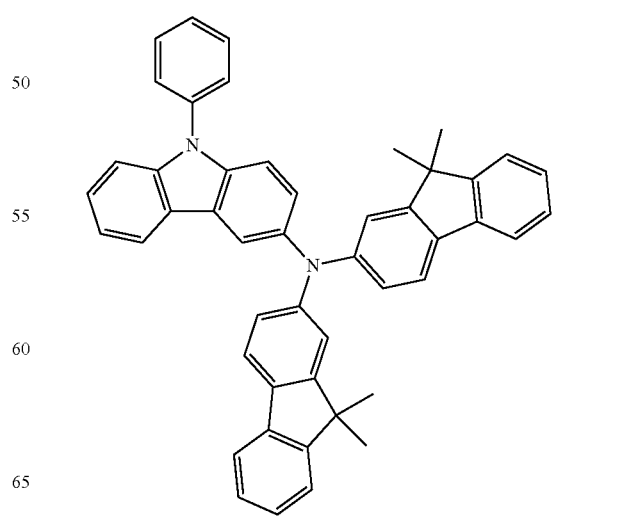

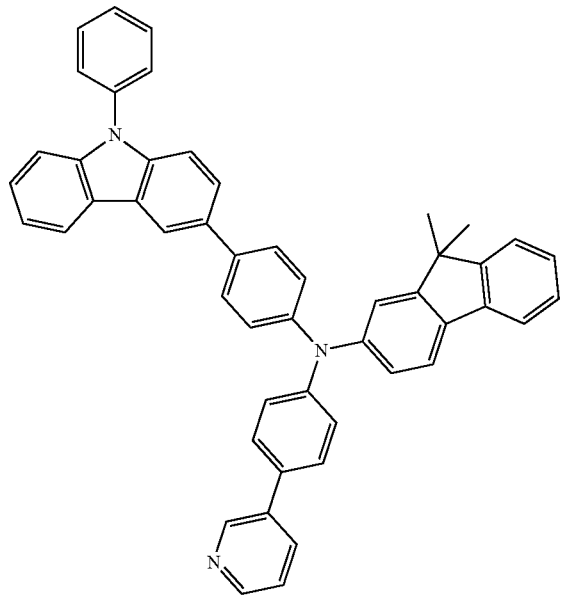

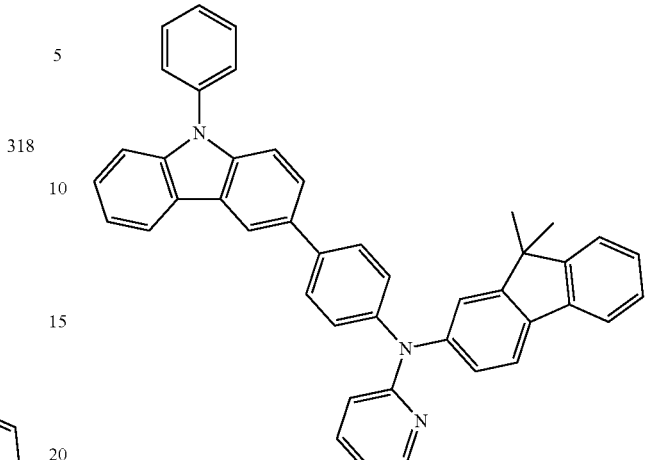

To improve conductivity of a film and the like, at least one of the HIL, HTL, and H-functional layer may further include a charge-generating material other than, or in addition to, the hole-transporting material or material having both hole injecting and hole transporting capabilities.

The charge-generating material may be, for example, a p-dopant. The p-dopant may be one of a quinone derivative, a metal oxide, or a cyano group containing compound, but it is not limited thereto. Non-limiting examples of the charge-generating material include quinone derivatives such as tetracyanoquinonedimethane (TCNQ), 2,3,5,6-tetrafluoro-tetracyano-1,4-benzoquinonedimethane (F4-TCNQ, shown below), and the like; metal oxides, such as tungsten oxide, molybdenum oxide; and cyano-containing compounds, such as Compound 200 below.

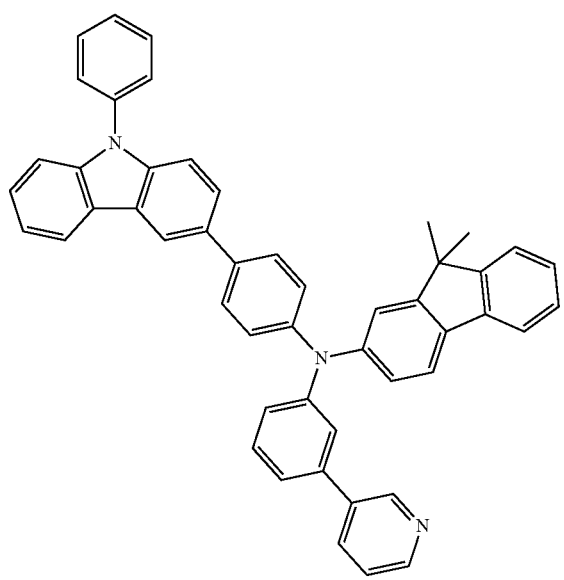

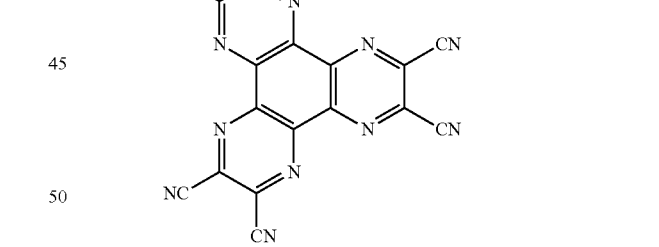

When the HIL, the HTL, or the H-functional layer further include a charge-generating material, the charge-generating material may be varied, such as by being homogeneously dispersed or inhomogeneously distributed in the H-functional layer.

The buffer layer may be between the EML at least one of the HIL, HTL, and H-functional layer. The buffer layer may compensate for an optical resonance distance of light according to a wavelength of the light emitted from the EML, and thus may increase efficiency. The buffer layer may include any suitable hole-injecting material or hole-transporting material that is commonly used in OLEDs. In some other embodiments, the buffer layer may include the same (or substantially the same) material as one of the materials included in the HIL, HTL, and H-functional layer underneath the buffer layer.

Then, the EML may be formed on the HTL, H-functional layer, or buffer layer by vacuum deposition, spin coating, casting, LB deposition, or the like. When the EML is formed using vacuum deposition or spin coating, the deposition or coating conditions may be similar to those for the formation of the HIL, though the conditions for deposition or coating may vary according to the material that is used to form the EML.

The EML may include a heterocyclic compound represented by Formula 1 or various other suitable hosts and dopants. The dopant may be a suitable fluorescent or a suitable phosphorescent dopant.

For example, as the host, Alq$_3$, 4,4'-N,N'-dicarbazole-biphenyl (CBP), poly(n-vinyl carbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyryl arylene (DSA), dmCBP (shown below), and Compounds 501 to 509 below may be used, but the host is not limited thereto.

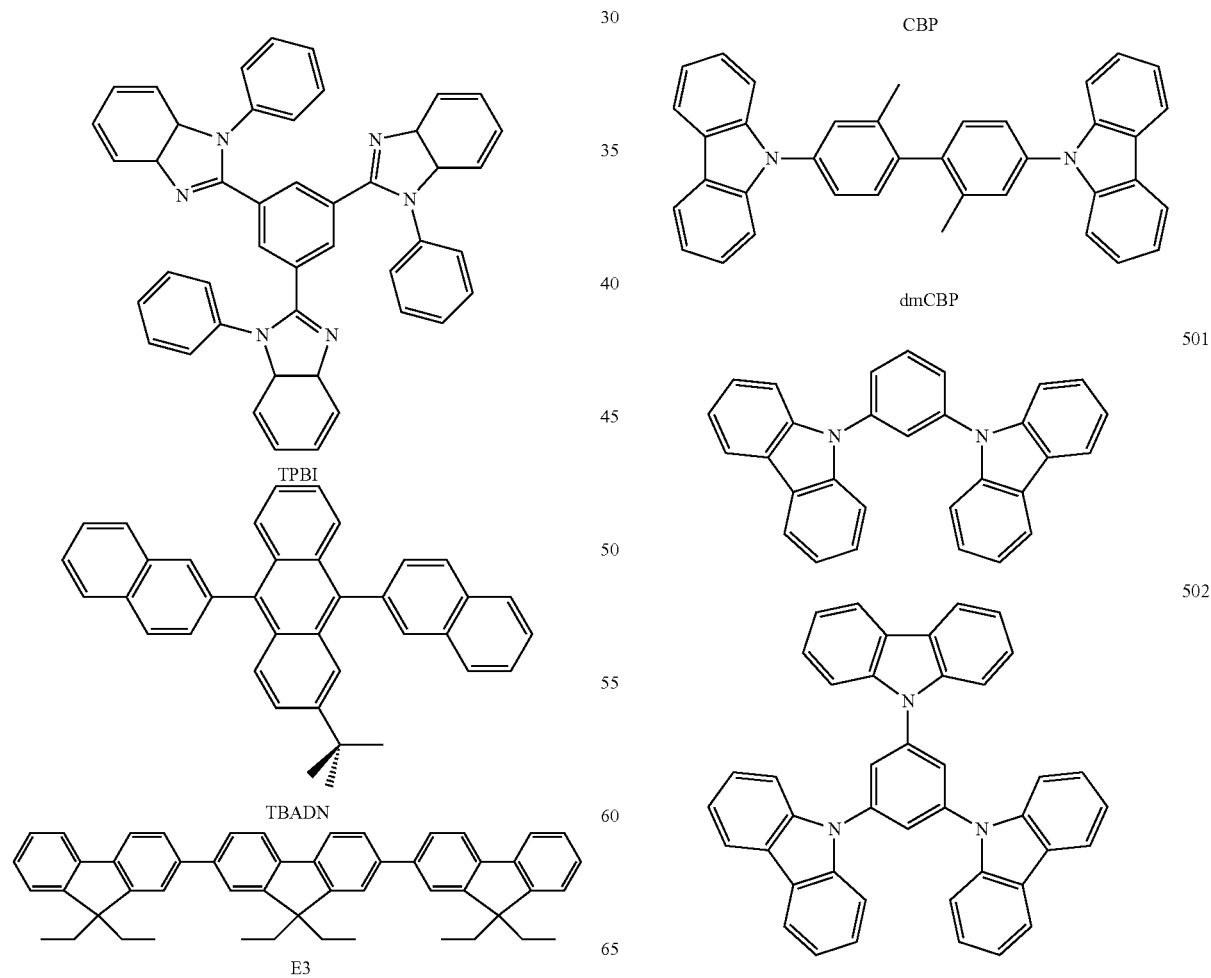

-continued
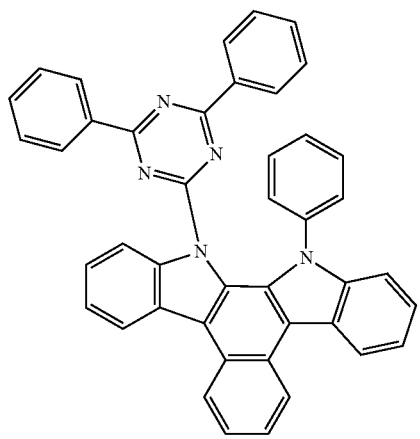
503
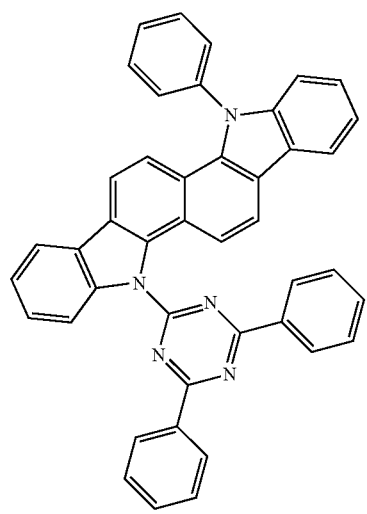
504
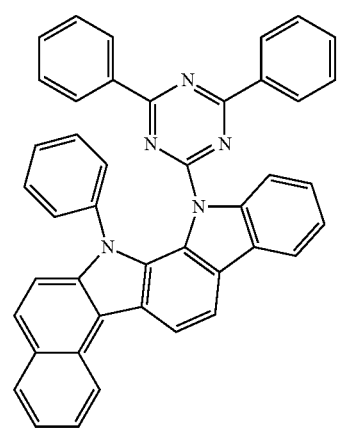
505
-continued
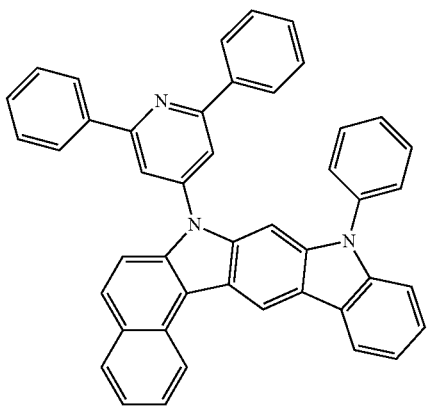
506
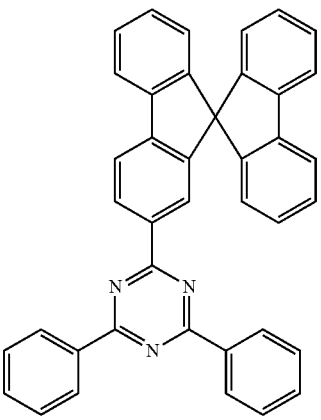
507
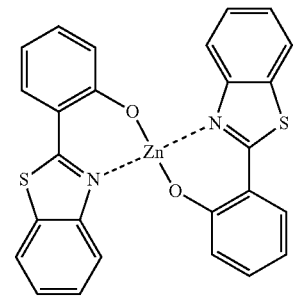
508
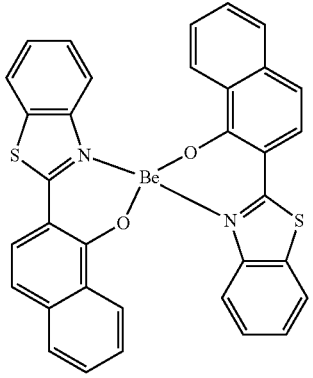
509
In another embodiment, as the host, an anthracene-based compound represented by Formula 400 below may be used.

Formula 400

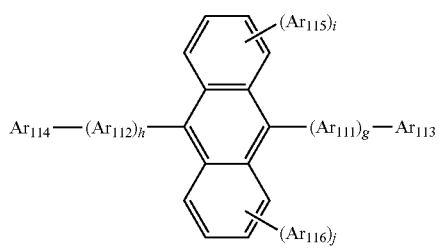

In Formula 400, $Ar_{111}$ and $Ar_{112}$ are each independently a substituted or unsubstituted $C_5$-$C_{60}$ arylene group; $Ar_{113}$ to $Ar_{116}$ are each independently a substituted or unsubstituted $C_1$-$C_{10}$ alkyl group or a substituted or unsubstituted $C_5$-$C_{60}$ aryl group; and g, h, i, and j are each independently an integer of 0 to 4.

For example, in Formula 400 above, $Ar_{111}$ and $Ar_{112}$ may be a phenylene group, a naphthylene group, a phenanthrenylene group, a fluorenylene group or a pyrenylene group; or a phenylene group, a naphthylene group, a phenanthrenylene group, a fluorenylene group, or a pyrenylene group substituted with one or more of a phenyl group, a naphthyl group, or an anthryl group. However, $Ar_{111}$ and $Ar_{112}$ are not limited thereto.

In Formula 400 above, g, h, i, and j are each independently, 0, 1, or 2.

In Formula 400 above, $Ar_{113}$ to $Ar_{116}$ are each independently a $C_1$-$C_{10}$ alkyl group substituted with one or more of a phenyl group, a naphthyl group, or an anthryl group; a phenyl group; a naphthyl group; an anthryl group; a pyrenyl group; a phenanthrenyl group; or a fluorenyl group; a phenyl group, a naphthyl group, an anthryl group, a pyrenyl group, a phenanthrenyl group, or a fluorenyl group substituted with one or more of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, or a fluorenyl group; or

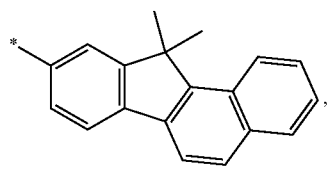 [SMILES: *c1ccc2c(c1)C(C)(C)c1c-2ccc2ccccc12]

where * is a binding site. However, $Ar_{113}$ to $Ar_{116}$ are not limited thereto.

For example, an anthracene-based compound represented by Formula 400 above may be any one of the compounds below, but is not limited thereto.

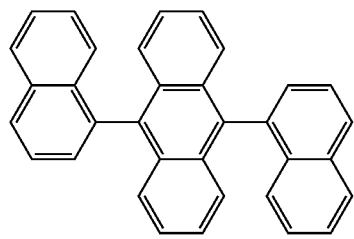

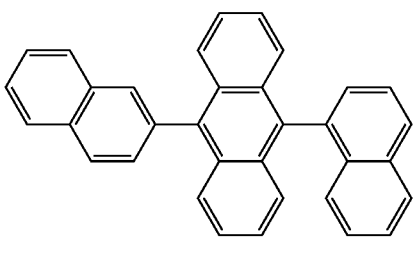

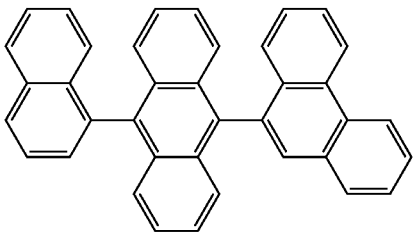

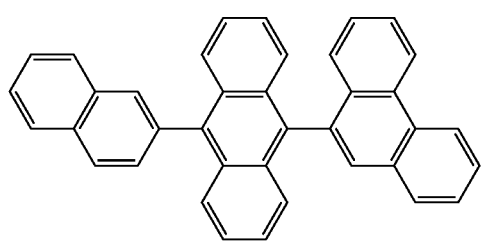

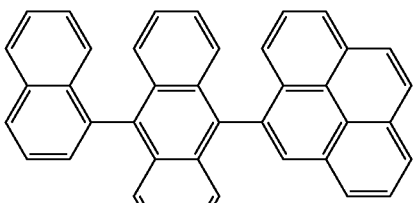

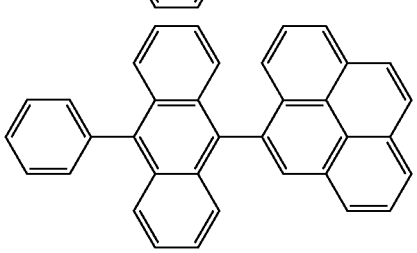

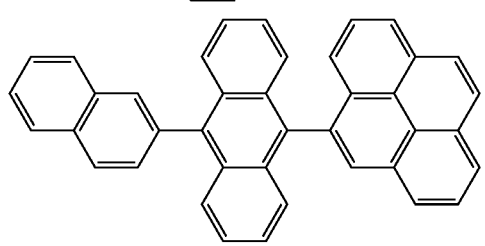

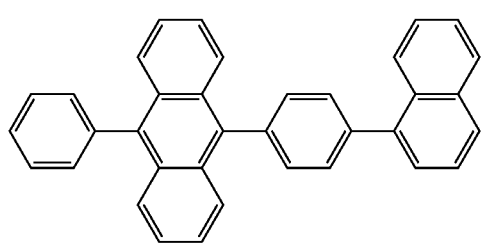

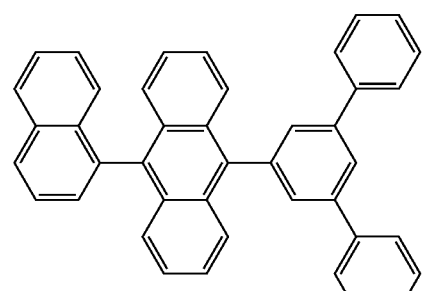
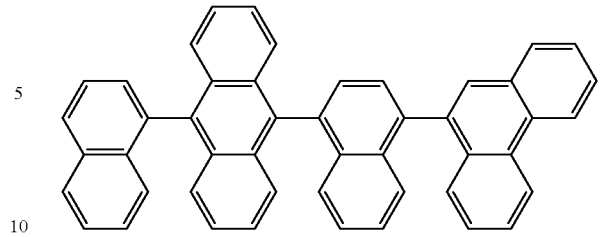
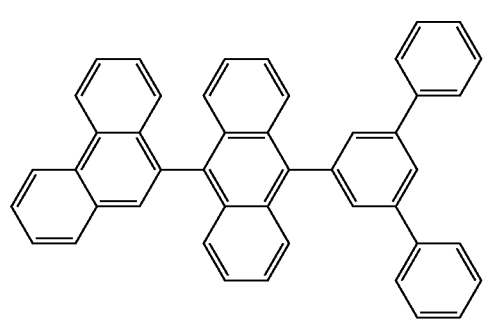
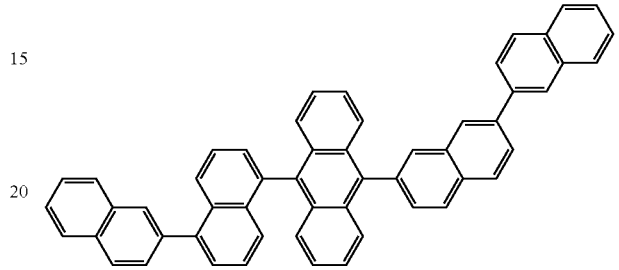
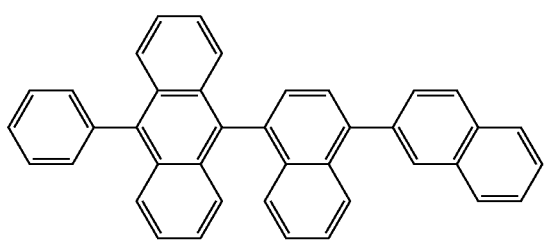
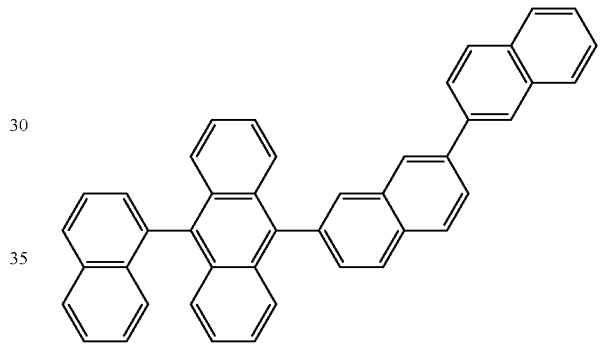
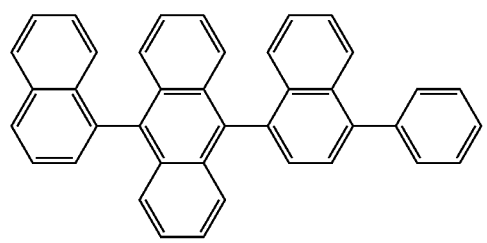
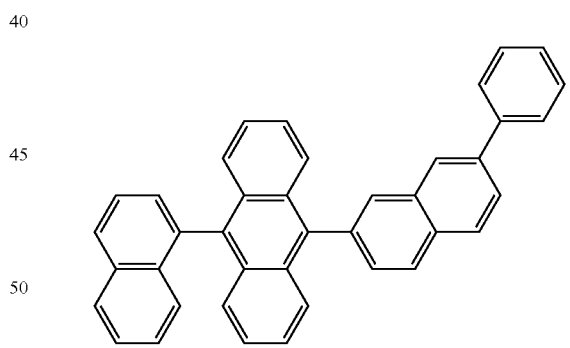
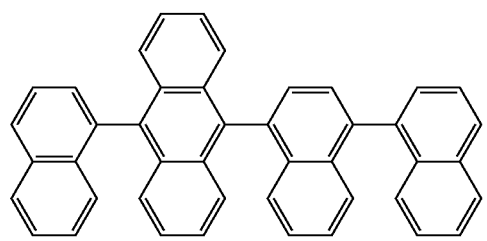
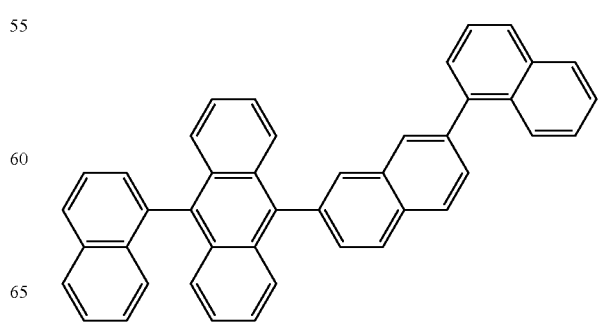
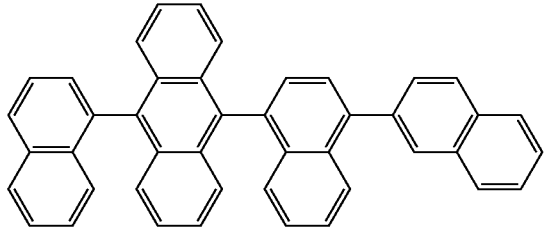

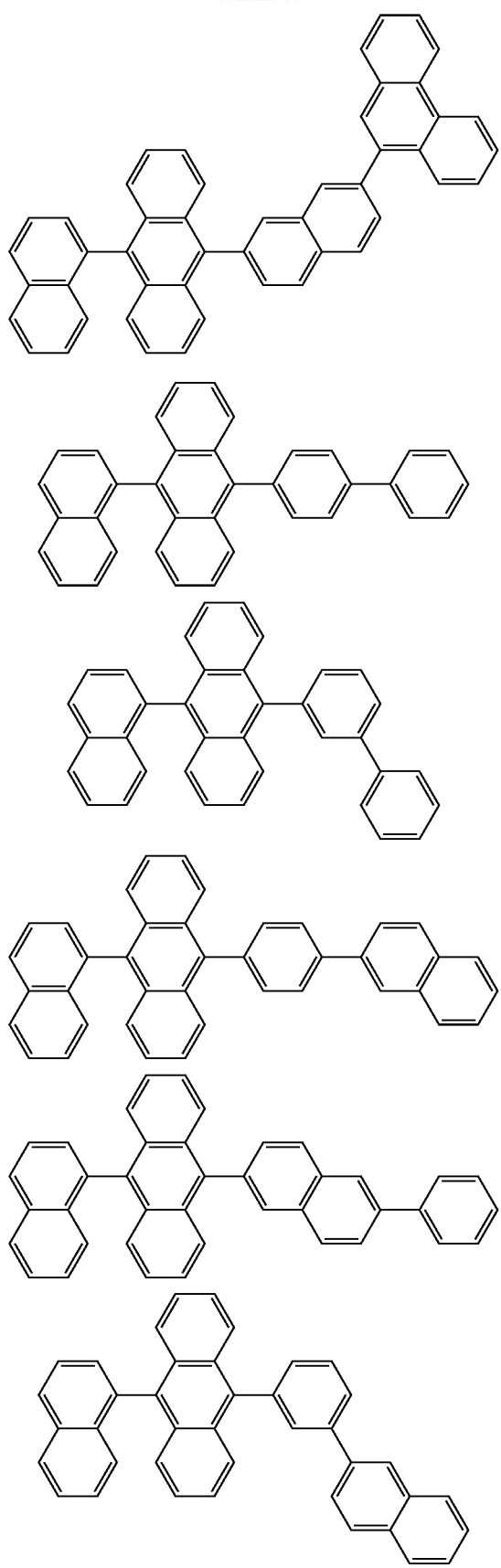
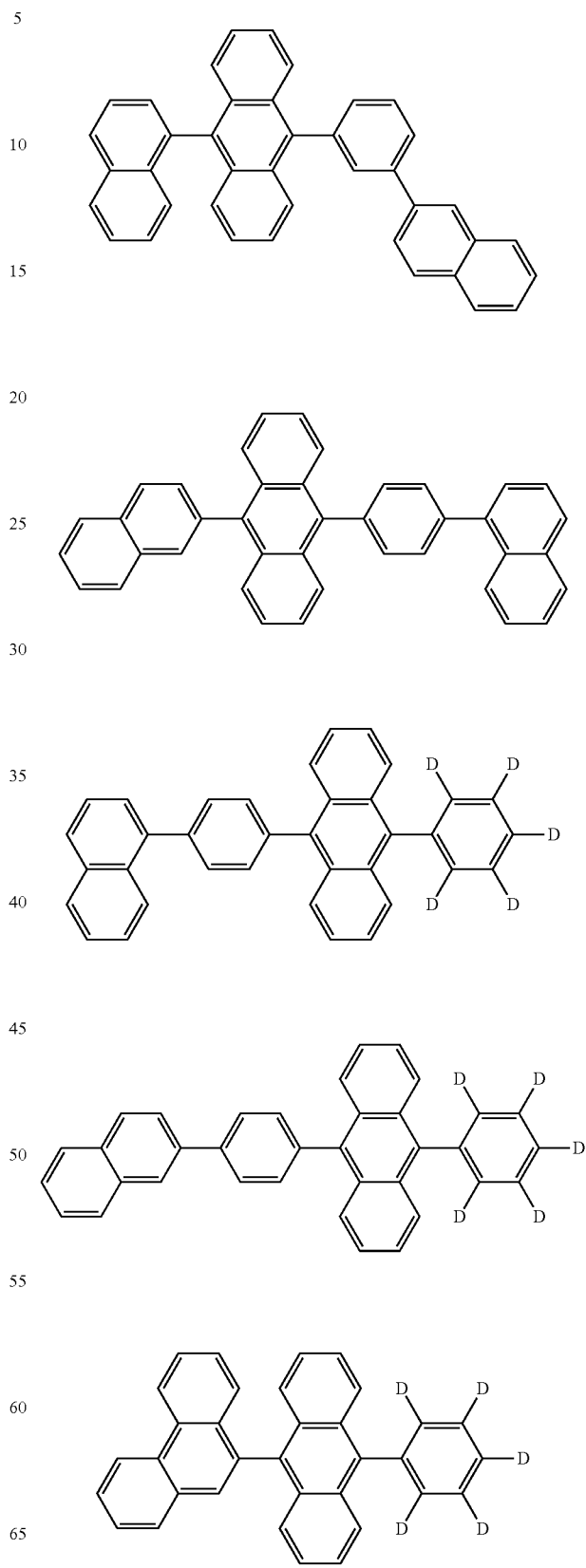

-continued
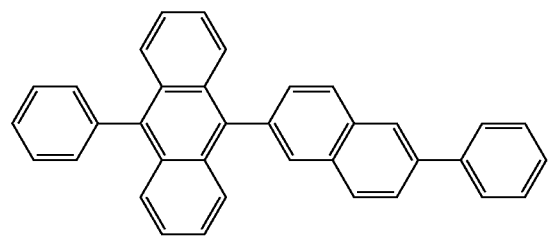
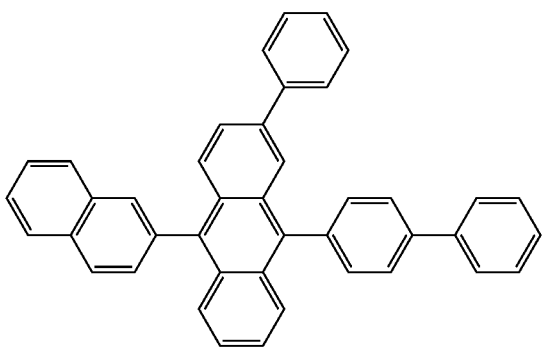
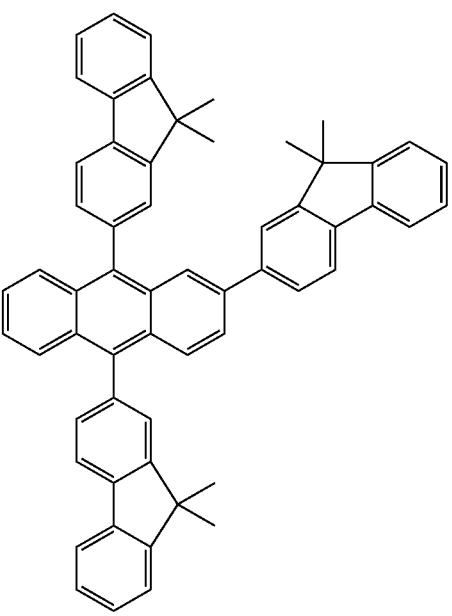
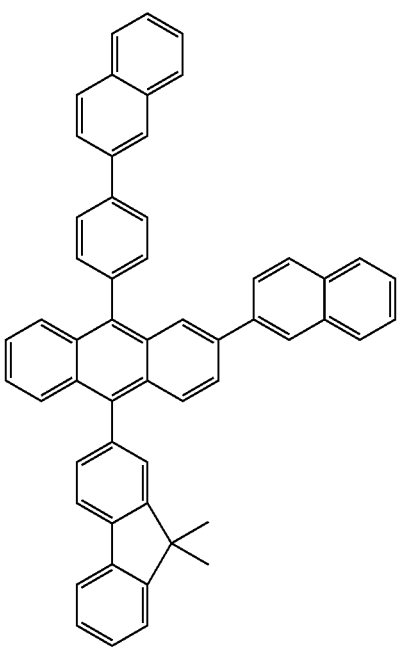

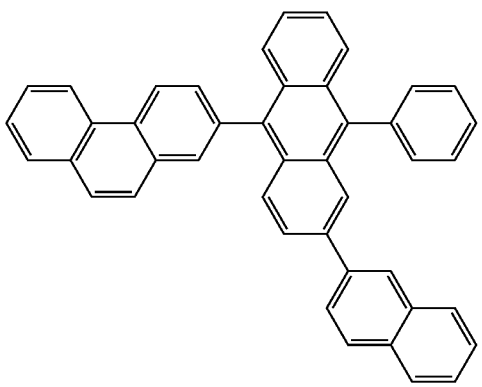

In another embodiment, as the host, an anthracene-based compound represented by Formula 401 may be used.

Formula 401

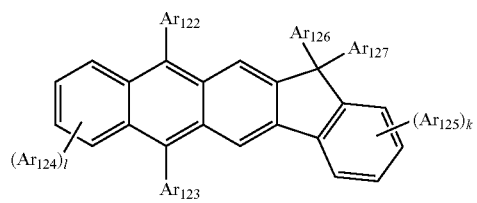

In Formula 401 above, $Ar_{122}$ to $Ar_{125}$ are the same as $Ar_{113}$ of Formula 400 above, and the description of $Ar_{113}$ is fully incorporated here.

In Formula 401 above, $Ar_{126}$ and $Ar_{127}$ are each independently a $C_1$-$C_{10}$ alkyl group (for example, a methyl group, an ethyl group, or a propyl group).

In Formula 401, k and l may each independently be an integer of 0 to 4. For example, k and l may each independently be an integer of 0, 1, or 2.

For example, the anthracene-based compound represented by Formula 401 above may be one of the compounds below, but is not limited thereto.

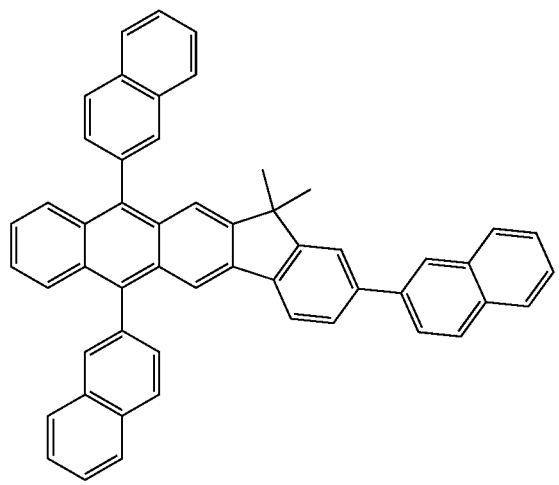

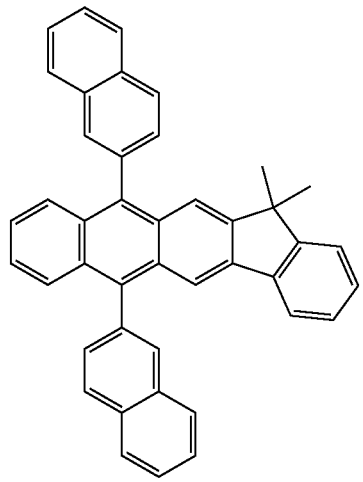

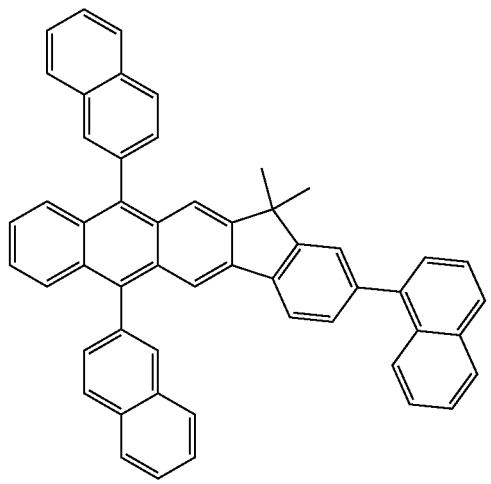

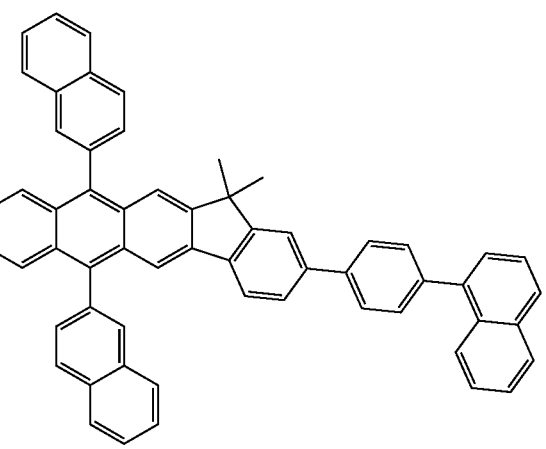

When the organic light-emitting diode is a full color organic light-emitting diode, the EML may be patterned into a red EML, a green EML, and a blue EML. At least one of the red EML, the green EML, and the blue EML may include a dopant depicted below (ppy=phenylpyridine).

Non-limiting examples of the blue dopant include:
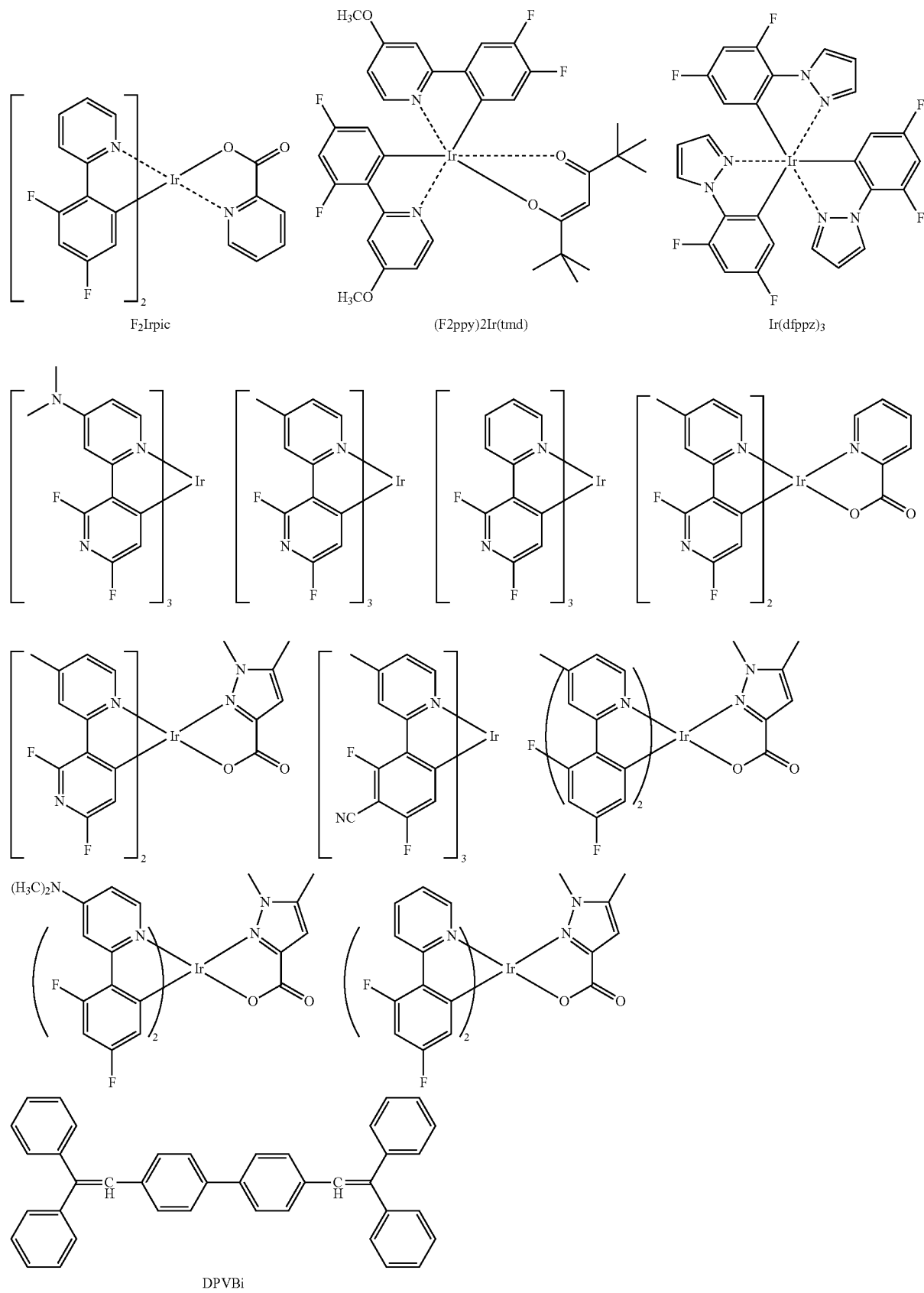

-continued
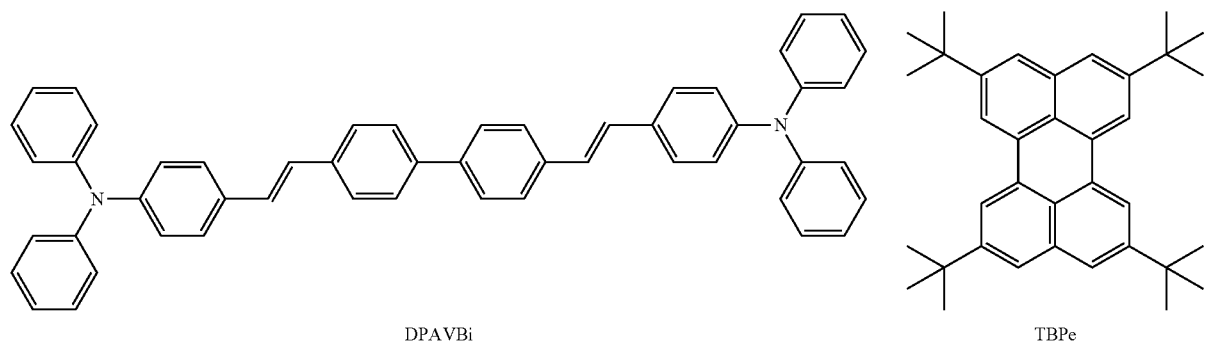
Non-limiting examples of the red dopant include:
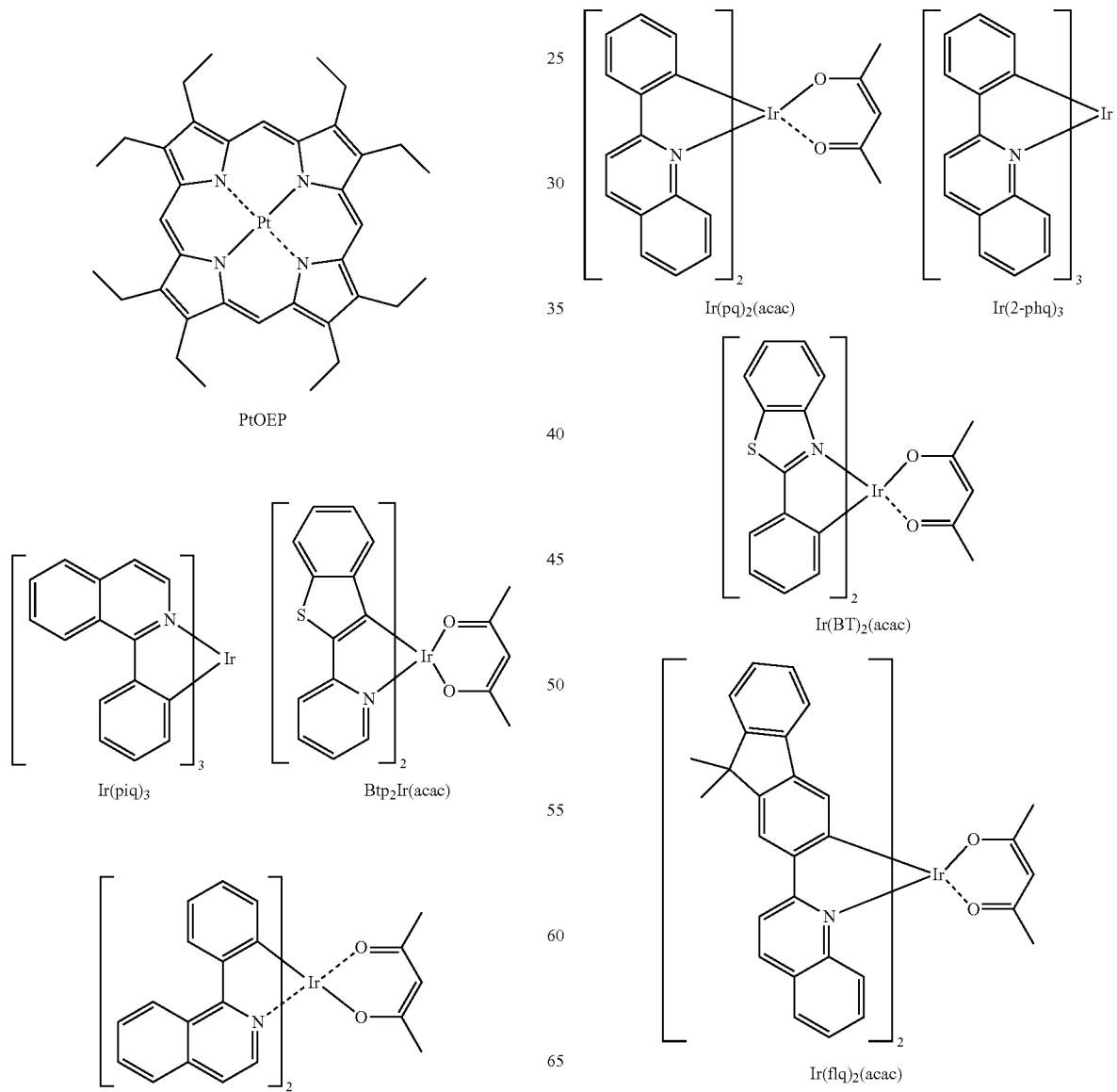

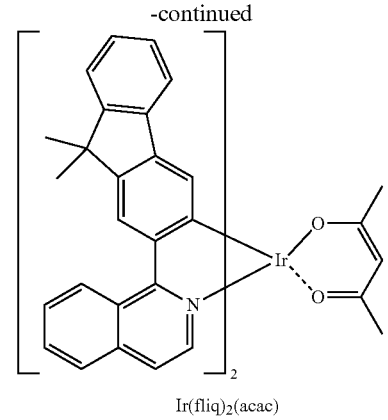
Ir(fliq)₂(acac)
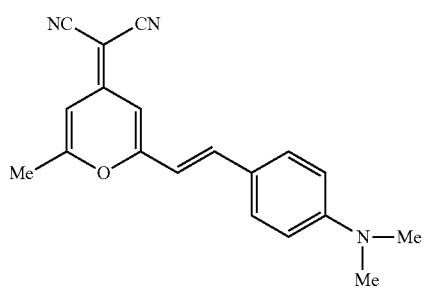
DCM
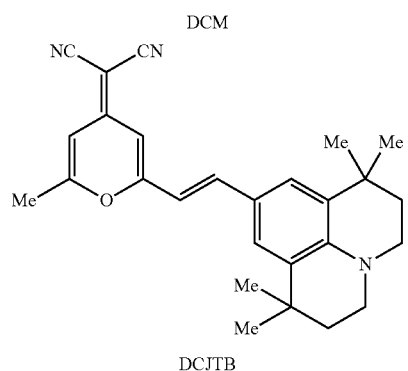
DCJTB
Non-limiting examples of the green dopant include:
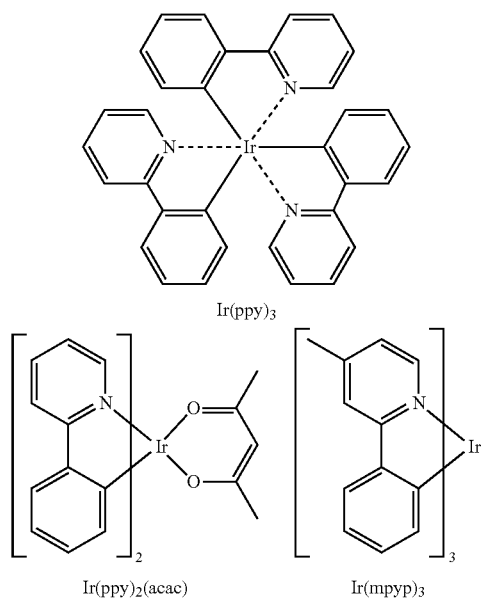
Ir(ppy)₃
Ir(ppy)₂(acac)　　Ir(mpyp)₃
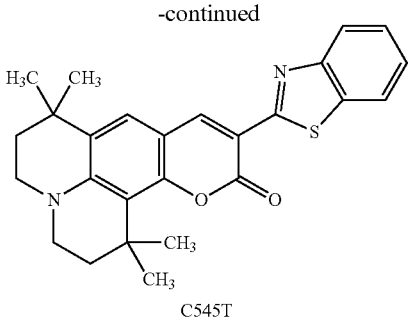
C545T
The dopant that may be included in the EML may be a Pd-complex or a Pt-complex as shown below, but the dopant is not limited thereto:
D1
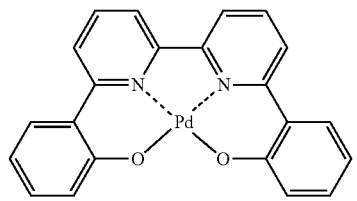
D2
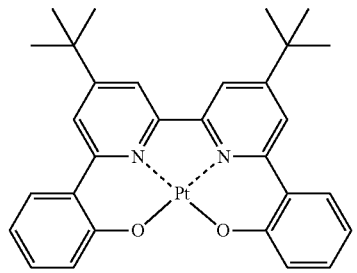
D3
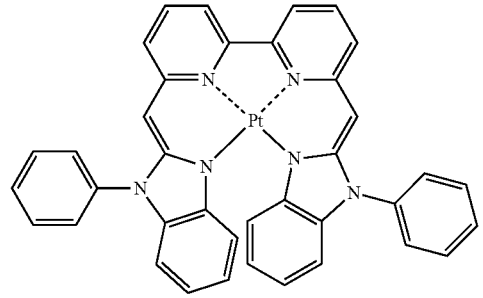
D4
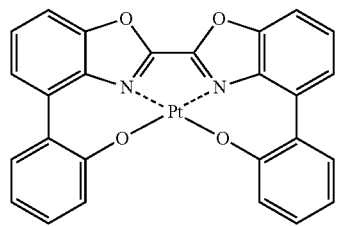
D5
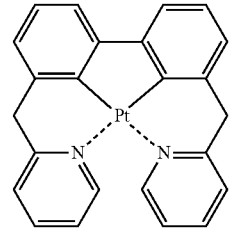

D6 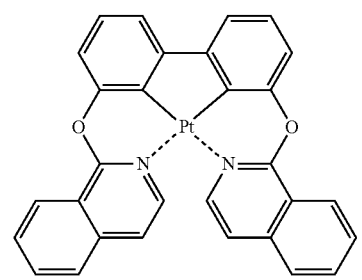
D7 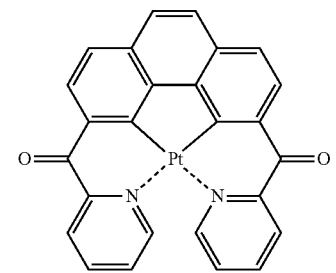
D8 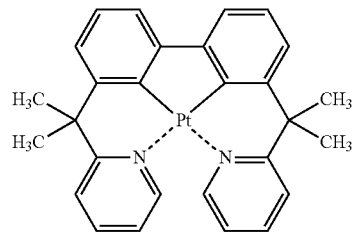
D9 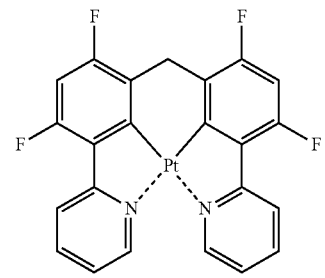
D10 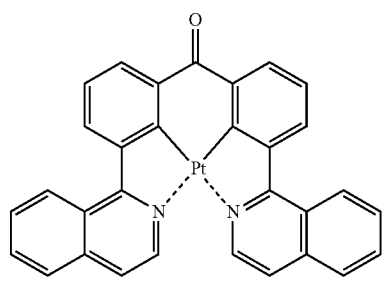
D11 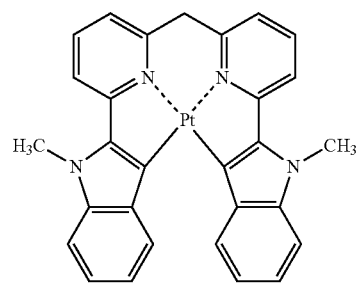
D12 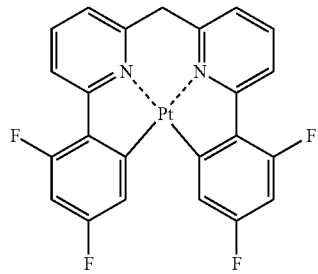
D13 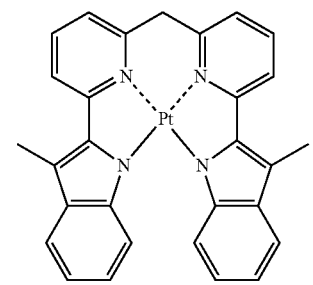
D14 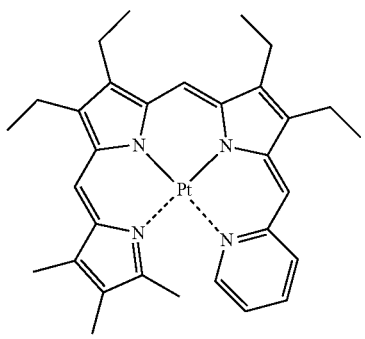
D15 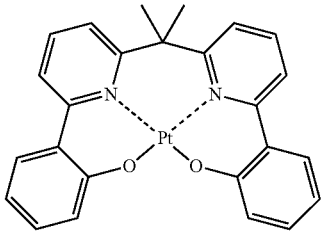
D16 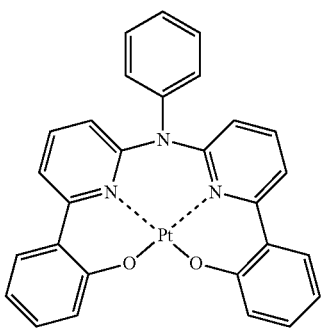

D17 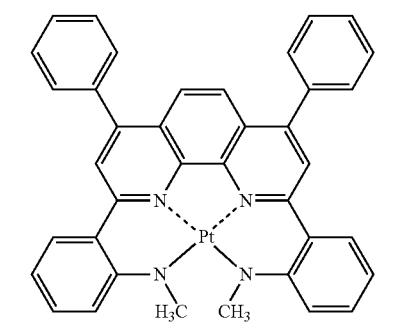
D18 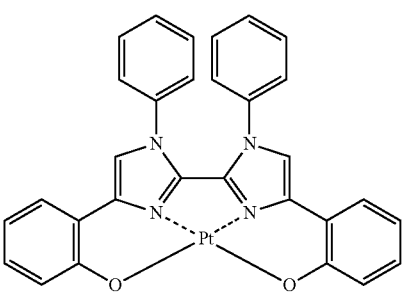
D19 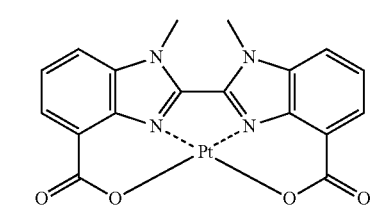
D20 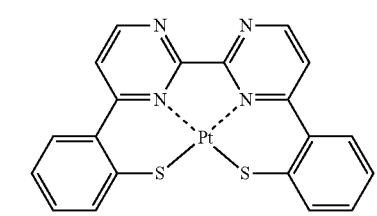
D21 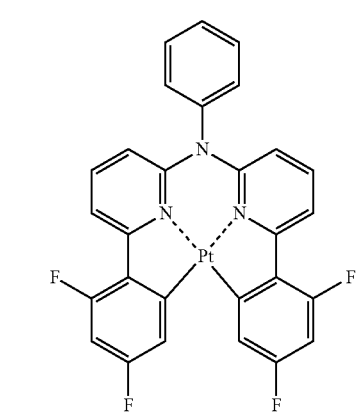
D22 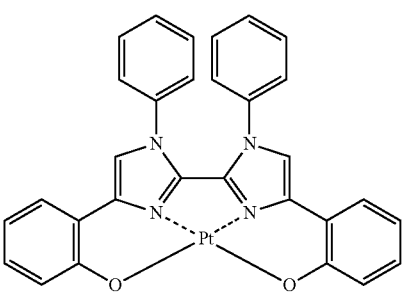
D23 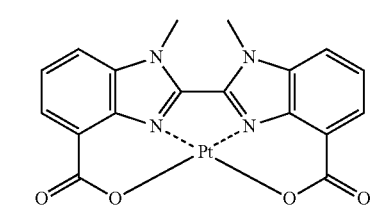
D24 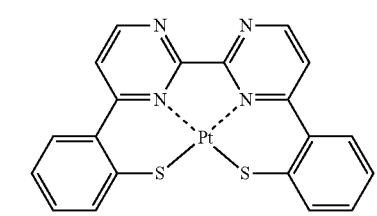
D25 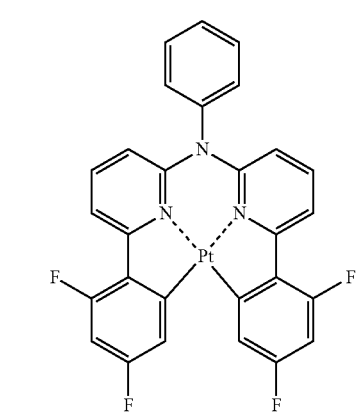
D26 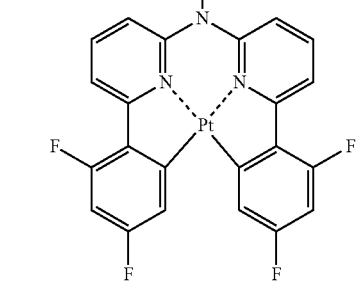

59

-continued

D27

D28

D29

D30

D31

D32

60

-continued

D33

D34

D35

D36

D37

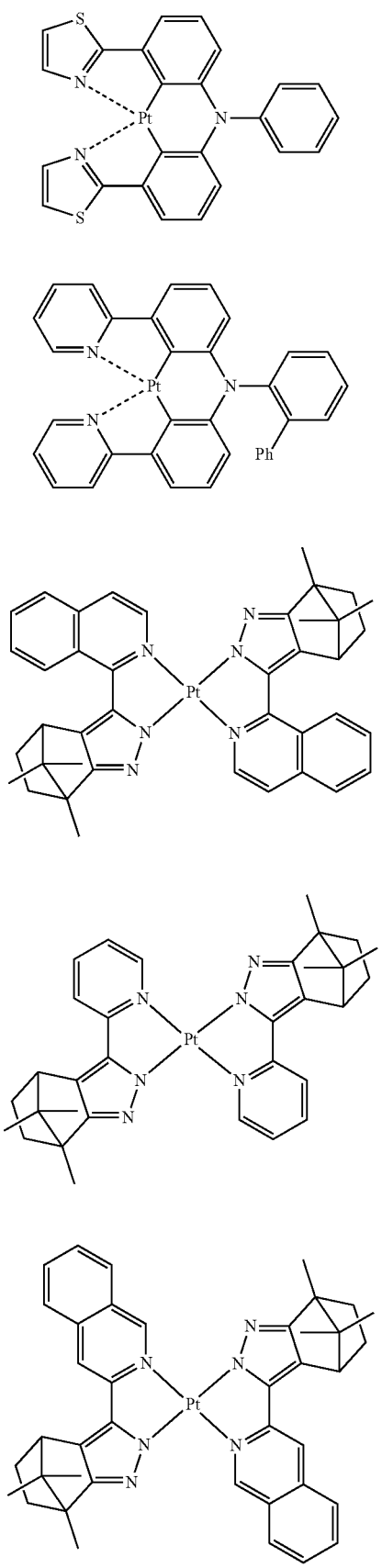
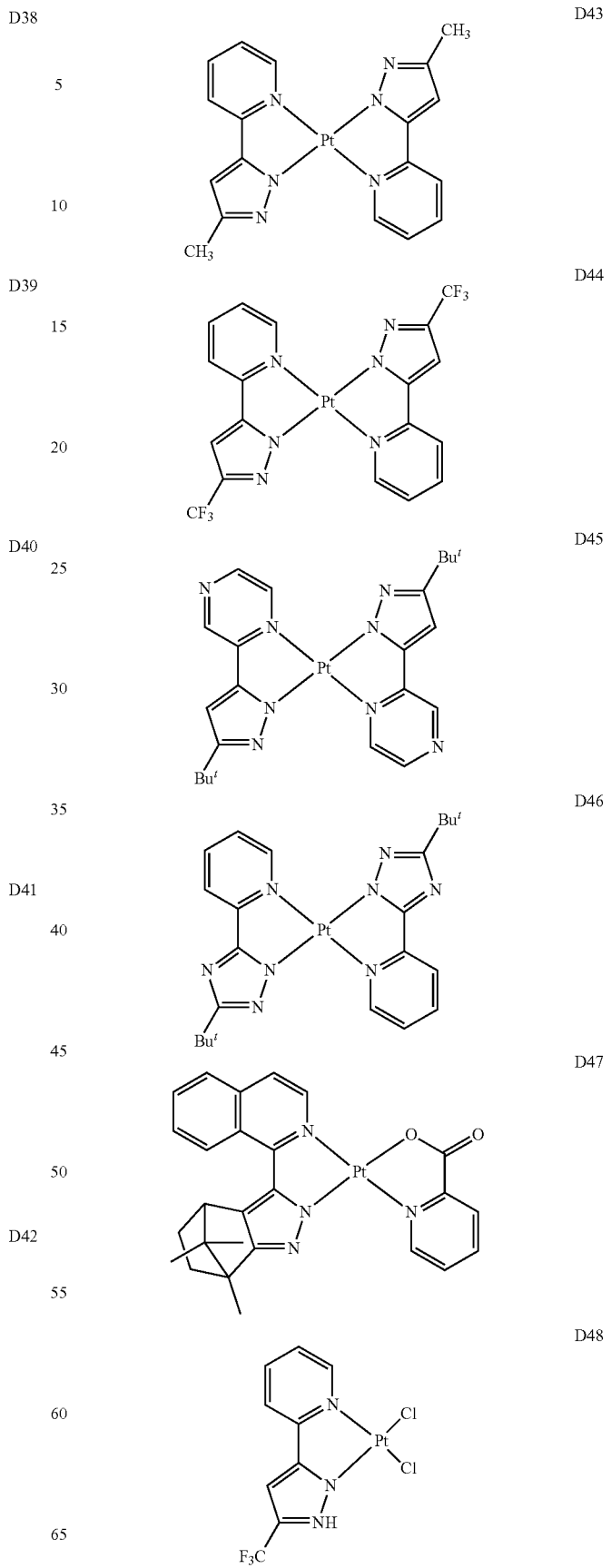

-continued

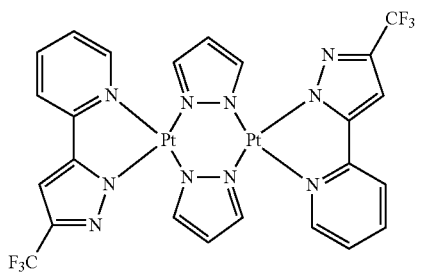

D49

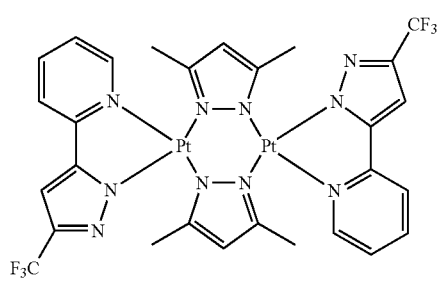

D50

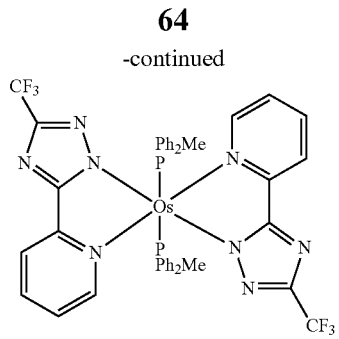

Os(fptz)₂(PPh₂Me)₂

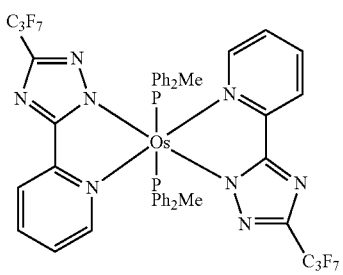

Os(hptz)₂(PPh₂Me)₂

Also, the dopant that may be included in the EML may be an Os-complex as shown below, but the dopant is not limited thereto:

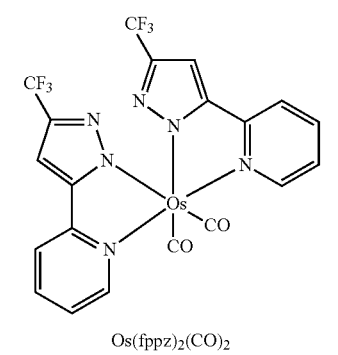

Os(fppz)₂(CO)₂

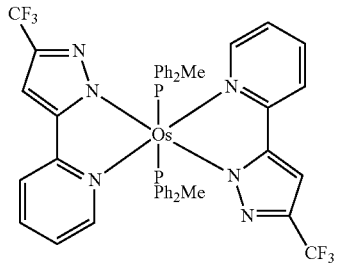

Os(fppz)₂(PPh₂Me)₂

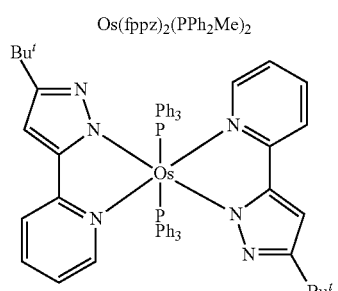

Os(bppz)₂(PPh₃)₂

When the EML includes a host and a dopant, an amount of the dopant may be about 0.01 parts by weight to about 15 parts by weight based on 100 parts by weight of the host, but the amount of the dopant is not limited thereto.

The thickness of the EML may be about 100 Å to about 1000 Å, for example, about 200 Å to about 600 Å. When the thickness of the EML is within these ranges, the EML may have good light-emitting ability without a substantial increase in driving voltage.

Then, the ETL may be formed on the EML by any of a variety of suitable methods, for example, vacuum deposition, spin coating, or casting. When the ETL is formed using vacuum deposition or spin coating, the deposition or coating conditions may be similar to those for the formation of the HIL, though the deposition or coating conditions may vary according to a material that is used to form the ETL.

The material of the ETL may be the heterocyclic compound represented by Formula 1 or any other suitable material that can stably transport electrons injected from an electron-injecting electrode (cathode).

Non-limiting examples of materials for forming the ETL include quinoline derivatives, such as tris(8-hydroxyquinolinato)aluminum (Alq3), TAZ, BAlq, beryllium bis(benzoquinolin-10-olate (Bebq2), 9,10-di(naphthalene-2-yl)anthracene (ADN), Compound 201, and Compound 202.

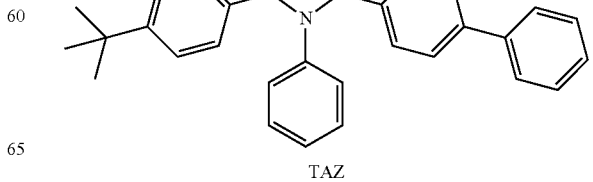

TAZ

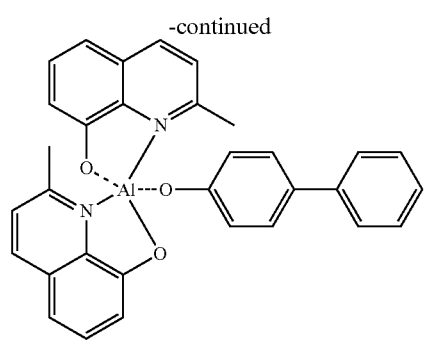

BAlq

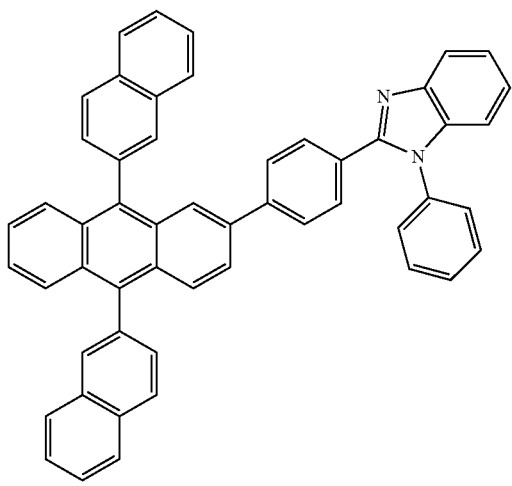

Compound 201

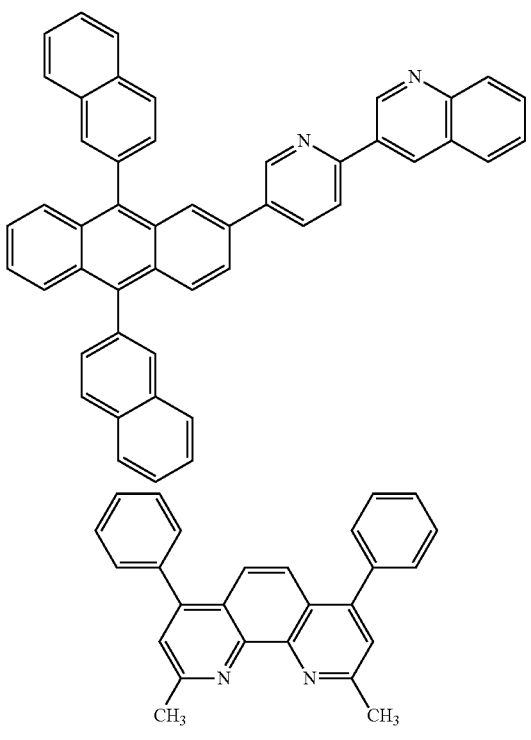

Compound 202

BCP

The thickness of the ETL may be about 100 Å to about 1,000 Å, and in some embodiments, may be about 150 Å to about 500 Å. When the thickness of the ETL is within these ranges, the ETL may have satisfactory electron transporting ability without a substantial increase in driving voltage.

In some embodiments, the ETL may further include a metal-containing material in addition to the electron-transporting organic compound. The metal-containing material may include a Li complex. Non-limiting examples of the Li complex include lithium quinolate (LiQ) and Compound 203 below.

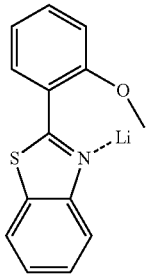

Compound 203

Then, the EIL, which facilitates injection of electrons from the cathode, may be formed on the ETL. Any suitable electron-injecting material may be used to form the EIL.

Non-limiting examples of materials for forming the EIL include EIL materials such as LiF, NaCl, CsF, $Li_2O$, and BaO. The deposition or coating conditions for forming the EIL may be similar to those for the formation of the HIL, though the deposition or coating conditions may vary according to the compound that is used to form the EIL.

The thickness of the EIL may be about 1 Å to about 100 Å, and in some embodiments, may be about 3 Å to about 90 Å. When the thickness of the EIL is within these ranges, the EIL may have satisfactory electron injection ability without a substantial increase in driving voltage.

The second electrode is disposed on the organic layer. The second electrode may be a cathode (i.e., an electron injection electrode), and a material for forming the second electrode may be a metal, an alloy, an electro-conductive compound, each of which have a low work function, or a mixture thereof. In this regard, the second electrode may be formed of lithium (Li), magnesium (Mg), aluminum (Al), aluminum lithium (Al—Li), calcium (Ca), magnesium-indium (Mg—In), magnesium-silver (Mg—Ag), or the like, and may be formed as a thin film type transmission electrode. In some embodiments, to manufacture a top-emission light-emitting device, the transmission electrode may be formed of indium tin oxide (ITO) or indium zinc oxide (IZO).

Although the organic light-emitting device has been described with respect to the accompanying drawing is described above, the present invention is not limited thereto.

When a phosphorescent dopant is used in the EML, a hole-blocking layer (HBL) may be formed between the ETL and EML, or the E-functional layer and EML, in order to prevent (or lessen) diffusion of triplet excitons or holes into an ETL. The HBL may be formed using vacuum deposition, spin coating, casting, LB deposition, or the like. When the HBL is formed using vacuum deposition or spin coating, the conditions for deposition or coating may be similar to those for the formation of the HIL, although the conditions for deposition or coating may vary according to the material that is used to form the HBL. Any suitable hole-blocking material may be used, non-limiting examples of which include oxadiazole derivatives, triazole derivatives, phenanthroline derivatives, and the like. In some embodiments, BCP (shown below) may be used as the hole-blocking material.

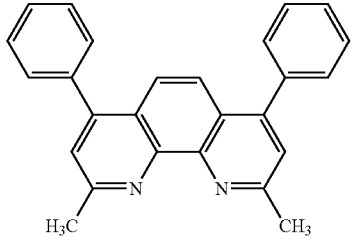

BCP

The thickness of the HBL may be about 20 Å to about 1000 Å, and in some embodiments, may be about 30 Å to about 300 Å. When the thickness of the HBL is within these ranges, the HBL may have improved hole blocking ability without a substantial increase in driving voltage.

Organic light-emitting diodes according to embodiments of the present invention may be included in various flat display devices, such as passive matrix organic light-emitting display devices and active matrix organic light-emitting display devices. When the organic light-emitting device is included in an active matrix organic light-emitting display device, a first electrode of the OLED may be electrically connected to a source electrode or a drain electrode of a thin film transistor as a pixel electrode. Also, the organic light-emitting diode may be included in a flat display device capable of displaying on both sides thereof (e.g., a display device capable of displaying images at two side of the device).

Also, an organic layer of an organic light-emitting diode according to an embodiment of the present invention may be formed by deposition of a compound according to an embodiment of the present invention, or by a wet method that involves coating a solution including the compound according to an embodiment of the present invention.

Hereinafter, organic light-emitting diodes according to embodiments of the present invention will be described by reference to the following Synthesis Examples and Examples. However, these Synthesis Examples and Examples are presented for illustrative purposes only, and do not limit the scope of the present invention.

EXAMPLE

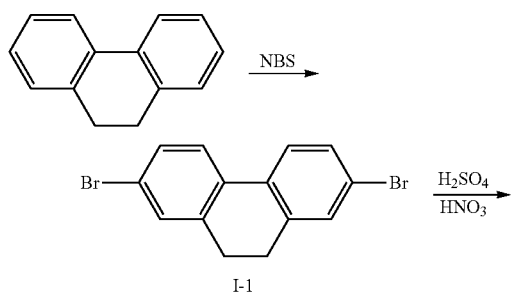

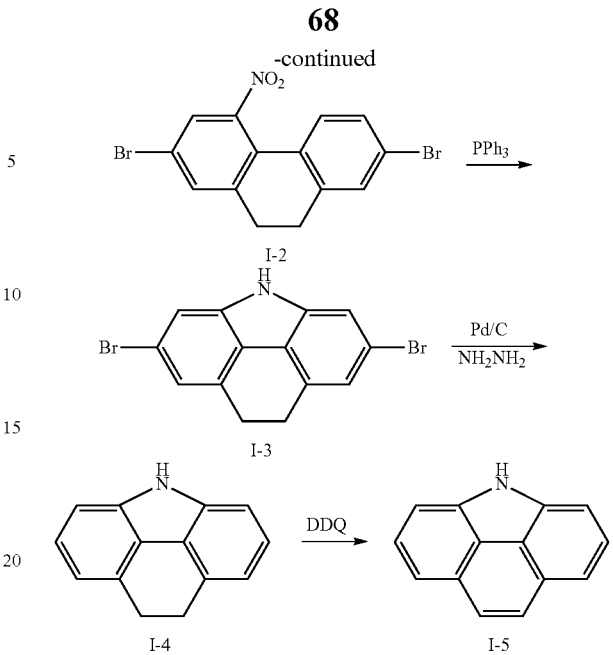

Synthesis of Intermediate I-5
1) Synthesis of Intermediate I-1

10.0 g (55.4 mmol) of 9,10-dihydrophenanthrene, 21.8 g (121.0 mmol) of N-bromosuccinimide (NBS), and 0.5 g (2.7 mmol) of p-TsOH were dissolved in 30 mL of acetonitrile and then agitated at a temperature of 50° C. for 12 hours to produce a reaction solution. Then, the reaction solution was cooled to room temperature and then agitated for 30 minutes to precipitate crystals. The crystals were collected using a reduced pressure filter and then washed with methanol to obtain 8.42 g of gray crystals of Intermediate I-1 (45% yield). The prepared compound was identified through LC-MS, and was empirically found to have a $C_{14}H_{10}Br_2$ molecular ion peak ($M^+$) at 336.9 (m/z).

2) Synthesis of Intermediate I-2

5.0 g (15.0 mmol) of Intermediate I-1 was completely dissolved in 50 mL of dichloromethane, 1.7 g (30.0 mmol) of nitric acid was introduced thereto and then 1.5 g (15.0 mmol) of sulfuric acid was slowly added dropwise thereto and then agitated at a temperature of 30° C. for 6 hours to prepare a reaction mixture. After the reaction was completed, the reaction mixture was cooled to room temperature, 50 mL of methanol was added to the reaction mixture, and then agitated for 2 hours to precipitate crystals. The crystals were collected using a reduced filter and then washed with methanol to obtain 5.2 g of yellow crystal Intermediate I-2 (90% yield). The prepared compound was identified through LC-MS, and was empirically found to have a $C_{14}H_9Br_2NO_2$ molecular ion peak ($M^+$) at 381.9 (m/z).

3) Synthesis of Intermediate I-3

4.6 g (12.0 mmol) of Intermediate I-2 was dissolved in 30 mL of o-dichlorobenzene and then heated to completely dissolve. Then, 4.7 g (18.0 mmol) of triphenylphosphine ($PPH_3$) was added thereto, and then agitated at a temperature of 180° C. for 3 hours to prepare a reaction solution. The reaction solution was cooled to room temperature, the solvent was evaporated to obtain residues. Then, the residues were isolated and purified using silica gel column chromatography, and then washed with methanol to obtain 2.9 g of white crystals of Intermediate I-3 (70% yield). The compound produced was identified through LC-MS, and was empirically found to have a $C_{14}H_9Br_2N$ molecular ion peak ($M^+$) at 349.9 (m/z).

4) Synthesis of Intermediate I-4

10 g (28.5 mmol) of Intermediate I-3 and 0.03 g (0.28 mmol) of Pd/C (10%) were dissolved in 100 mL of ethanol, the temperature was increased up to 50° C., 5.48 g (171 mmol) of hydrazine was slowly added dropwise thereto, and then agitated for 24 hours to produce a reaction solution. The reaction solution was cooled to room temperature, washed with acetone, and then 100 mL of ice water was added thereto to obtain 3.63 g of white crystals of Intermediate I-4 (66% yield). The prepared compound was identified through LC-MS, and was empirically found to have a $C_{14}H_{11}N$ molecular ion peak ($M^+$) at 194.1 (m/z).

5) Synthesis of Intermediate I-5

Under an oxygen atmosphere, 10 g (51.8 mmol) of Intermediate I-4 was dissolved in 100 mL of toluene, and then 1.57 g (7.6 mmol) of 2,3-dichloro-5,6-dicyano-1,4-benzoquinone (DDQ) and 0.52 g (7.6 mmol) of $NaNO_2$ were added thereto to produce a reaction mixture. The reaction mixture was agitated at a temperature of 110° C. for 6 hours and after the reaction was completed, the reaction mixture was cooled to room temperature to obtain residues, which were then isolated and purified using silica gel column chromatography to obtain 9.00 g of Intermediate I-5 (91% yield). The compound produced was identified through LC-MS, and was empirically found to have a $C_{14}H_9N$ molecular ion peak ($M^+$) at 192.1 (m/z).

Synthesis of Compound 2

1) Synthesis of Intermediate I-6

9.36 g (40.0 mmol) of 2-bromo-5-phenylpyridine, 4.89 g (20.0 mmol) [3-bromo-5-(dihydroxyboranyl)phenyl]boronic acid, 1.16 g (1.0 mmol) of $Pd(PPh_3)_4$, and 8.29 g (60.0 mmol) of $K_2CO_3$ were dissolved in 60 mL of THF and 30 mL of $H_2O$, and then agitated at a temperature of 80° C. for 12 hours to prepare a reaction solution. After the reaction solution was cooled to room temperature, the reaction solution was extracted 3 times with 30 mL of water and 30 mL of ethyl acetate to collect an organic layer. The collected organic layer was dried with magnesium sulfate, the solvent was evaporated to obtain residues, and then the residues were isolated and separated by silica gel column chromatography to obtain 5.75 g (62% yield) of Intermediate I-6. The prepared compound was identified through LC-MS, and was empirically found to have a $C_{28}H_{19}BrN_2$ molecular ion peak ($M^+$) at 462.1 (m/z).

2) Synthesis of Compound 2

2.32 g (5.0 mmol) of Intermediate I-6, 0.96 g (5.0 mmol) of Intermediate I-5, 0.1 g (0.5 mmol) of 1,10-phenanthroline, 0.19 g (1.0 mmol) of CuI, and 2.07 g (15.0 mmol) of $K_2CO_3$ were dissolved in 20 mL of N,N-dimethylformamide (DMF) and then agitated at a temperature of 80° C. for 24 hours to prepare a reaction solution. After the reaction solution was cooled to room temperature, the reaction solution was extracted three times with 20 mL of water and 20 mL of diethyl ether to collect an organic layer. The collected organic layer was dried with magnesium sulfate and a solvent was

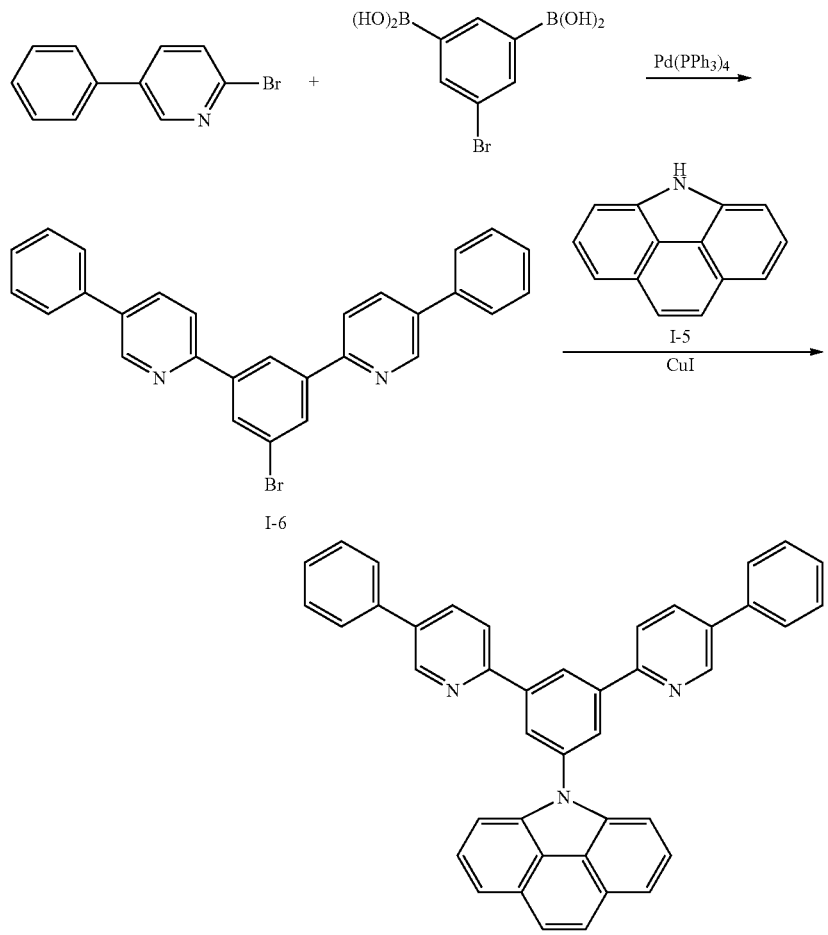

2 evaporated therefrom to obtain residues, and then the residues were isolated and purified by silica gel column chromatography to obtain 1.86 g (65% yield) of Compound 2. The prepared compound was identified through fast atom bombardment mass spectrometry (MS/FAB) and $^1$H NMR. A $C_{42}H_{27}N_3$ molecular ion peak (M$^+$) of the prepared compound was calculated as being at 573.22 (m/z), and the prepared compound was empirically found to have a molecular ion peak (M$^+$) at 573.23 (m/z).

Synthesis of Compound 7

2.47 g (68% yield) of Compound 7 was obtained using the same method as in the synthesis of Compound 2, except that 2-bromo-4,6-diphenyl-pyrimidine was used instead of 2-bromo-5-phenyl pyridine. The prepared compound was identified through MS/FAB and $^1$H NMR. A $C_{52}H_{33}N_5$ molecular ion peak (M$^+$) of the prepared compound was calculated as being at 727.27 (m/z), and the prepared compound was empirically found to have a molecular ion peak (M$^+$) at 727.26 (m/z).

Synthesis of Compound 14

1) Synthesis of Intermediate I-7

8.22 g (20.0 mmol) of 2-bromo-4,6-diiodo-pyrimidine, 11.0 g (40.0 mmol) of β-[4,6-diphenyl-2-pyridyl]boronic acid, 1.16 g (1.0 mmol) of Pd(PPh$_3$)$_4$, and 8.29 g (60.0 mmol) of K$_2$CO$_3$ were dissolved in 60 mL of THF and 30 mL of H$_2$O, and then agitated at a temperature of 80° C. for 12 hours to prepare a reaction solution. The reaction solution was cooled to room temperature and then extracted three times with 30 mL of water and 30 mL of ethyl acetate to collect an organic layer. The collected organic layer was dried with magnesium sulfate, the solvent was evaporated to obtain residues, and then the residues were isolated and purified through silica gel column chromatography to obtain 6.79 g (yield 55%) of Intermediate I-7. The prepared compound was identified through LC-MS, and was empirically found to have a $C_{28}H_{19}BrN_2$ molecular ion peak (M$^+$) at 616.1 (m/z).

2) Synthesis of Compound 14

3.09 g (5.0 mmol) of Intermediate I-7, 0.96 g (5.0 mmol) of Intermediate I-5, 0.1 g (0.5 mmol) of 1,10-phenanthroline,

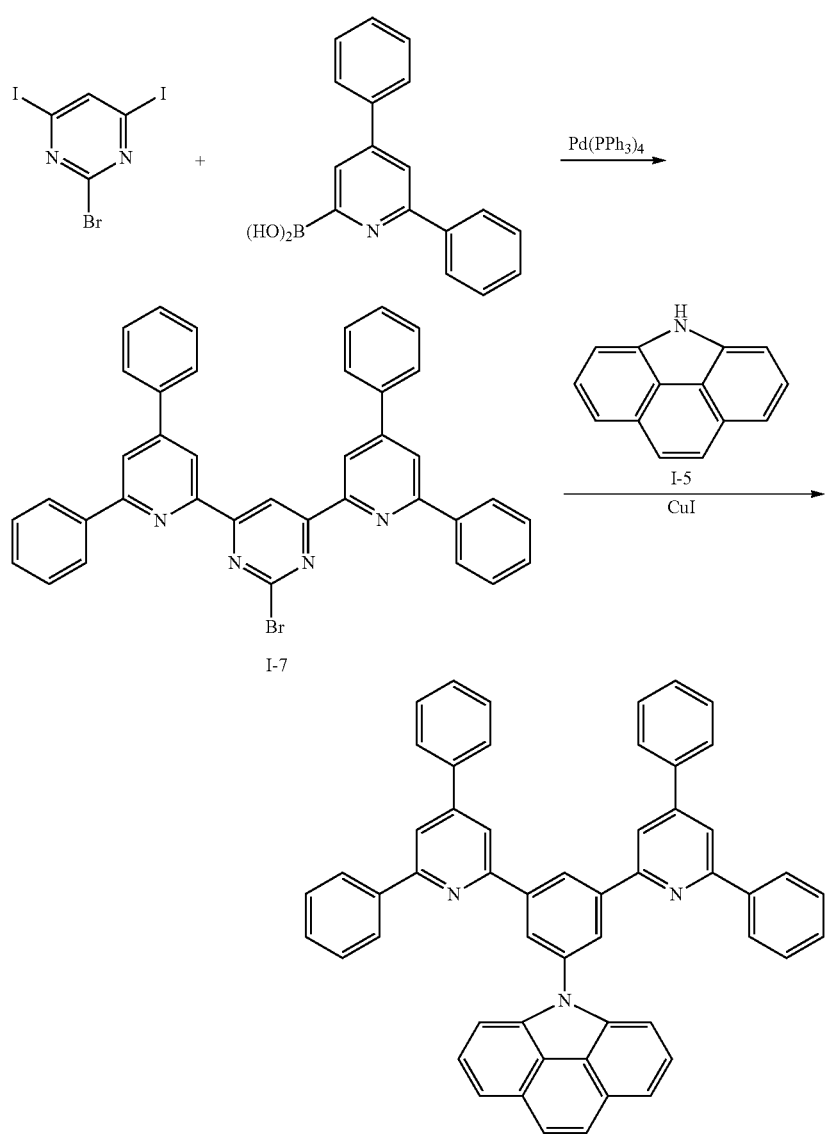

0.19 g (1.0 mmol) of CuI, and 2.07 g (15.0 mmol) of $K_2CO_3$ were dissolved in 20 mL of N,N-dimethylformamide (DMF), and then agitated at a temperature of 80° C. for 24 hours to prepare a reaction solution. The reaction solution was cooled to room temperature and then extracted three times with 20 mL of water and 20 mL of diethyl ether to collect an organic layer. The collected organic layer was dried with magnesium sulfate, the solvent was evaporated to obtain residues, and then the residues were isolated and purified through silica gel column chromatography to obtain 2.54 g (yield 70%) of Compound 14. The prepared compound was identified through MS/FAB and $^1$H NMR. A $C_{54}H_{35}N_3$ molecular ion peak (M⁺) of the prepared compound was calculated as being at 727.27 (m/z), and the prepared compound was empirically found to have a molecular ion peak (M⁺) at 727.29 (m/z).

Synthesis of Compound 15

2.66 g (yield 73%) of Compound 15 was obtained using the same method as in the synthesis of Compound 14, except that β-[4,6-diphenyl-2-pyrimidyl]boronic acid was used instead of β-[4,6-diphenyl-2-pyridyl]boronic acid. The prepared compound was identified through MS/FAB and $^1$H NMR. A $C_{50}H_{31}N_7$ molecular ion peak (M⁺) of the prepared compound was calculated as being at 729.26 (m/z), and the prepared compound was empirically found to have a molecular ion peak (M⁺) at 729.27 (m/z).

Synthesis of Compound 23

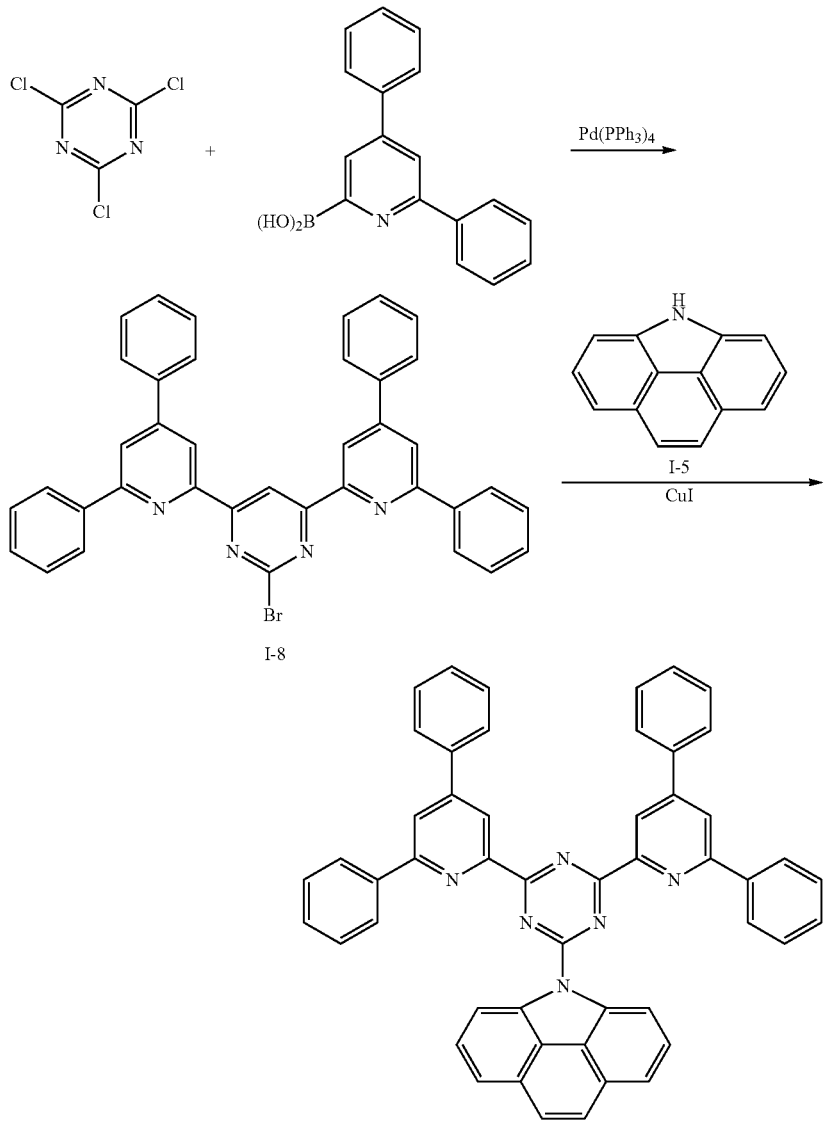

1) Synthesis of Intermediate I-8

3.69 g (20.0 mmol) of 2,4,6-trichloro-[1,3,5]triazine, 11.0 g (40.0 mmol) of β-[4,6-diphenyl-2-pyridyl]boronic acid, 1.16 g (1.0 mmol) of Pd(PPh₃)₄, and 8.29 g (60.0 mmol) $K_2CO_3$ were dissolved in 60 mL of THF and 30 mL of $H_2O$, and then agitated at a temperature of 80° C. for 12 hours to prepare a reaction solution. The reaction solution was cooled to room temperature and then extracted three times with 30 mL of water and 30 mL of ethyl acetate to collect an organic layer. The collected organic layer was dried with magnesium sulfate, the solvent was evaporated to obtain residues, and then the residues were isolated and purified through silica gel column chromatography to obtain 6.84 g (yield 50%) of Intermediate I-8. The prepared compound was identified through LC-MS, and was empirically found to have a $C_{34}H_{21}BrN_8$ molecular ion peak (M$^+$) at 616.1 (m/z).

2) Synthesis of Compound 23

3.09 g (5.0 mmol) of Intermediate I-8, 0.96 g (5.0 mmol) of Intermediate I-5, 0.1 g (0.5 mmol) of 1,10-phenanthroline, 0.19 g (1.0 mmol) of CuI, and 2.07 g (15.0 mmol) of $K_2CO_3$ were dissolved in 20 mL of N,N-dimethylformamide (DMF) and then agitated at a temperature of 80° C. for 24 hours to prepare a reaction solution. The reaction solution was cooled to room temperature and then extracted three times with 20 mL of water and 20 mL of diethyl ether to collect an organic layer. The collected organic layer was dried with magnesium sulfate, the solvent was evaporated to obtain residues, and then the residues were isolated and purified through silica gel column chromatography to obtain 2.37 g (yield 65%) of Compound 23. The prepared compound was identified through MS/FAB and $^1$H NMR. A $C_{51}H_{32}N_6$ molecular ion peak (M$^+$) at 728.84 (m/z), and the prepared compound was empirically found to have a molecular ion peak (M$^+$) at 728.86 (m/z).

Synthesis of Compound 28

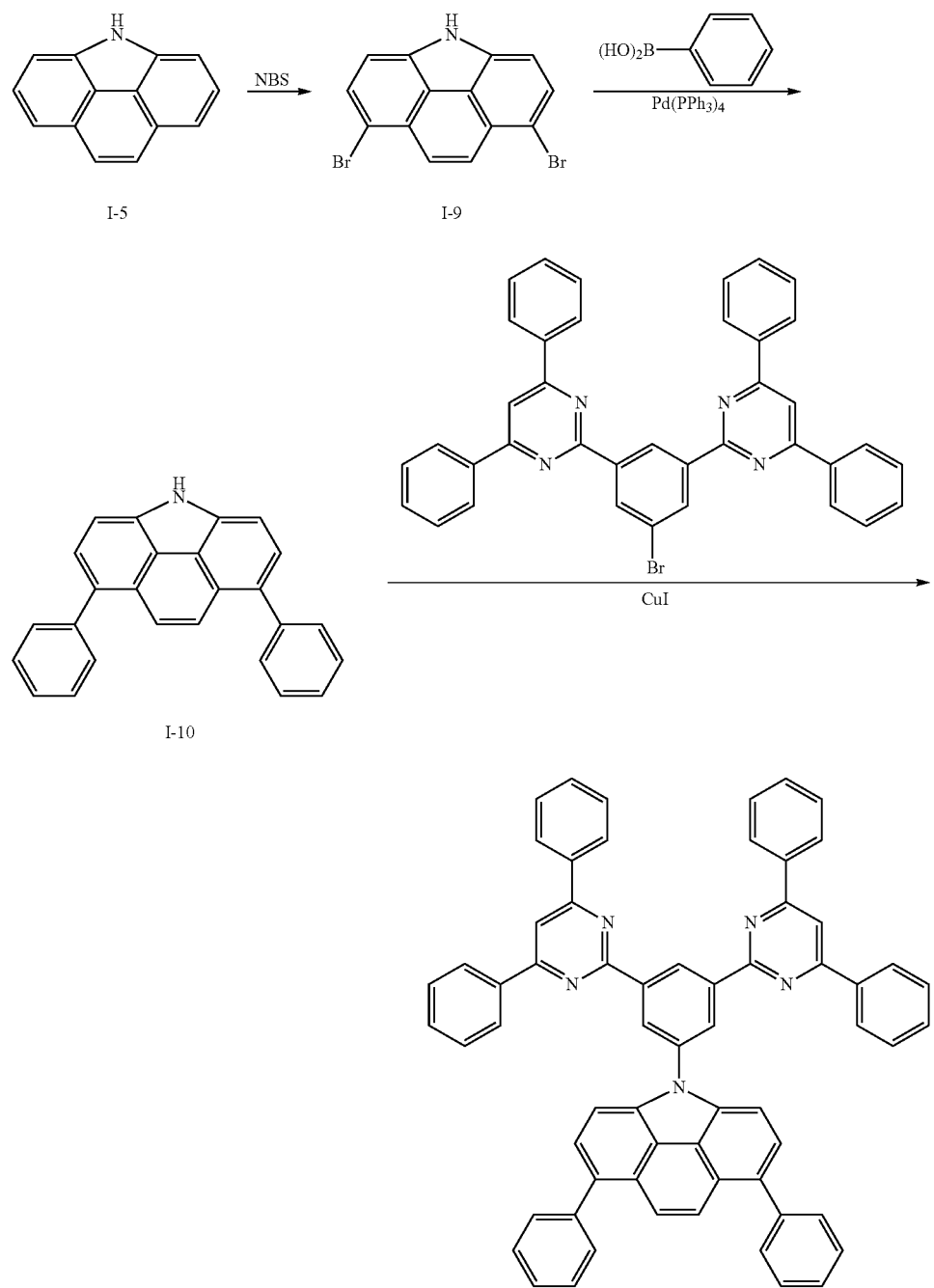

28

1) Synthesis of Intermediate I-9

7.12 g (40.0 mmol) of N-bromosuccinimide (NBS) was added to a solution in which 3.82 g (20.0 mmol) of Intermediate I-5 was completely dissolved in 80 mL of carbon tetrachloride ($CCl_4$) and then agitated at a temperature of 80° C. for 30 minutes to prepare a reaction solution. The reaction solution was cooled to room temperature, and then the reaction solution was agitated for 30 minutes to precipitate crystals. The crystals were collected through reduced pressure filtering and washed with methanol to obtain 3.84 g (yield 55%) of white crystals of Intermediate I-9. The prepared compound was identified through LC-MS, and was found to have a $C_{14}H_7Br_2N$ molecular ion peak ($M^+$) at 346.9 (m/z).

2) Synthesis of Intermediate I-10

3.84 g (11.0 mmol) of Intermediate I-9, 2.68 g (22.0 mmol) of phenylboronic acid, 0.64 g (0.55 mmol) of $Pd(PPh_3)_4$, and 4.56 g (33.0 mmol) of $K_2CO_3$ were dissolved in 60 mL of THF and 30 mL of $H_2O$ and then agitated at a temperature of 80° C. for 12 hours to prepare a reaction solution. The reaction solution was cooled to room temperature and then extracted three times with 30 mL of water and 30 mL of ethyl acetate to collect an organic layer. The collected organic layer was dried with magnesium sulfate, and the solvent was evaporated to obtain residues, and then the residues were isolated and purified through silica gel column chromatography to obtain 2.64 g (yield 70%) of Intermediate I-10. The prepared compound was identified through LC-MS, and was found to have a $C_{26}H_{17}N$ molecular ion peak ($M^+$) at 343.1 (m/z).

3) Synthesis of Compound 28

3.08 g (5.0 mmol) of 2-bromo-[3,5-di-(4,6-diphenyl-pyrimidyl)]-phenyl, 1.72 g (5.0 mmol) of Intermediate I-10, 0.1 g (0.5 mmol) of 1,10-phenanthroline, 0.19 g (1.0 mmol) of CuI, and 2.07 g (15.0 mmol) $K_2CO_3$ were dissolved in 20 mL of N,N-dimethylformamide (DMF) and then agitated at a temperature of 80° C. for 24 hours to prepare a reaction solution. The reaction solution was cooled to room temperature and then extracted three times with 20 mL of water and 20 mL of diethyl ether to collect an organic layer. The collected organic layer was dried with magnesium sulfate, and the solvent was evaporated to obtain residues, and then the residues were isolated and purified through silica gel column chromatography to obtain 2.95 g (yield 67%) of Compound 28. The prepared compound was identified through MS/FAB and $^1$H NMR. A $C_{64}H_{41}N_5$ molecular ion peak ($M^+$) of the prepared compound was calculated as being at 879.34 (m/z), and the prepared compound was empirically found to have a molecular ion peak at 879.36 (m/z).

Synthesis of Compound 36

2.10 g (yield 62%) of Compound 36 was obtained using the same method as in the synthesis of Compound 23, except that β-[4-phenyl-2-quinazolyl]boronic acid was used instead of β-[4,6-diphenyl-2-pyridyl]boronic acid. The prepared compound was identified through MS/FAB and $^1$H NMR. A $C_{45}H_{26}N_8$ molecular ion peak ($M^+$) of the prepared compound was calculated as being at 678.23 (m/z), and the prepared compound was empirically found to have a molecular ion peak at 678.25 (m/z).

Synthesis of Compound 42

2.10 g (yield 63%) of Compound 42 was obtained using the same method as in the synthesis of Compound 28, except that 2-bromo-4,6-diiodo-pyrimidine was used instead of [3-bromo-5-(dihydroxyboranyl)phenyl]boronic acid, and β-[4-phenyl-2-quinazolyl]boronic acid was used instead of 2-bromo-4,6-diphenyl-pyrimidine. The prepared compound was identified through MS/FAB and $^1$H NMR. A $C_{58}H_{35}N_7$ molecular ion peak ($M^+$) of the prepared compound was calculated as being at 829.30 (m/z), and the prepared compound was empirically found to have a molecular ion peak ($M^+$) at 829.31 (m/z).

The same methods as in the above synthesis pathways and suitable intermediate materials were used to synthesize additional compounds, and $^1$H NMR and MS/FAB of the compounds are shown in Table 1 below.

Synthesis methods of Compounds other than the Compounds shown in Table 1 may be easily inferred by one of ordinary skill in the art based on the presently disclosed synthesis pathways and raw materials.

TABLE 1

| Compound | $^1$H NMR (CDCl$_3$, 400 MHz) δ | MS/FAB found | MS/FAB calc. |
|---|---|---|---|
| 2 | δ = 8.98 (d, 2H), 8.42 (dd, 1H), 8.02-7.99 (m, 4H), 7.94-7.92 (m, 2H), 7.77 (d, 2H), 7.62-7.53 (m, 8H), 7.48 (t, 2H), 7.36-7.32 (m, 4H), 7.17-7.14 (m, 2H) | 573.23 | 573.22 |
| 7 | δ = 9.23 (t, 1H), 8.61 (d, 2H), 8.29-8.25 (m, 8H), 8.01 (d, 2H), 7.77 (d, 2H), 7.57-7.46 (m, 14H), 7.31-7.27 (m, 4H) | 727.26 | 727.27 |
| 12 | δ = 9.14 (d, 1H), 8.64 (s, 1H), 8.58-8.50 (m, 4H), 8.40 (d, 1H), 8.34-8.28 (m, 4H), 7.83 (d, 2H), 7.75-7.72 (m, 3H), 7.60-7.45 (m, 14H), 7.29-7.27 (m, 2H) | 728.25 | 728.27 |
| 14 | δ = 9.12 (s, 1H), 8.77 (d, 2H), 8.38 (d, 2H), 8.30-8.25 (m, 4H), 7.85-7.82 (m, 4H), 7.80 (d, 2H), 7.74-7.68 (m, 4H), 7.53-7.50 (m, 6H), 7.48-7.42 (m, 8H) | 727.29 | 727.27 |
| 15 | δ = 9.25 (s, 1H), 8.38 (d, 2H), 8.34-8.31 (m, 8H), 7.99 (s, 2H), 7.75-7.68 (m, 4H), 7.52-7.49 (m, 10H), 7.30-7.27 (m, 4H) | 729.27 | 729.26 |
| 18 | δ = 8.77 (d, 1H), 8.52 (s, 1H), 8.46 (d, 1H), 8.33-8.25 (m, 4H), 7.94-7.90 (m, 2H), 7.85-7.79 (m, 6H), 7.74 (d, 2H), 7.60-7.50 (m, 8H), 7.48-7.43 (m, 8H) | 727.23 | 727.27 |
| 19 | δ = 8.74 (s, 1H), 8.38-8.31 (m, 8H), 8.00 (s, 2H), 7.80 (d, 2H), 7.74 (d, 2H), 7.60-7.56 (m, 4H), 7.53-7.48 (m, 8H), 7.31-7.26 (m, 4H) | 729.29 | 729.26 |

TABLE 1-continued

| Compound | $^1$H NMR (CDCl$_3$, 400 MHz) δ | MS/FAB found | calc. |
|---|---|---|---|
| 22 | δ = 8.98-8.95 (m, 4H), 8.92 (s, 1H), 8.87-8.85 (m, 4H), 7.79 (d, 2H), 7.74 (d, 2H), 7.63-7.56 (m, 12H), 7.42-7.38 (m, 4H) | 731.22 | 731.25 |
| 23 | δ = 8.51 (d, 2H), 8.34 (d, 1H), 8.32-8.28 (m, 5H), 7.94-7.90 (m, 4H), 7.85 (d, 2H), 7.74-7.68 (m, 4H), 7.54-7.50 (m, 6H), 7.48-7.43 (m, 8H) | 728.86 | 728.84 |
| 27 | δ = 9.25 (s, 1H), 8.34-8.32 (m, 8H), 8.04 (d, 2H), 7.99 (s, 2H), 7.88-7.84 (m, 6H), 7.66 (d, 2H), 7.54-7.49 (m, 12H), 7.44-7.41 (m, 2H), 7.30-7.27 (m, 4H) | 881.30 | 881.33 |
| 28 | δ = 9.24-9.22 (d, 1H), 9.06 (d, 2H), 8.29-8.27 (m, 8H), 8.14-8.12 (m, 4H), 8.01 (s, 2H), 7.75 (d, 2H), 7.52-7.47 (m, 12H), 7.40-7.37 (m, 4H), 7.30-7.27 (m, 4H), 7.13 (d, 2H) | 879.36 | 879.34 |
| 35 | δ = 8.74 (s, 1H), 8.17 (dd, 1H), 8.09 (dd, 1H), 7.93-7.88 (m, 4H), 7.86-7.83 (m, 2H), 7.80-7.78 (m, 3H), 7.75-7.67 (m, 7H), 7.63-7.55 (m, 8H) | 677.26 | 677.23 |
| 36 | δ = 8.34 (d, 2H), 8.17 (dd, 2H), 7.92 (dd, 2H), 7.90-7.87 (m, 4H), 7.79 (dd, 2H), 7.74-7.66 (m, 8H), 7.63-7.55 (m, 4H), 7.51 (dd, 2H) | 678.25 | 678.23 |
| 37 | δ = 9.39 (t, 1H), 8.60 (d, 2H), 8.32-8.29 (m, 4H), 8.01 (d, 2H), 7.90-7.85 (m, 6H), 7.79-7.76 (m, 4H), 7.61-7.48 (m, 16H), 7.42-7.39 (m, 2H) | 827.32 | 827.30 |
| 41 | δ = 9.14 (s, 1H), 8.09 (d, 2H), 8.04 (d, 2H), 7.91-7.82 (m, 12H), 7.72-7.68 (m, 8H), 7.63-7.56 (m, 4H), 7.55-7.50 (m, 4H), 7.45-7.40 (m, 2H) | 829.33 | 829.30 |
| 42 | δ = 9.14 (s, 1H), 8.14-8.08 (m, 6H), 7.99 (d, 2H), 7.91 (t, 2H), 7.85-7.82 (m, 4H), 7.72-7.68 (m, 8H), 7.63-7.56 (m, 4H), 7.51-7.48 (m, 4H), 7.40-7.37 (m, 2H), 7.27 (d, 2H) | 829.31 | 829.30 |
| 44 | δ = 9.37 (d, 1H), 8.63 (d, 2H), 8.37 (d, 2H), 8.24 (dd, 2H), 8.03 (t, 4H), 7.89 (t, 2H), 7.77 (d, 2H), 7.68 (d, 2H), 7.62-7.46 (m, 14H), 7.33 (t, 2H) | 855.28 | 855.26 |

Example 1

As an anode, 70/1000/70 Å of ITO/Ag/ITO was deposited on a substrate which was cut to a size of 50 mm×50 mm×0.5 mm and then ultrasonically washed using isopropyl alcohol and distilled water for 5 minutes, followed by cleaning by UV irradiation and exposure to ozone for about 30 minutes. The glass substrate was then loaded onto a vacuum deposition device.

4,4',4''-tris(N-(2-naphthyl)-N-phenyl-amino)-triphenylamine (2-TNATA) was vacuum deposited on the substrate to form an HIL to a thickness of 600 Å, and 4,4'-bis[N-(1-naphthyl)-N-phenyl amino]biphenyl (NPB) was vacuum deposited thereto to form an HTL to a thickness of 1000 Å.

On the HTL, Compound 7 according to an embodiment of the present invention as a green phosphorescent host, and Ir(ppy)$_3$ as a dopant were concurrently (e.g., simultaneously) vacuum deposited in a weight ratio of 91:9 to form an EML to a thickness of 250 Å. Then, BCP was vacuum deposited on the EML as a hole blocking compound to a thickness of 50 Å to form an HBL. Then, Alq$_3$ was vacuum deposited to a thickness of 350 Å as an ETL, and LiF, which is a halogenated alkali metal, was vacuum deposited as an EIL to a thickness of 10 Å, and then Mg and Ag were vacuum deposited in a weight ratio of 90:10 to a thickness of 120 Å to form an electrode and complete the manufacture an organic light-emitting diode.

The organic light-emitting diode prepared according to Example 1 showed a driving voltage of 5.6 V, light-emission brightness of 5,340 cd/m$^2$, light-emission efficiency of 53.4 cd/A, and half-life (hr @100 mA/cm$^2$) of 74 hours at a current density of 10 mA/cm$^2$.

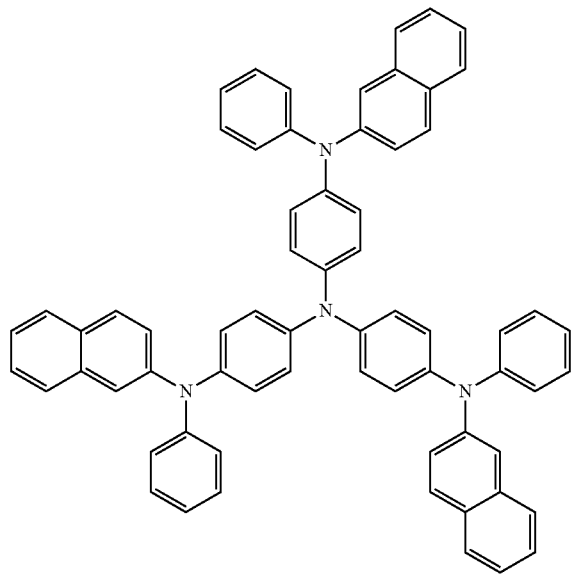

2-TNATA

-continued

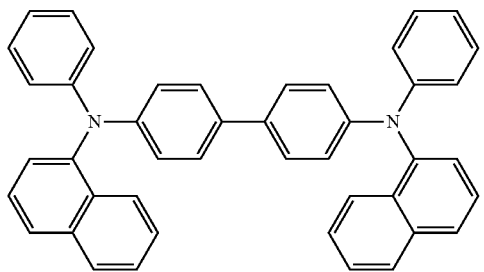

NPB

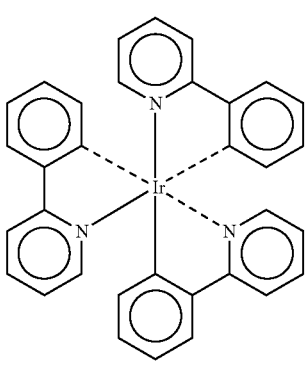

Ir(ppy)₃

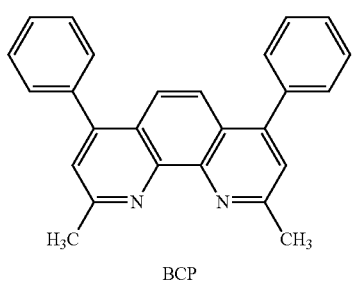 [SMILES: Cc1cc(-c2ccccc2)c2ccc3c(-c4ccccc4)cc(C)nc3c2n1 ; "BCP"]

BCP

-continued

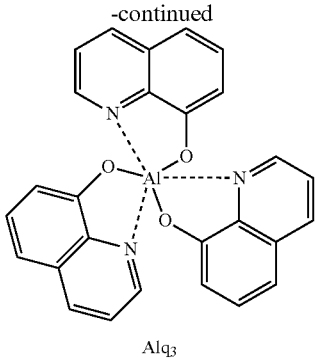

Alq₃

Example 2

An organic light-emitting diode was manufactured as in Example 1 except that Compound 18 was used instead of Compound 7 when forming the EML.

The organic light-emitting diode prepared according to Example 2 showed a driving voltage of 5.5 V, light-emission brightness of 5,590 cd/d, light-emission efficiency of 55.9 cd/A, and half-life (hr @100 mA/cm²) of 69 hours at a current density of 10 mA/cm².

Example 3

An organic light-emitting diode was manufactured as in Example 1 except that Compound 19 was used instead of Compound 7 when forming the EML.

The organic light-emitting diode prepared according to Example 3 showed a driving voltage of 5.5 V, light-emission brightness of 5,730 cd/m², light-emission efficiency of 57.3 cd/A, and half-life (hr @100 mA/cm²) of 79 hours at a current density of 10 mA/cm².

Example 4

An organic light-emitting diode was manufactured as in Example 1 except that Compound 35 was used instead of Compound 7 when forming the EML.

The organic light-emitting diode prepared according to Example 4 showed a driving voltage of 5.7 V, light-emission brightness of 5,783 cd/m², light-emission efficiency of 57.8 cd/A, and half-life (hr @100 mA/cm²) of 83 hours at a current density of 10 mA/cm².

Example 5

An organic light-emitting diode was manufactured as in Example 1 except that Compound 44 was used instead of Compound 7 when forming the EML.

The organic light-emitting diode prepared according to Example 5 showed a driving voltage of 5.7 V, light-emission brightness of 5,912 cd/m², light-emission efficiency of 59.1 cd/A, and half-life (hr @100 mA/cm²) of 73 hours at a current density of 10 mA/cd.

Example 6

When forming the HTL in Example 1, 4,4'-bis[N-(1-naphthyl)-N-phenylamino]biphenyl (NPB), which is a hole-transporting material, was vacuum deposited to a thickness of 1350 Å to form an HTL. The organic light-emitting diode was manufactured as in Example 1, except that Compound 15 according to an embodiment of the present invention as a red phosphorescent host, and bis(2-(2'-benzo[4,5-a]thienyl)pyridinato-N, C3') iridium acetylacetonate (BtpIr), as a dopant, were concurrently (e.g., simultaneously) vacuum deposited in a weight ratio of 94:6 to form an EML to a thickness of 400 Å.

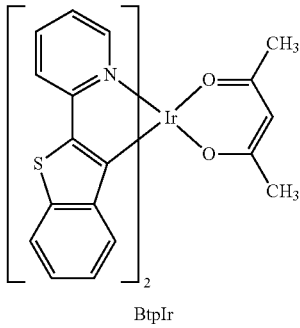

BtpIr

The organic light-emitting diode prepared according to Example 6 showed a driving voltage of 5.8 V, light-emission brightness of 2,672 cd/m$^2$, light-emission efficiency of 26.7 cd/A, and half-life (hr @100 mA/cm$^2$) of 80 hours at a current density of 10 mA/cm$^2$.

Example 7

An organic light-emitting diode was manufactured as in Example 6, except that Compound 27 was used instead of Compound 15 when forming the EML.

The organic light-emitting diode prepared according to Example 7 showed a driving voltage of 6.0 V, light-emission brightness of 2.716 cd/m$^2$, light-emission efficiency of 27.2 cd/A, and half-life (hr @100 mA/cm$^2$) of 77 hours at a current density of 10 mA/cm$^2$.

Example 8

An organic light-emitting diode was manufactured as in Example 6, except that Compound 36 was used instead of Compound 15 when forming the EML.

The organic light-emitting diode prepared according to Example 8 showed a driving voltage of 5.8 V, light-emission brightness of 2,942 cd/m$^2$, light-emission efficiency of 29.4 cd/A, and half-life (hr @100 mA/cd) of 66 hours at a current density of 10 mA/cm$^2$.

Example 9

An organic light-emitting diode was manufactured as in Example 6, except that Compound 42 was used instead of Compound 15 when forming the EML.

The organic light-emitting diode prepared according to Example 9 showed a driving voltage of 5.7 V, light-emission brightness of 2,690 cd/m$^2$, light-emission efficiency of 26.9 cd/A, and half-life (hr @100 mA/cm$^2$) of 87 hours at a current density of 10 mA/cm$^2$.

Comparative Example 1

An organic light-emitting diode was manufactured as in Example 1, except that 4,4'-N,N'-dicarbazolbiphenyl (CBP) as a green phosphorescent host was used instead of Compound 7 when forming the EML.

The organic light-emitting diode prepared according to the Comparative Example 1 showed a driving voltage of 6.5 V, light-emission brightness of 3,210 cd/m$^2$, light-emission efficiency of 32.1 cd/A, and half-life (hr @100 mA/cm$^2$) of 32 hours at a current density of 10 mA/cm$^2$.

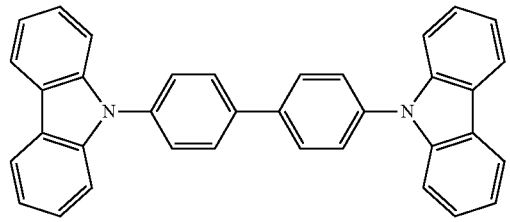

CBP

Comparative Example 2

An organic light-emitting diode was manufactured as in Example 5, except that CBP as a red phosphorescent host was used instead of Compound 15 when forming the EML.

The organic light-emitting diode prepared according to Comparative Example 2 showed a driving voltage of 6.8 V, light-emission brightness of 1,643 cd/m$^2$, light emission efficiency of 16.4 cd/A, and half-life (hr @100 mA/cm$^2$) of 45 hours at a current density of 10 mA/cm$^2$.

As a result of using compounds having the structure of Formula 1 according to embodiments of the present invention as green and/or red phosphorescent materials of an EML of an organic light-emitting diode, the driving voltage of the organic light-emitting diode substantially improved and showed good I-V-L characteristics with improved efficiency compared to CBP. In particular, improvements in lifespan were good, thereby substantially improving the lifespan. Representative characteristics and lifespan results are summarized in Table 2 below.

TABLE 2

|  | Host | Driving voltage (V) | Current density (mA/cm$^2$) | Brightness (cd/m$^2$) | Efficiency (cd/A) | Emitted light color | Lifespan LT97 (hr) |
|---|---|---|---|---|---|---|---|
| Example 1 | Compound 7 | 5.6 | 10 | 5,340 | 53.4 | green | 74 hr |
| Example 2 | Compound 18 | 5.5 | 10 | 5,590 | 55.9 | green | 69 hr |
| Example 3 | Compound 19 | 5.5 | 10 | 5,730 | 57.3 | green | 79 hr |

TABLE 2-continued

| | Host | Driving voltage (V) | Current density (mA/cm$^2$) | Brightness (cd/m$^2$) | Efficiency (cd/A) | Emitted light color | Lifespan LT97 (hr) |
|---|---|---|---|---|---|---|---|
| Example 4 | Compound 35 | 5.7 | 10 | 5,783 | 57.8 | green | 83 hr |
| Example 5 | Compound 44 | 5.7 | 10 | 5,912 | 59.1 | green | 73 hr |
| Example 6 | Compound 15 | 5.8 | 10 | 2,672 | 26.7 | red | 80 hr |
| Example 7 | Compound 27 | 6.0 | 10 | 2,716 | 27.2 | red | 77 hr |
| Example 8 | Compound 36 | 5.8 | 10 | 2,942 | 29.4 | red | 66 hr |
| Example 9 | Compound 42 | 5.7 | 10 | 2,690 | 26.9 | red | 87 hr |
| Comparative Example 1 | CBP | 6.5 | 10 | 3,210 | 32.1 | green | 32 hr |
| Comparative Example 2 | CBP | 6.8 | 10 | 1,643 | 16.4 | red | 45 hr |

Heterocyclic compounds represented by Formula 1 above are useful as light-emitting materials suitable for fluorescent and phosphorescent diodes of all colors, such as red, green, blue, and white. Using the heterocyclic compounds disclosed herein, an organic light-emitting diode having high efficiency, low voltage, high brightness, and a long lifespan may be manufactured.

While certain embodiments of the present invention have been illustrated and described, it will be understood by those of ordinary skill in the art that various changes may be made to the described embodiments without departing from the spirit and scope of the present invention as defined by the following claims.

What is claimed is:

1. A heterocyclic compound represented by Formula 1:

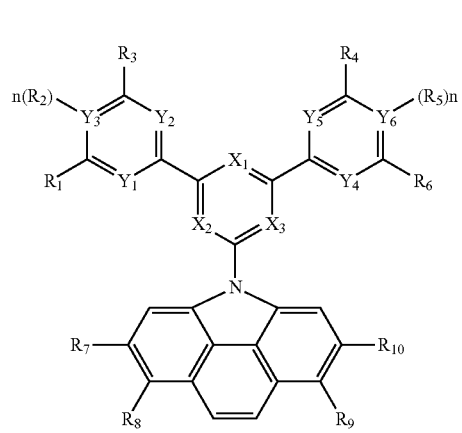

Formula 1 wherein in Formula 1,
$Y_3$ and $Y_6$ are each independently CH, C, or N;
$X_1$ to $X_3$, $Y_1$, $Y_2$, $Y_4$, and $Y_5$ are each independently CH, or N;
wherein, when $Y_3$ and/or $Y_6$ is N or CH, the respective n corresponding to $Y_3$ or $Y_6$ is 0, and when $Y_3$ and/or $Y_6$ is C, the respective n corresponding to $Y_3$ or $Y_6$ is 1;
$R_1$ to $R_{10}$ are each independently a hydrogen atom, a deuterium atom, a cyano group, a $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_1$-$C_{60}$ heteroaryl group, a substituted or unsubstituted $C_6$-$C_{60}$ aryloxy group, a substituted or unsubstituted $C_6$-$C_{60}$ arylthio group, a substituted or unsubstituted $C_6$-$C_{60}$ condensed polycyclic group, or an amino group substituted with a substituted or unsubstituted $C_6$-$C_{60}$ aryl group or a substituted or unsubstituted $C_1$-$C_{60}$ heteroaryl group, and
wherein $R_1$ and $R_2$, or $R_2$ and $R_3$, or $R_4$ and $R_5$, or $R_5$ and $R_6$ optionally combine to form an aromatic ring.

2. The heterocyclic compound of claim 1, wherein at least one of $Y_1$ to $Y_6$ of Formula 1 is N.

3. The heterocyclic compound of claim 1, wherein $R_1$ and $R_2$, or $R_2$ and $R_3$, or $R_4$ and $R_5$, or $R_5$ and $R_6$ of Formula 1 combine to form an aromatic ring comprising a

moiety, wherein each * is a binding site to Formula 1.

4. The heterocyclic compound of claim 1, wherein, in Formula 1, $R_1$ to $R_6$ is a hydrogen atom, a deuterium atom, or a moiety represented by one of Formulae 2a to 2c

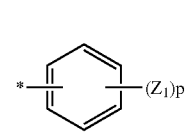

2a

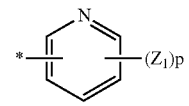

2b

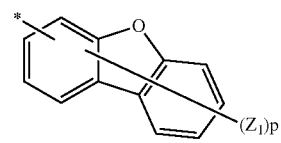

2c wherein, in Formulae 2a to 2c,
$Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen group, a cyano group, a nitro group, a hydroxyl group, a carboxyl group, or an amino group substituted with a $C_6$-$C_{20}$ aryl group or a $C_1$-$C_{20}$ heteroaryl group;

in Formula 2a p is an integer of 1 to 5, in Formula 2b p is an integer of 1 to 4, and in Formula 2c p is an integer of 1 to 7, wherein when p is greater than 1, the $Z_1$s are the same or different; and

* is a binding site to Formula 1.

5. The heterocyclic compound of claim 1, wherein, in Formula 1, $R_7$ to $R_{10}$ are each independently a hydrogen atom, a deuterium atom, or a moiety represented by one of Formulae 3a to 3b:

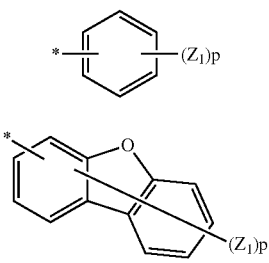

3a

3b wherein, in Formulae 3a to 3b, $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen group, a cyano group, a nitro group, a hydroxyl group, a carboxyl group, or an amino group substituted with a $C_6$-$C_{20}$ aryl group or a $C_1$-$C_{20}$ heteroaryl group;

in Formula 3a p is an integer of 1 to 5, and in Formula 3b p is an integer of 1 to 7, wherein when p is greater than 1, the $Z_1$s are the same or different; and

* is a binding site to Formula 1.

6. The heterocyclic compound of claim 1, wherein the

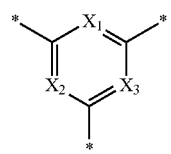

moiety of Formula 1 is a moiety represented by one of Formulae 4a to 4d:

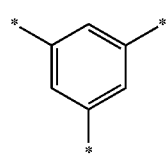

4a

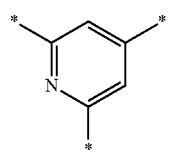

4b

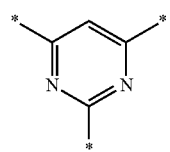

4c

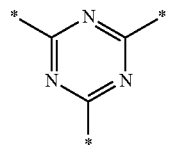

4d wherein * is a binding site to Formula 1.

7. The heterocyclic compound of claim 1, wherein the heterocyclic compound of Formula 1 is any one of the following compounds:

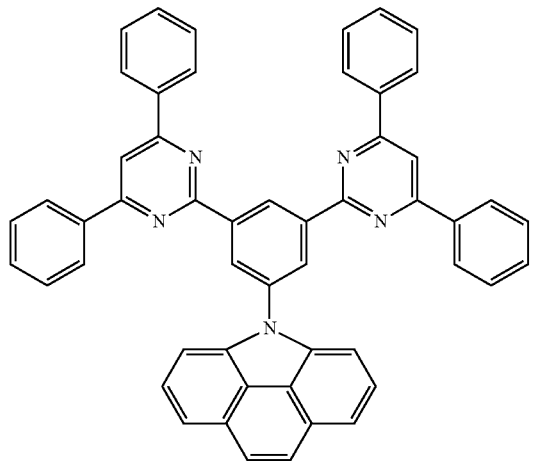

7

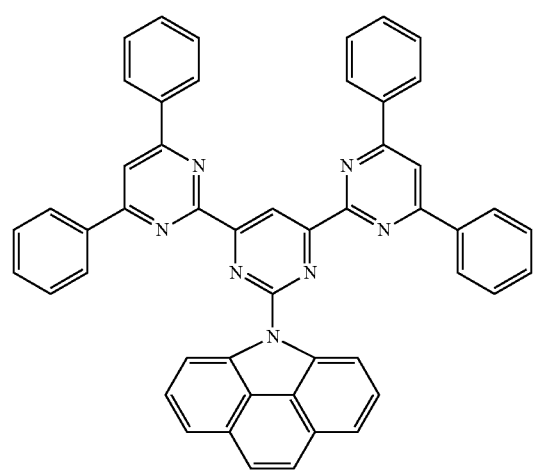

15

18
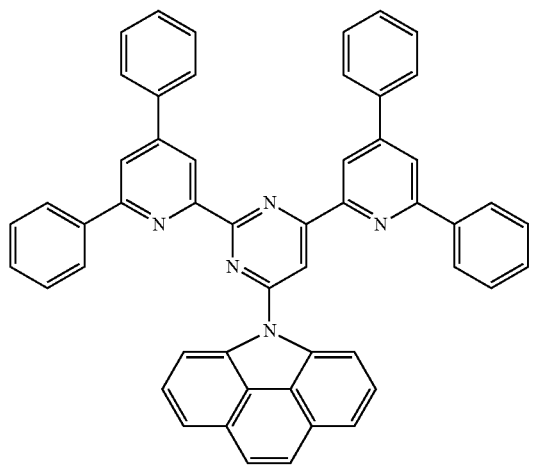
35
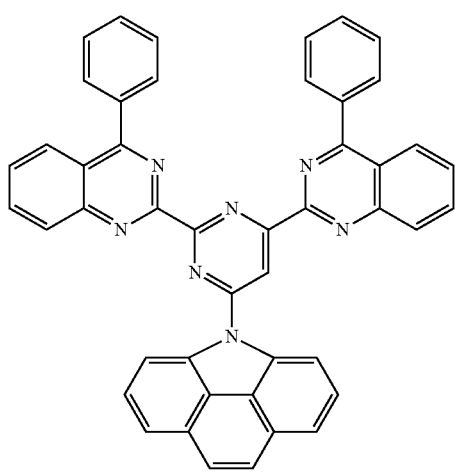
19
36
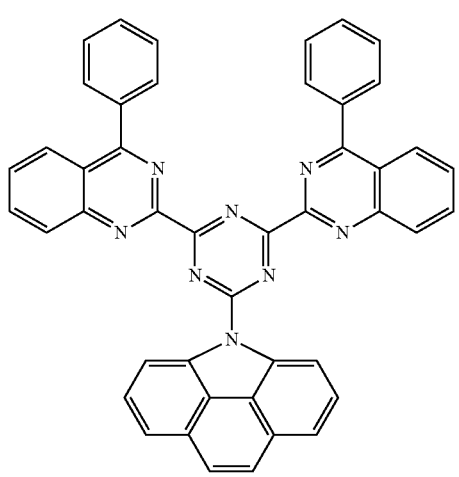
27
42
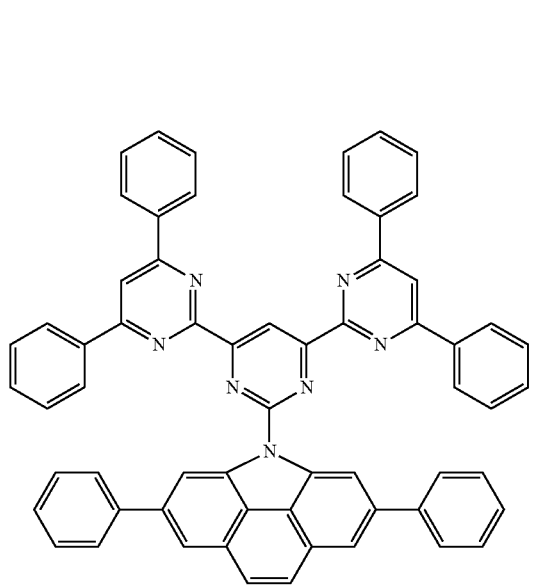

-continued

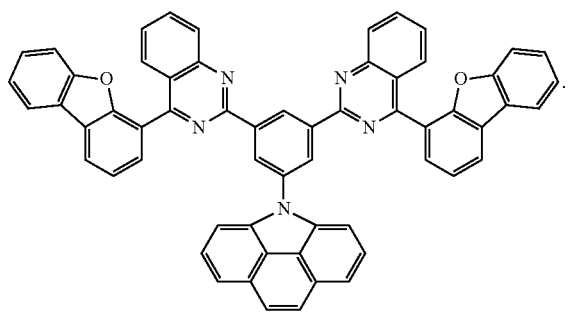

8. An organic light-emitting diode, comprising:
a first electrode;
a second electrode;
and an organic layer between the first electrode and the second electrode,
wherein the organic layer comprises the heterocyclic compound of claim 1.

9. The organic light-emitting diode of claim 8, wherein the organic layer is an emission layer.

10. The organic light-emitting diode of claim 8, wherein the organic layer comprises an emission layer, and an electron-injecting layer, an electron-transporting layer, a functional layer having both electron injecting and electron transporting capabilities, a hole-injecting layer, a hole-transporting layer, or a functional layer having both hole injecting and hole transporting capabilities,
wherein the emission layer comprises an anthracene-based compound, an arylamine-based compound, or a styryl-based compound.

11. The organic light-emitting diode of claim 8, wherein the organic layer comprises an emission layer, and an electron-injecting layer, an electron-transporting layer, a functional layer having both electron injecting and electron transporting capabilities, a hole-injecting layer, a hole-transporting layer, or a functional layer having both hole injecting and hole transporting capabilities,
wherein any one layer of a red layer, a green layer, a blue layer, or a white layer of the emission layer comprises a phosphorescent compound.

12. The organic light-emitting diode of claim 11, wherein the hole-injecting layer, the hole-transporting layer, or the functional layer having both hole injecting and hole transporting capabilities comprises a charge-generating material.

13. The organic light-emitting diode of claim 12, wherein the charge-generating material is a p-dopant.

14. The organic light-emitting diode of claim 13, wherein the p-dopant is a quinone derivative.

15. The organic light-emitting diode of claim 13, wherein the p-dopant is a metal oxide.

16. The organic light-emitting diode of claim 13, wherein the p-dopant is a compound comprising a cyano group.

17. The organic light-emitting diode of claim 8, wherein the organic layer comprises an electron-transporting layer, and the electron-transporting layer comprises a metal complex.

18. The organic light-emitting diode of claim 17, wherein the metal complex is a Li complex.

19. The organic light-emitting diode of claim 8, wherein the organic layer is formed through a wet process using the heterocyclic compound of Formula 1.

20. A flat display device, comprising the organic light-emitting diode of claim 8 and a thin film transistor, wherein the first electrode of the organic light-emitting diode is electrically connected to a source electrode or a drain electrode of the thin film transistor.

* * * * *